US 12,457,745 B2

United States Patent
Okumura

(10) Patent No.: US 12,457,745 B2
(45) Date of Patent: Oct. 28, 2025

(54) SEMICONDUCTOR MEMORY DEVICE

(71) Applicant: Kioxia Corporation, Tokyo (JP)

(72) Inventor: Yusuke Okumura, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 580 days.

(21) Appl. No.: 17/816,501

(22) Filed: Aug. 1, 2022

(65) Prior Publication Data

US 2023/0292517 A1 Sep. 14, 2023

(30) Foreign Application Priority Data

Mar. 11, 2022 (JP) ................. 2022-038288

(51) Int. Cl.
| | |
|---|---|
| H10B 41/50 | (2023.01) |
| H01L 23/528 | (2006.01) |
| H10B 41/10 | (2023.01) |
| H10B 41/27 | (2023.01) |
| H10B 41/35 | (2023.01) |
| H10B 43/10 | (2023.01) |
| H10B 43/27 | (2023.01) |
| H10B 43/35 | (2023.01) |
| H10B 43/50 | (2023.01) |

(52) U.S. Cl.
CPC ......... *H10B 43/35* (2023.02); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ............... H10B 41/50; H10B 43/50
See application file for complete search history.

(56) References Cited

U.S. PATENT DOCUMENTS

| | | | |
|---|---|---|---|
| 10,483,124 B2 | 11/2019 | Sawano et al. | |
| 10,658,230 B2 | 5/2020 | Hyun et al. | |
| 2020/0098786 A1* | 3/2020 | Park | H01L 23/481 |
| 2020/0251490 A1* | 8/2020 | Matsumoto | H01L 23/5226 |
| 2020/0295033 A1* | 9/2020 | Sakamoto | H10B 41/27 |
| 2021/0066329 A1* | 3/2021 | Ito | G11C 5/06 |
| 2022/0020765 A1* | 1/2022 | Narukage | H10B 43/27 |
| 2022/0085052 A1* | 3/2022 | Watarai | H10B 43/10 |
| 2022/0093630 A1* | 3/2022 | Koh | H10B 41/10 |
| 2022/0139951 A1* | 5/2022 | Son | H10B 43/27 257/314 |
| 2022/0173118 A1* | 6/2022 | Kang | H10B 43/10 |

FOREIGN PATENT DOCUMENTS

JP 2019-121769 7/2019

* cited by examiner

*Primary Examiner* — Michele Fan
(74) *Attorney, Agent, or Firm* — Oblon, McClelland, Maier &Neustadt, L.L.P.

(57) ABSTRACT

According to one embodiment, a semiconductor memory device includes a plurality of conductive layers, each of the plurality of conductive layers including a first portion, and a second portion that is thicker than the first portion, a first insulator portion that contacts the second portion of a first conductive layer and the second portion of a second conductive layer, and a second insulator portion that contacts the second portion of a third conductive layer, wherein the second portion of the second conductive layer includes a first sub portion arranged with the second portion of the first conductive layer, and a second sub portion provided between the second portion of the first conductive layer and the second portion of the third conductive layer.

9 Claims, 43 Drawing Sheets

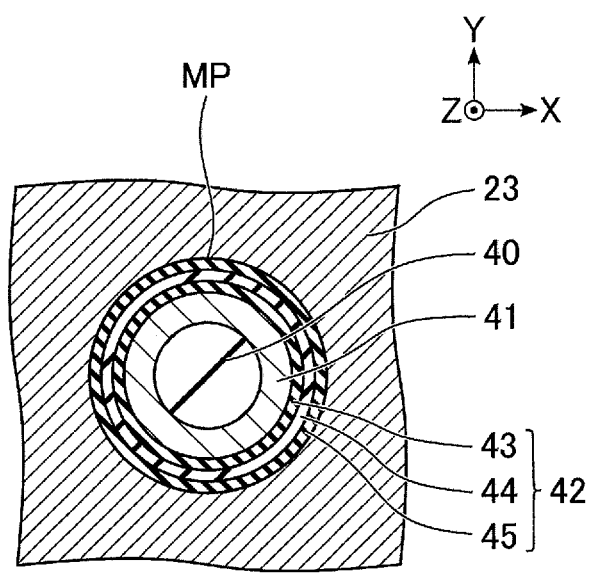
F I G. 6

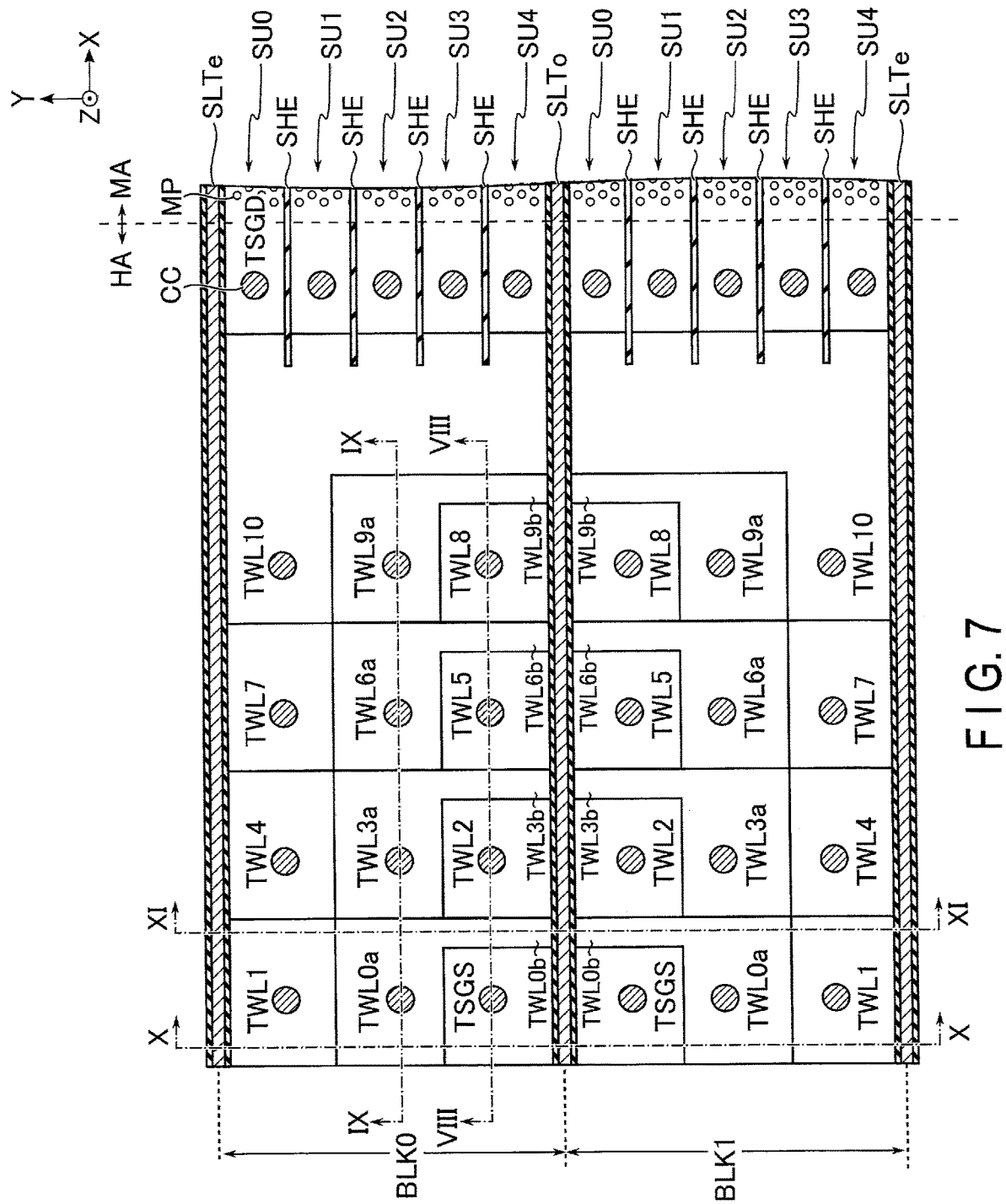
F I G. 7

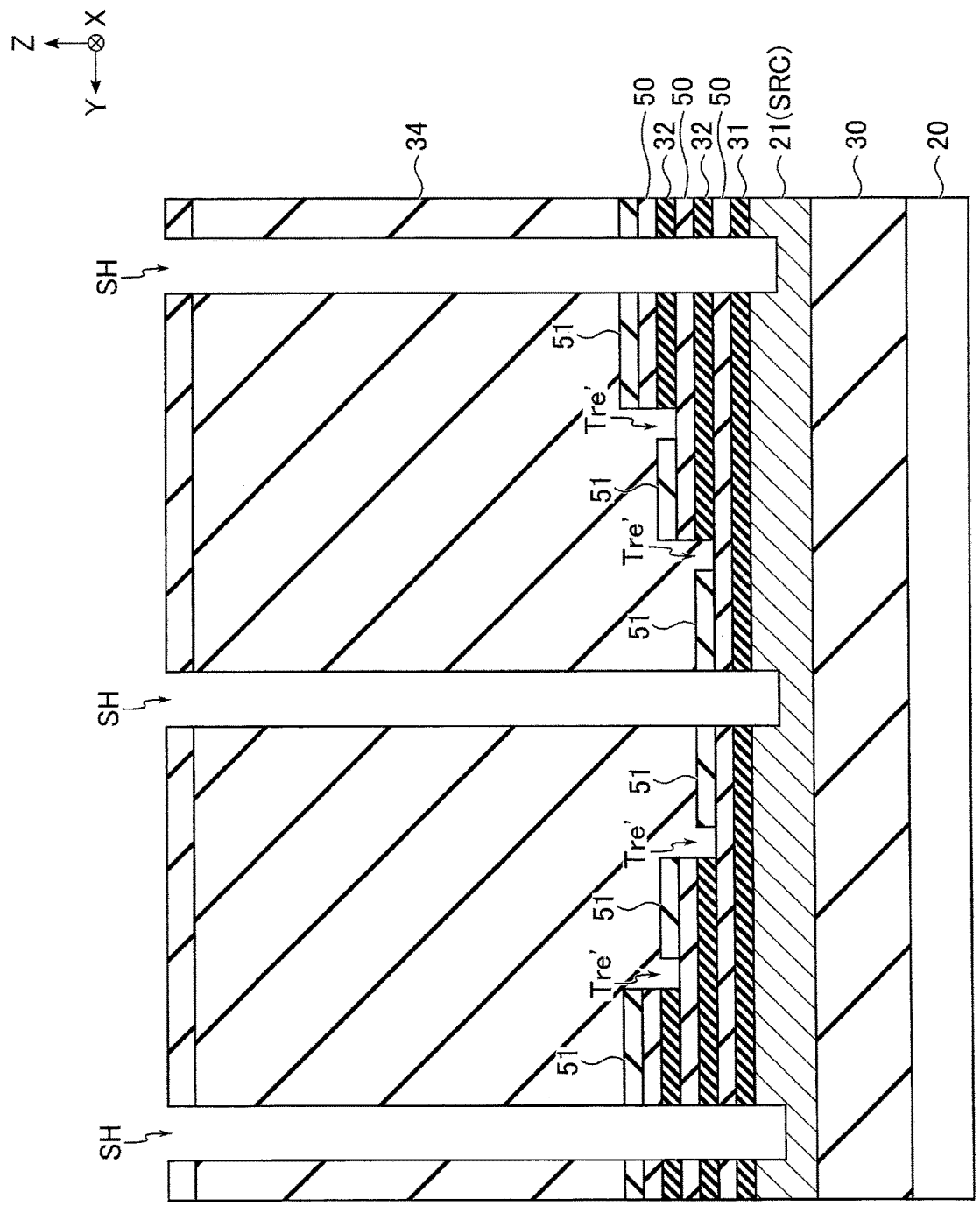
F I G. 26

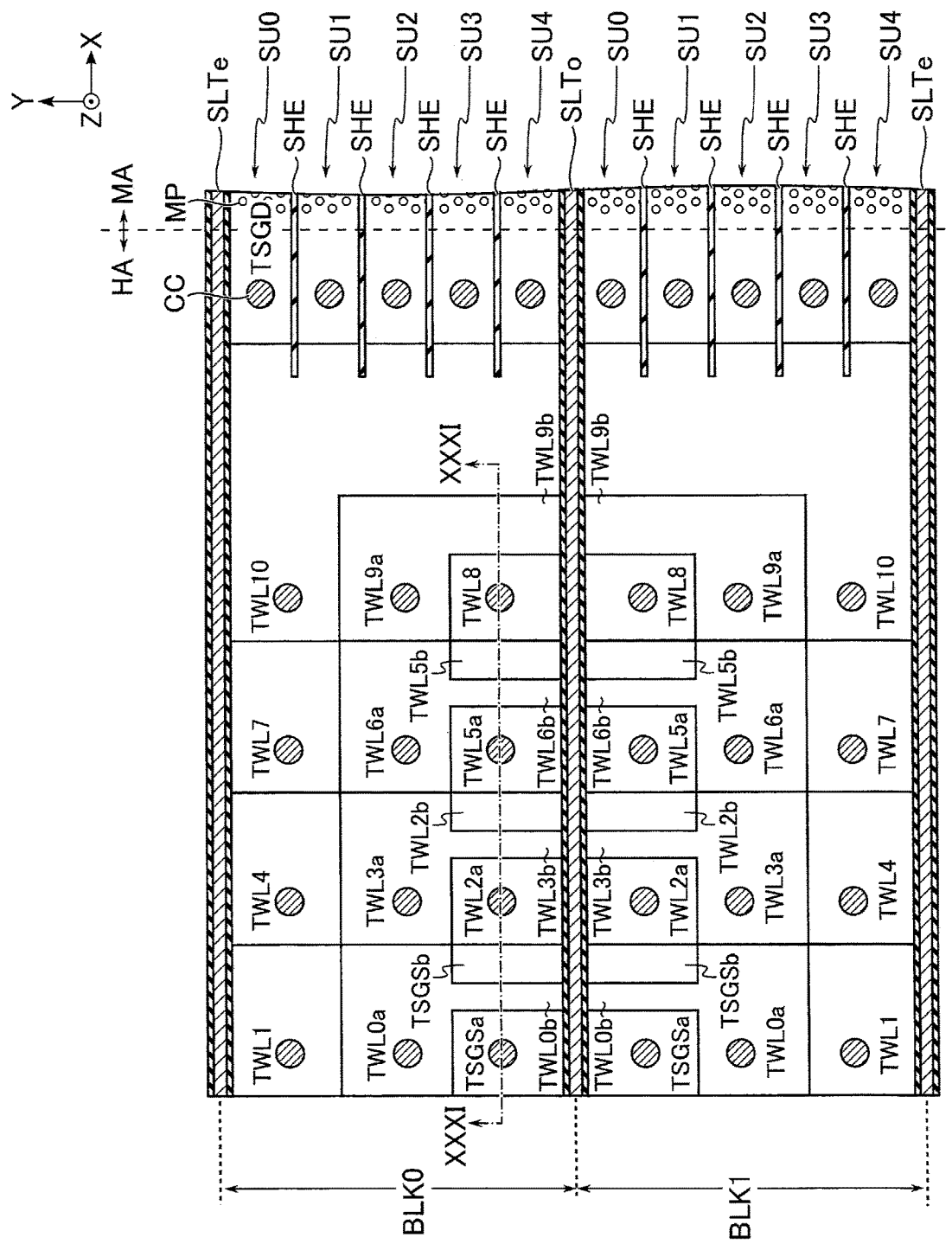
F I G. 30

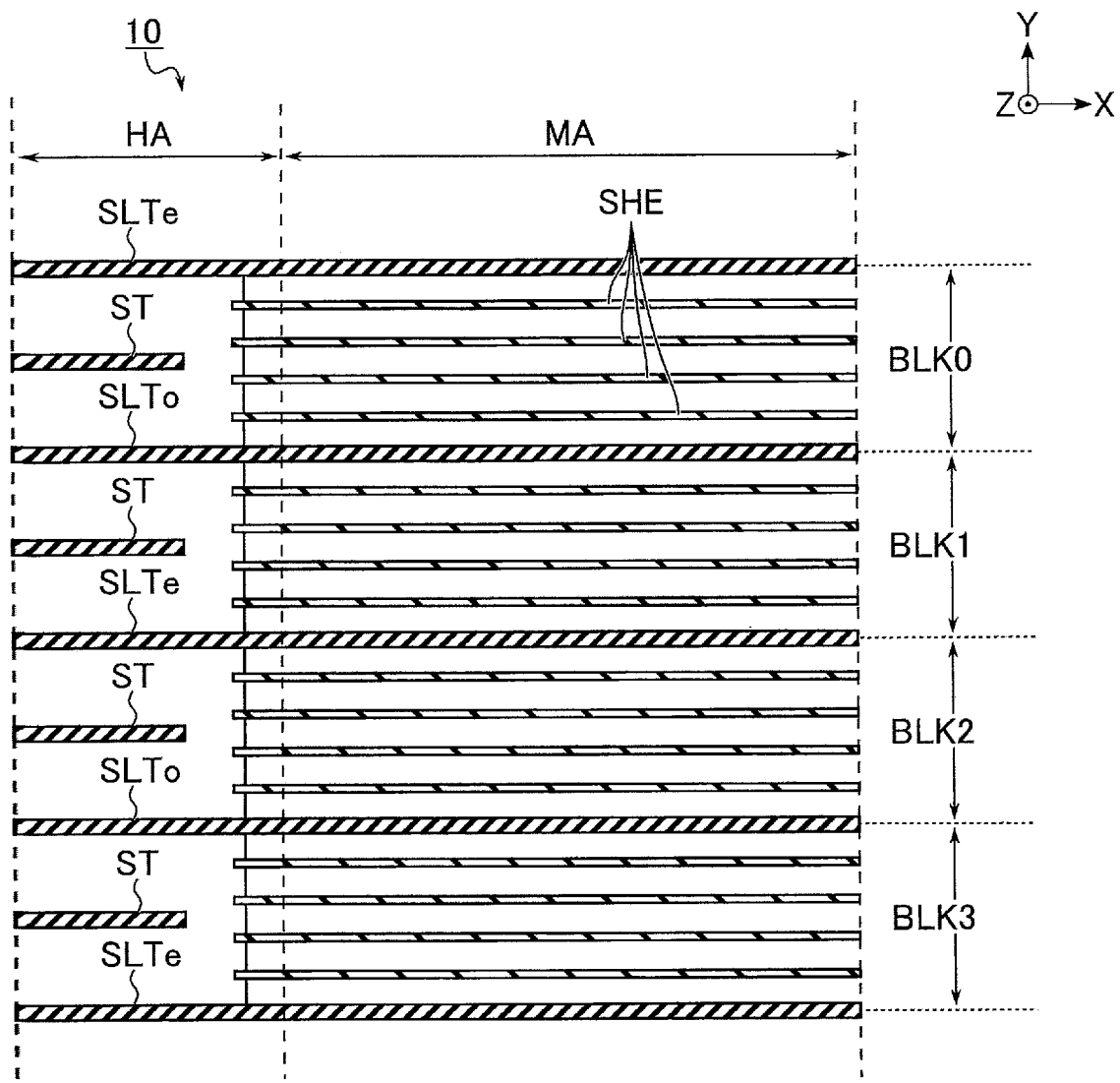
F I G. 32

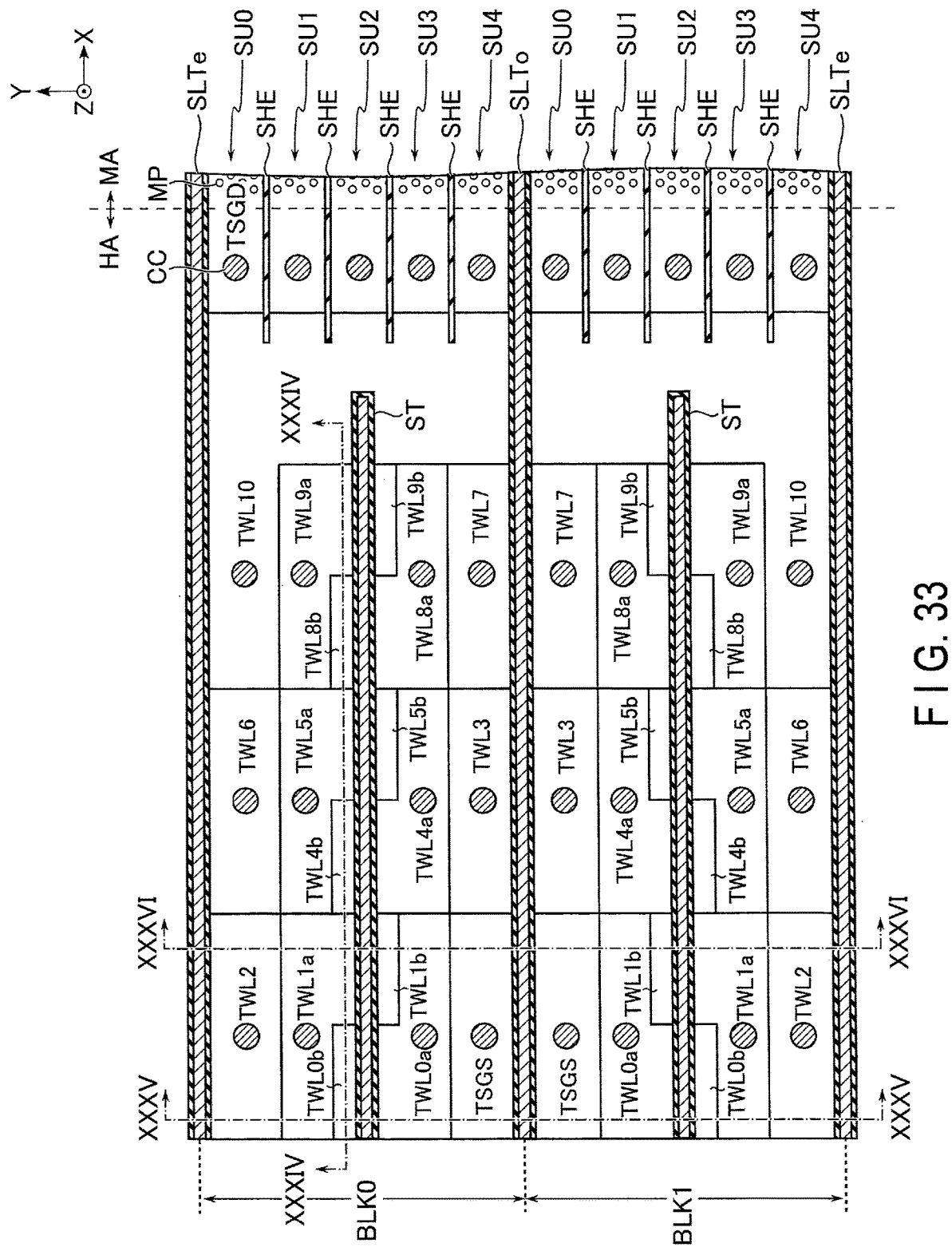
F I G. 33

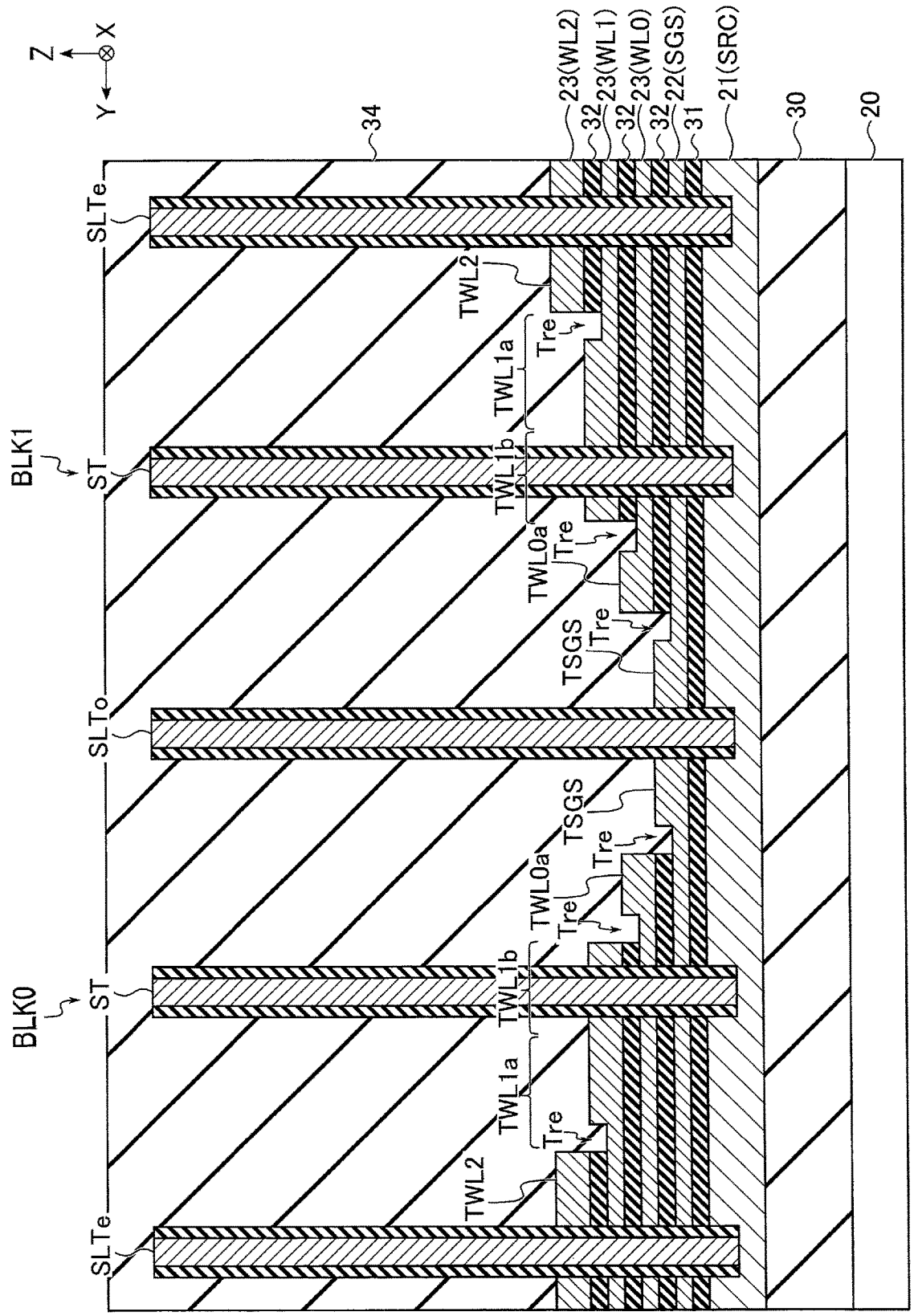
F I G. 36

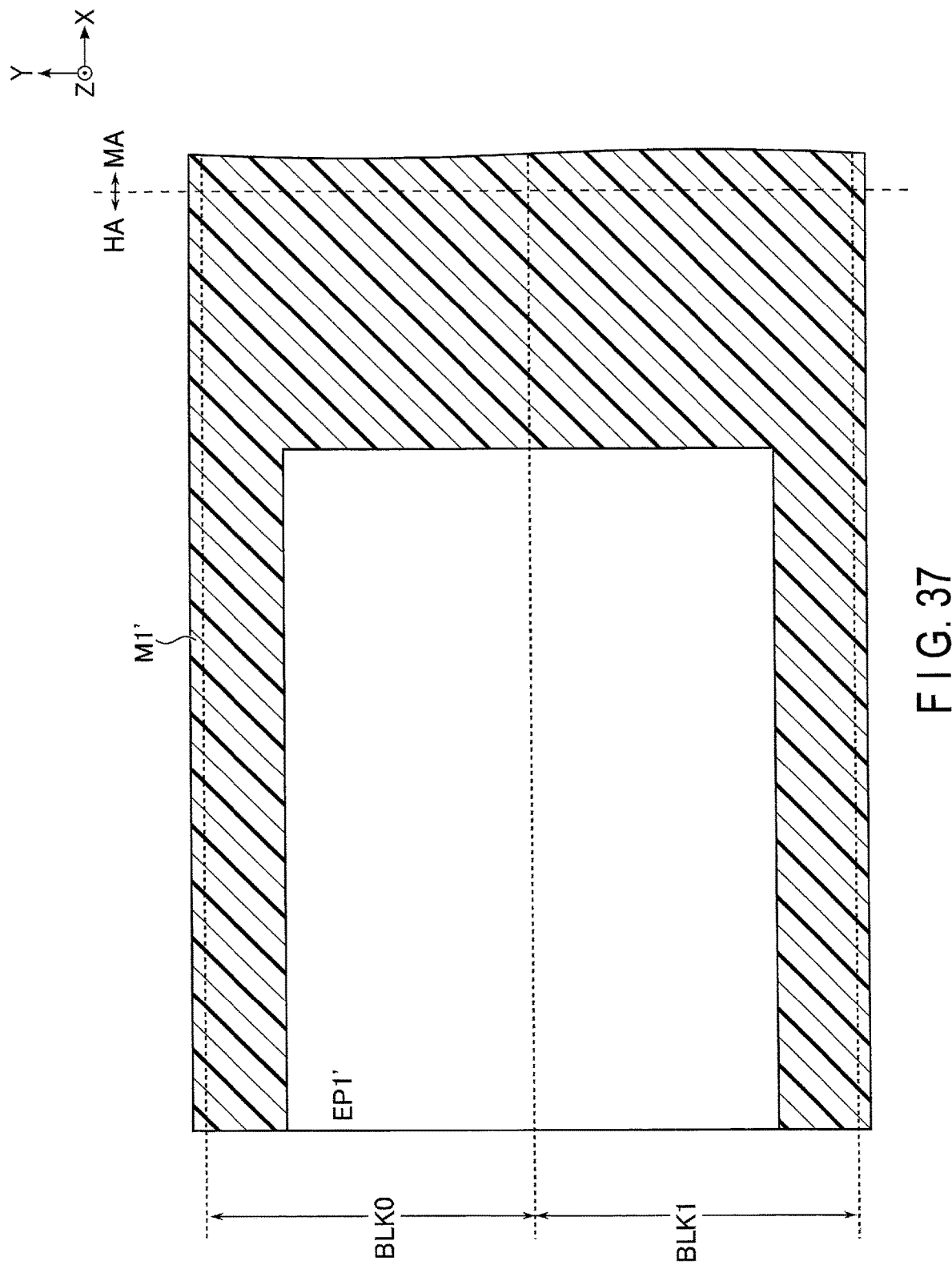
F I G. 37

SEMICONDUCTOR MEMORY DEVICE

CROSS-REFERENCE TO RELATED APPLICATIONS

This application is based upon and claims the benefit of priority from Japanese Patent Application No. 2022-038288, filed Mar. 11, 2022, the entire contents of which are incorporated herein by reference.

FIELD

Embodiments described herein relate generally to a semiconductor memory device.

BACKGROUND

A NAND flash memory is known as a semiconductor memory device that can store data in a non-volatile manner. In a semiconductor memory device such as the NAND flash memory, a three-dimensional memory structure is employed for high integration and high capacity.

BRIEF DESCRIPTION OF THE DRAWINGS

FIG. 6 is a cross-sectional view taken along a VI-VI line in FIG. 5, showing an example of a cross-sectional structure of a memory pillar of the memory cell array provided in the semiconductor memory device of the embodiment.

FIG. 7 is a plan view showing an example of a plane layout of a drawer area and its vicinity of the memory cell array provided in the semiconductor memory device of the embodiment.

FIG. 26 is a cross-sectional view for describing an example of the manufacturing method of the memory cell array provided in the semiconductor memory device of the embodiment.

FIG. 30 is a plan view showing an example of a plane layout of a drawer area and its vicinity of a memory cell array provided in a semiconductor memory device of a first modification.

FIG. 32 is a plan view showing an example of a plane layout of a memory cell array provided in a semiconductor memory device of a second modification.

FIG. 33 is a plan view showing an example of a plane layout of a drawer area and its vicinity of the memory cell array provided in the semiconductor memory device of the second modification.

FIG. 36 is a cross-sectional view taken along a XXXVI-XXXVI line in FIG. 33, showing an example of a cross-sectional structure in the drawer area of the memory cell array provided in the semiconductor memory device of the second modification.

FIG. 37 is a plan view for describing an example of a manufacturing method of the memory cell array provided in the semiconductor memory device of the second modification.

DETAILED DESCRIPTION

Figure 1:
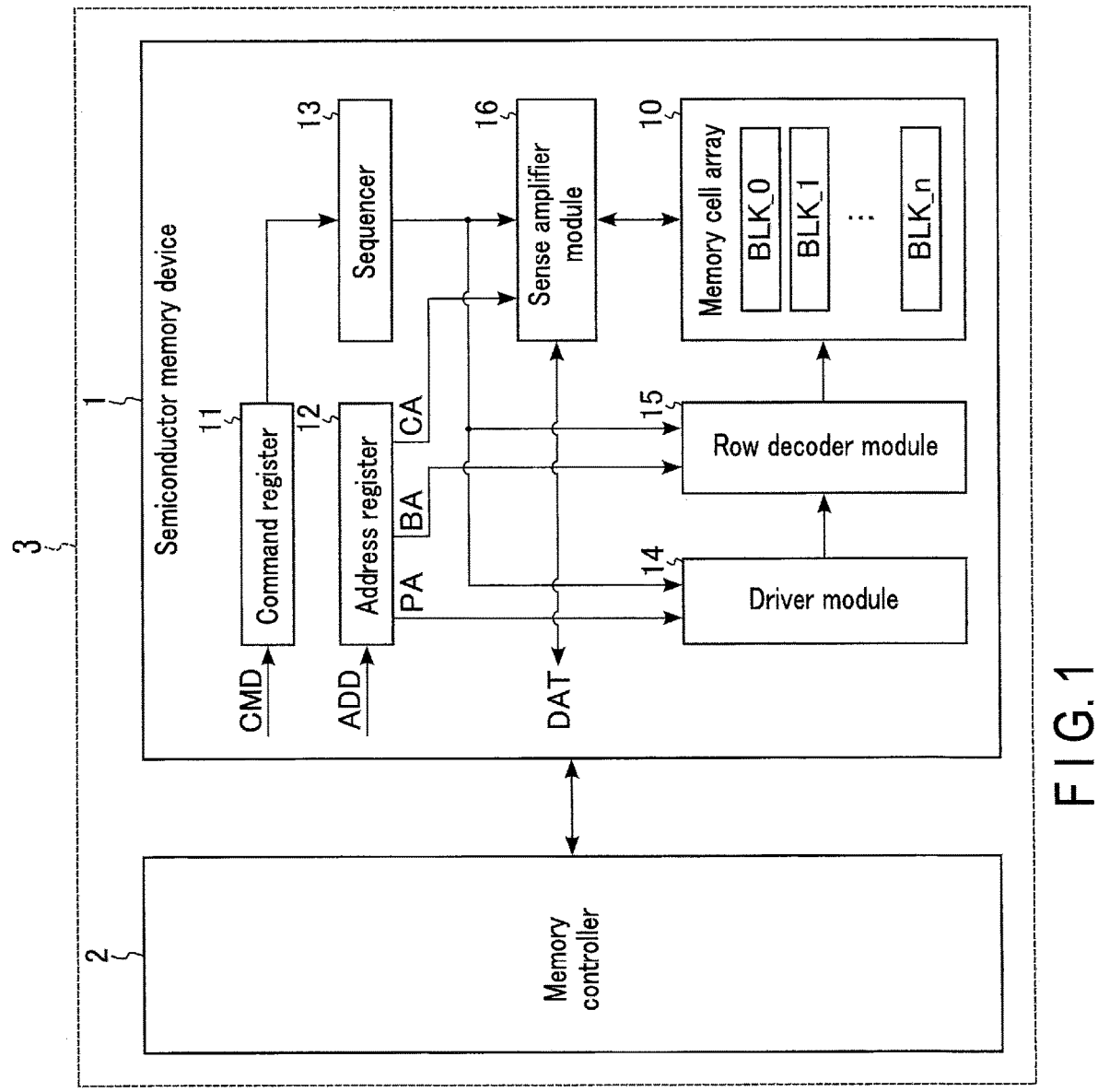
FIG. 1 is a block diagram showing an example of a configuration of a memory system including a semiconductor memory device of an embodiment.

In general, according to one embodiment, a semiconductor memory device includes a plurality of conductive layers arranged separated from each other in a first direction, each of the plurality of conductive layers including a first portion, and a second portion that is provided so as not to be overlapped with an upper conductive layer, and that is thicker than the first portion in the first direction, a first insulator portion that extends in a second direction intersecting the first direction, and that contacts the second portion of a first conductive layer of the plurality of conductive layers, and the second portion of a second conductive layer of the plurality of conductive layers; and, a second insulator portion that extends in the second direction, sandwiches, in a third direction intersecting the first direction and the second direction, together with the first insulator portion, the second portion of the first conductive layer, the second portion of the second conductive layer, and the second portion of a third conductive layer of the plurality of conductive layers, and contacts the second portion of the third conductive layer, wherein the second portion of the second conductive layer includes a first sub portion arranged in the second direction with the second portion of the first conductive layer, and a second sub portion provided between the second portion of the first conductive layer and the second portion of the third conductive layer.

Hereinafter, an embodiment will be described with reference to the drawings.

The sizes and ratios in the drawings are not necessarily the same as the actual sizes and ratios.

Note that, in the following description, the same numerals are given to components having substantially the same functions and configurations. When elements having similar configurations are particularly distinguished from each other, mutually different characters or numbers may be added to the ends of the same numerals.

1. Embodiments 1.1 Configuration
1.1.1 Memory System

The configuration of a memory system will be described by using FIG. 1. FIG. 1 is a block diagram showing an example of the configuration of a memory system including a semiconductor memory device of an embodiment.

A memory system 3 is, for example, a memory card such as an SD™ card, a UFS (universal flash storage), and an SSD (solid state drive). The memory system 3 includes a semiconductor memory device 1 and a memory controller 2. The memory system 3 is configured to be connectable to an external host device, which is not shown.

The memory controller 2 is constituted by, for example, an integrated circuit such as an SoC (system-on-a-chip). The memory controller 2 controls the semiconductor memory device 1 based on a request from the host device. Specifically, for example, the memory controller 2 writes, to the semiconductor memory device 1, data requested to be written from the host device. Additionally, the memory controller 2 reads, from the semiconductor memory device 1, the data requested to be read from the host device, and transmits the data to the host device.

The semiconductor memory device 1 is, for example, a NAND flash memory. The semiconductor memory device 1 stores data in a non-volatile manner.

The communication between the semiconductor memory device 1 and the memory controller 2 is based on, for example, an SDR (single data rate) interface, a toggle DDR (double data rate) interface, or an ONFI (Open NAND flash interface).

1.1.2 Semiconductor Memory Device

Subsequently, referring to the block diagram showing in FIG. 1, the internal configuration of the semiconductor memory device 1 will be described. The semiconductor memory device 1 includes, for example, a memory cell array 10, a command register 11, an address register 12, a sequencer 13, a driver module 14, a row decoder module 15, and a sense amplifier module 16

The memory cell array 10 includes a plurality of blocks BLK0 to BLKn (n is an integer of 1 or more). The block BLK is a group of a plurality of memory cells that can store data in a non-volatile manner. The block BLK is used as, for example, a data erase unit. Additionally, a plurality of bit lines and a plurality of word lines are provided in the memory cell array 10. One memory cell is associated with, for example, one bit line and one word line.

The command register 11 stores a command CMD that is received by the semiconductor memory device 1 from the memory controller 2. The command CMD includes, for example, an instruction that causes the sequencer 13 to perform a read operation, a write operation, an erase operation, etc.

The address register 12 stores an address information ADD that is received by the semiconductor memory device 1 from the memory controller 2. The address information ADD includes, for example, a page address PA, a block address BA, and a column address CA. For example, the page address PA, the block address BA, and the column address CA are used for selection of a word line, a block BLK, and a bit line, respectively.

The sequencer 13 controls the operations of the entire semiconductor memory device 1. For example, the sequencer 13 controls the operations of the driver module 14, the row decoder module 15, the sense amplifier module 16, etc. based on the command CMD stored in the command register 11. Accordingly, read operation, write operation, erase operation, etc. are performed.

The driver module 14 generates voltages used for read operation, write operation, erase operation, etc. Then, the driver module 14 applies a generated voltage to the signal line corresponding to a selected word line, based on, for example, the page address PA stored in the address register 12.

The row decoder module 15 selects one block BLK in the corresponding memory cell array 10, based on the block address BA stored in the address register 12. Then, the row decoder module 15 transfers, for example, the voltage applied to the signal line corresponding to the selected word line to the selected word line in the selected block BLK.

The sense amplifier module 16 transfers write data DAT received from the memory controller 2 to the memory cell array 10 in a write operation. Additionally, the sense amplifier module 16 performs determination of data stored in the memory cell based on the voltage of a bit line in a read operation. The sense amplifier module 16 transfers the result of the determination to the memory controller 2 as read data DAT.

1.1.3 Circuit Configuration of Memory Cell Array

Figure 2:
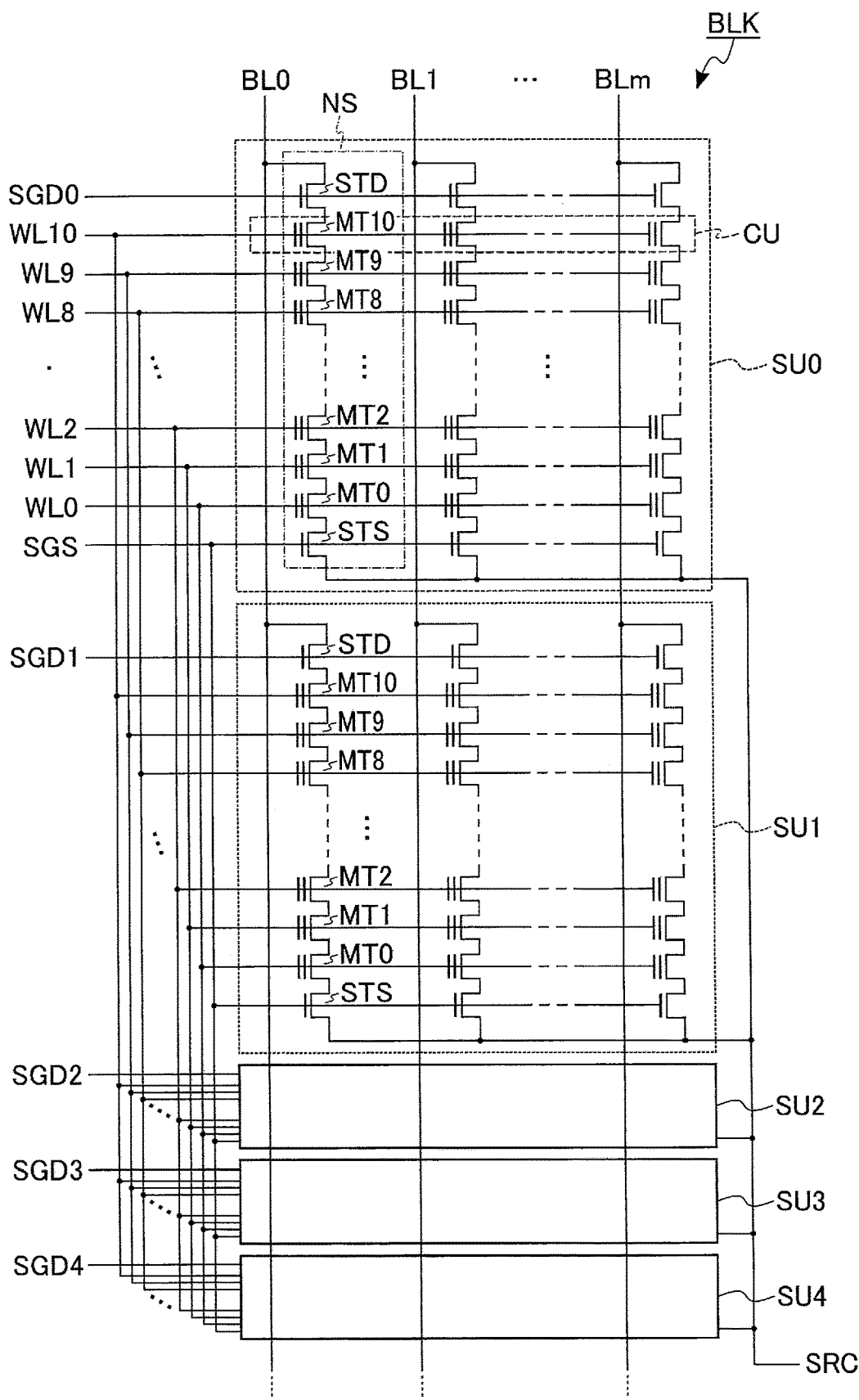
FIG. 2 is a circuit diagram showing an example of a circuit configuration of a memory cell array provided in the semiconductor memory device of the embodiment.

An example of the circuit configuration of the memory cell array 10 will be described by using FIG. 2. FIG. 2 is a circuit diagram showing an example of the circuit configuration of the memory cell array provided in the semiconductor memory device of the embodiment. In FIG. 2, one block BLK in the plurality of blocks BLK included in the memory cell array 10 is shown. In the example shown in FIG. 2, the block BLK includes five string units SU0 to SU4.

Each string unit SU includes a plurality of NAND strings NS associated with bit lines BL0 to BLm (m is an integer of 1 or more), respectively. Each NAND string NS includes, for example, memory cell transistors MT0 to MT10, and select transistors STD and STS. Each of the memory cell transistors MT0 to MT10 includes a control gate and a charge accumulation film. Each of the memory cell transistors MT0 to MT10 stores data in a non-volatile manner. The select transistors STD and STS are used for selection of a string unit SU at the time of various operations. Note that, in the following description, in a case where the bit lines BL0 to BLm are not distinguished from each other, each of the bit lines BL0 to BLm will be merely called the bit line BL. Additionally, in a case where the memory cell transistors MT0 to MT10 are not distinguished from each other, each of the memory cell transistors MT0 to MT10 will be merely called the memory cell transistor MT.

In each NAND string NS, the memory cell transistors MT0 to MT10 are connected in series. A first end of the select transistor STD is connected to the bit line BL associated with the select transistor STD. A second end of the select transistor STD is connected to an end of the memory cell transistors MT0 to MT10 connected in series. A first end of the select transistor STS is connected to the other end of the memory cell transistors MT0 to MT10 connected in series. A second end of the select transistor STS is connected to a source line SRC.

In the same block BLK, the control gates of the memory cell transistors MT0 to MT10 are connected to the word lines WL0 to WL10, respectively. The gates of the select transistors STD in the string units SU0 to SU4 are connected to select gate lines SGD0 to SGD4, respectively. On the other hand, the gates of the plurality of select transistors STS are commonly connected to a select gate line SGS. However, it is not limited to this, and the gates of the plurality of select transistors STS may be connected to a plurality of select gate lines that are different for each string unit SU, respectively. Note that, in the following description, in a case where the word lines WL0 to WL10 are not distinguished from each other, each of the word lines WL0 to WL10 is merely called the word line WL.

A different column address is assigned to each of the bit lines BL0 to BLm. Each bit line BL is shared between the NAND strings NS to which the same column address is assigned in the plurality of blocks BLK. The word lines WL0 to WL10 are provided for each block BLK. The source line SRC is shared between, for example, the plurality of blocks BLK.

A group of a plurality of memory cell transistors MT connected to a common word line WL in one string unit SU is called, for example, a cell unit CU. For example, the storage capacity of a cell unit CU including a plurality of memory cell transistors MT, each storing 1 bit data, is defined as "1-page data." The cell unit CU may have a storage capacity of 2-page data or more, according to the number of bits of data stored in the memory cell transistor MT.

Note that the circuit configuration of the memory cell array 10 is not limited to the configuration described above. For example, the number of the string units SU included in each block BLK may be designed to be an arbitrary number. Each of the numbers of the memory cell transistors MT, and the select transistors STD and STS included in each NAND string NS may be designed to be an arbitrary number.

1.1.4 Structure of Memory Cell Array

Hereinafter, an example of the structure of the memory cell array 10 will be described. Note that, in the drawings referred below, an X direction corresponds to the extension direction of the word line WL. A Y direction corresponds to the extension direction of the bit line BL. A Z direction corresponds to the vertical direction with respect to a surface of a semiconductor substrate used for formation of the semiconductor memory device 1. Hatching is appropriately added to a plan view in order to make the view easier to see. The hatching added to the plan view is not always associated with the material and characteristics of a component to which the hatching is added. In a cross-sectional view, the illustration of a configuration is appropriately omitted in order to make the view easier to see. The configuration shown in each drawing is shown in an appropriately simplified manner.

1.1.4.1 Overall Configuration of Memory Cell Array

Figure 3:
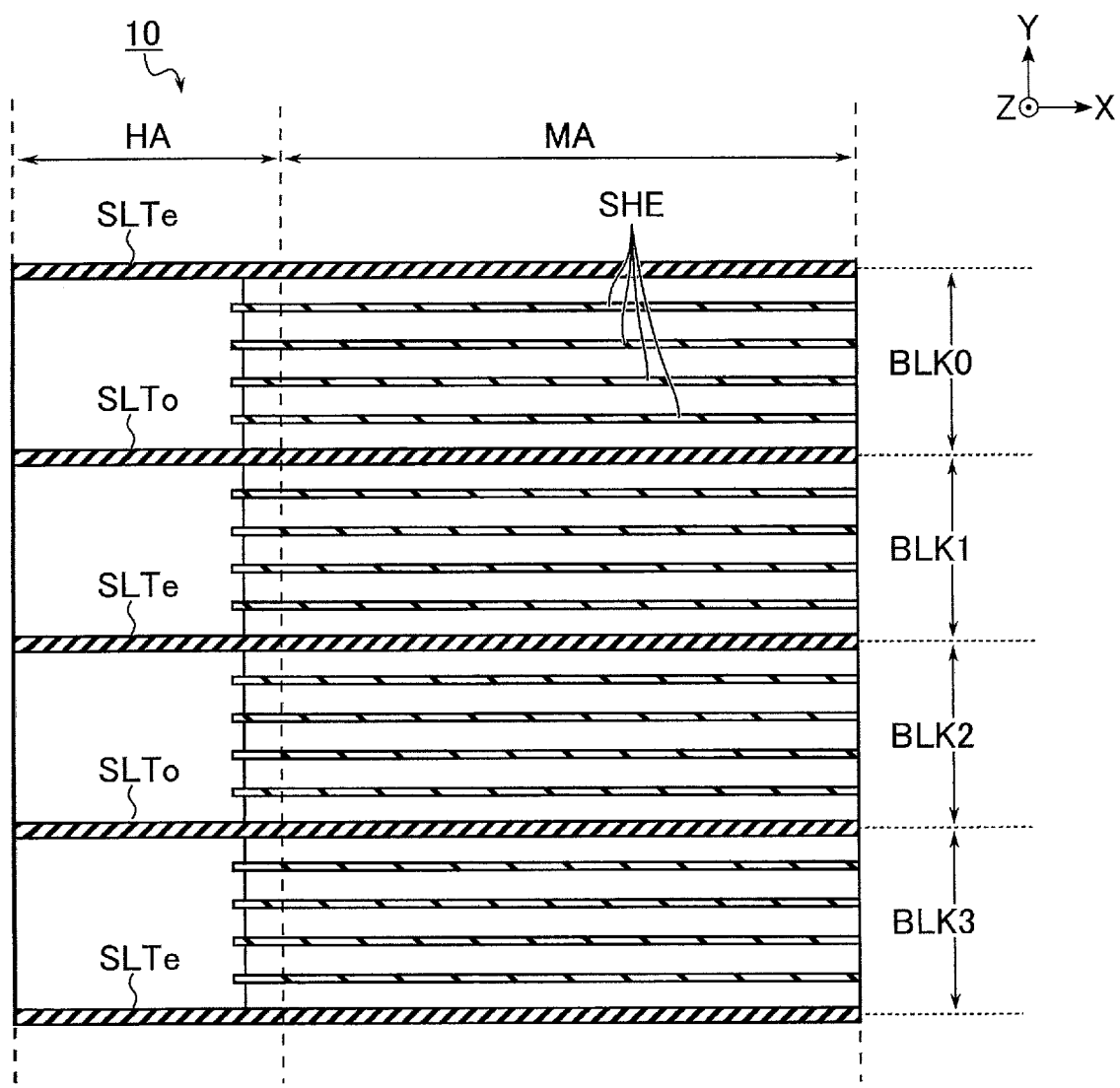
FIG. 3 is a plan view showing an example of a plane layout of the memory cell array provided in the semiconductor memory device of the embodiment.

The planar structure of the entire memory cell array 10 will be described by using FIG. 3. FIG. 3 is a plan view showing an example of the plane layout of the memory cell array provided in the semiconductor memory device of the embodiment. In FIG. 3, the areas corresponding to four blocks BLK0 to BLK3 are shown.

The memory cell array 10 includes a stacked interconnect structure and a plurality of members SLT and SHE. The stacked interconnect structure is a structure stacked along the Z direction according to the number of the select gate lines SGD and SGS and the word lines WL. The stacked interconnect structure includes the select gate lines SGD and SGS and the word lines WL. Note that, in the following description, the select gate lines SGD and SGS and the word lines WL are also collectively called the stacked interconnect.

The stacked interconnect structure is divided into, for example, a memory area MA and a drawer area HA in the X direction.

The memory area MA is an area where data is substantially stored.

The drawer area HA is an area used for connection between the stacked interconnect and the row decoder module 15, etc.

Each member SLT extends in the X direction. Each member SLT crosses the stacked interconnect structure in the X direction over the memory area MA and the drawer area HA. Each member SLT has a structure where, for example, an insulator and a plate-like contact are embedded inside. Each member SLT divides the stacked interconnects that are adjacent to each other via the member SLT. Each of the areas partitioned by the plurality of members SLT corresponds to one block BLK. Note that, in the following description, an end on the block BLK0 side along the Y direction among the blocks BLK0 to BLK3 is called the one end in the Y direction. Additionally, an end on the block BLK3 side along the Y direction among the blocks BLK0 to BLK3 is called the other end in the Y direction.

Among the plurality of members SLT, the members SLT that contact the one end side in the Y direction of the even-numbered blocks BLK (BLK0, BLK2) are called insulator members SLTe. Additionally, the members SLT that contact the one end side in the Y direction of the odd-numbered blocks BLK (BLK1, BLK3) are called insulator members SLTo. That is, a plurality of sets of the insulator members SLTe ("second insulator portion"). and SLTo ("first insulator portion") are arranged in the Y direction in the memory cell array 10.

Each member SHE extends in the X direction. In the embodiment, a case will be described where four members SHE are provided between adjacent members SLT, respectively. Each member SHE crosses the stacked interconnect structure in the X direction over the memory area MA. Each member SHE has a structure where, for example, an insulator is embedded. Each member SHE divides, for example, the select gate lines SGD that are adjacent to each other via the member SHE. Each of the areas partitioned by the plurality of members SLT and SHE corresponds to one string unit SU.

In the memory cell array 10, for example, the plane layout shown in FIG. 3 is repeatedly arranged in the Y direction.

Note that, the plane layout of the memory cell array 10 is not limited to the layout described above. For example, the number of the members SHE arranged between the adjacent members SLT may be designed to be an arbitrary number, according to the number of the string units SU.

1.1.4.2 Memory Area

The structure in the memory area MA of the memory cell array 10 will be described.

(Planar Structure)

Figure 4:
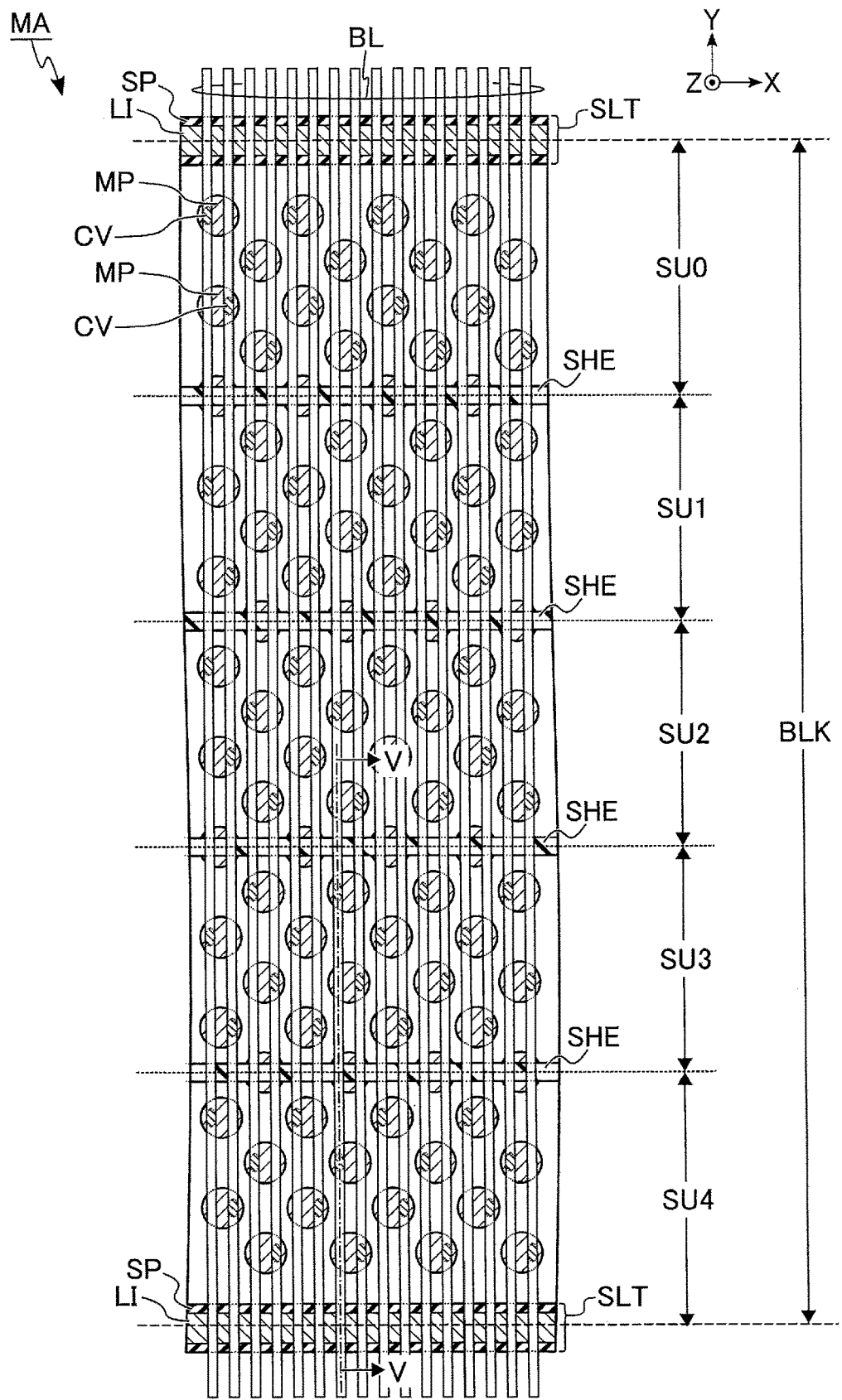
FIG. 4 is a plan view showing an example of a plane layout in a memory area of the memory cell array provided in the semiconductor memory device of the embodiment.

The planar structure in the memory area MA of the memory cell array 10 will be described by using FIG. 4. FIG. 4 is a plan view showing an example of the plane layout in the memory area of the memory cell array provided in the semiconductor memory device of the embodiment. In FIG. 4, an area including one block BLK, i.e., the string units SU0 to SU4, is shown.

In the memory area MA, the memory cell array 10 includes a plurality of memory pillars MP, a plurality of contacts CV, and a plurality of bit lines BL. Additionally, each member SLT includes a contact LI and spacers SP.

Each memory pillar MP functions as, for example, one NAND string NS. The plurality of memory pillars MP are arranged in, for example, a staggered pattern of 24 rows in the area between two adjacent members SLT. Then, for example, counting from the one end side in the Y direction, a fifth row memory pillar MP, a 10th row memory pillar MP, a 15th row memory pillar MP, and a 20th row memory pillar MP are each overlapped with one member SHE.

The plurality of bit lines BL each extends in the Y direction, and are arranged in the X direction. Each bit line BL is arranged so as to be overlapped with at least one memory pillar MP for each string unit SU. In the example of FIG. 4, each bit line BL is arranged so as to be overlapped with two memory pillars MP for each string unit SU. One bit line BL among the plurality of bit lines BL overlapped with the memory pillars MP and the memory pillars MP are electrically connected to each other via the contacts CV.

For example, the contacts CV between the memory pillars MP overlapped with the members SHE, and the bit lines BL are omitted. The numbers and arrangement of the memory pillars MP, the members SHE, etc. between the adjacent members SLT are not limited to the configuration described by using FIG. 4, and may be appropriately changed. The number of the bit lines BL overlapped with each memory pillar MP may be designed to be an arbitrary number.

The contact LI is a conductor including a portion provided to extend in the X direction. The spacers SP are insulators provided on side surfaces of the contact LI. The contact LI is sandwiched by the spacers SP. The contact LI and the stacked interconnects adjacent to the contact LI in the Y direction are electrically separated by the spacers SP. Accordingly, the contact LI and the stacked interconnects adjacent to the contact LI in the Y direction are insulated from each other.

(Cross-Sectional Structure)

Figure 5:
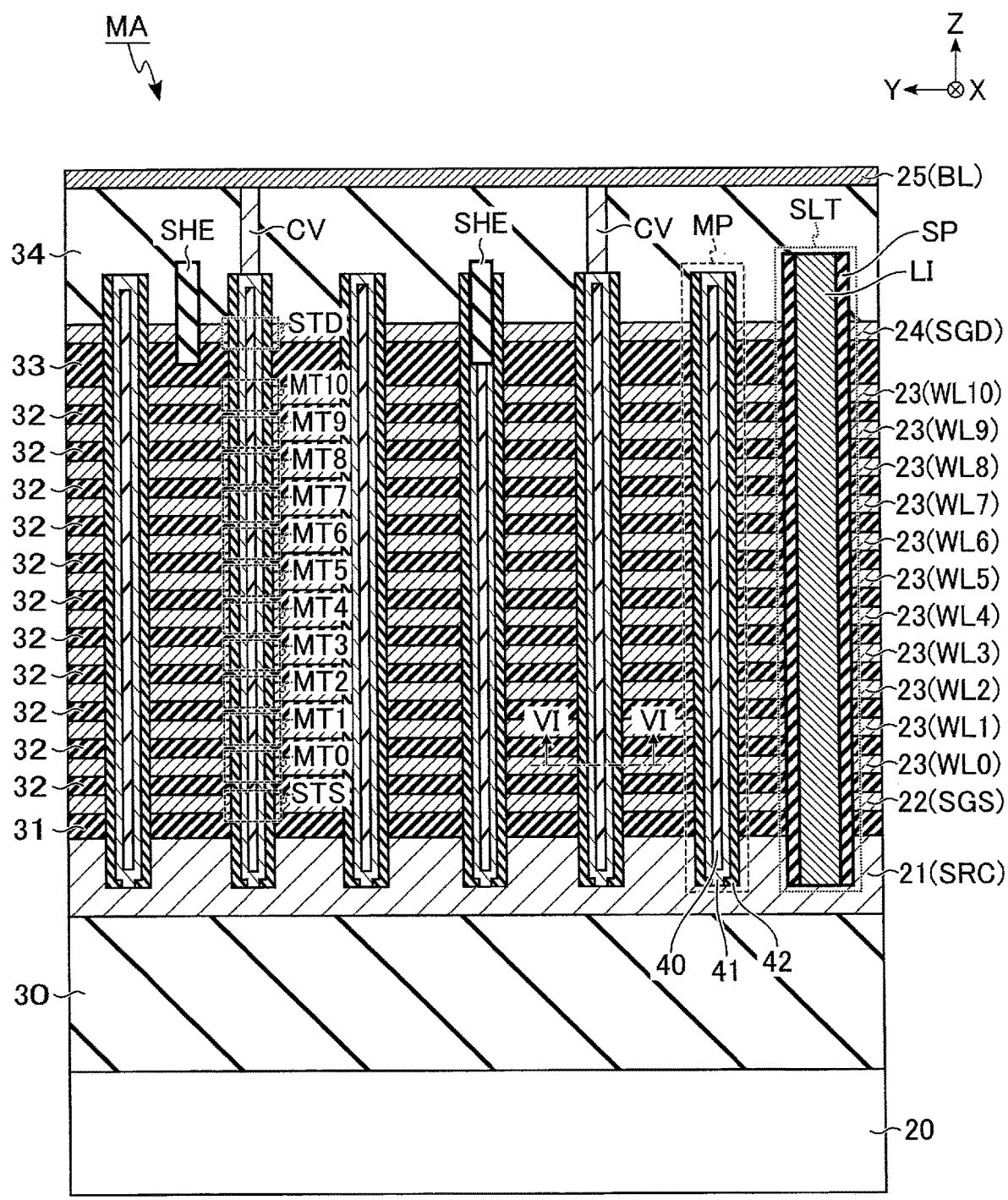
FIG. 5 is a cross-sectional view taken along a V-V line in FIG. 4, showing an example of a cross-sectional structure in the memory area of the memory cell array provided in the semiconductor memory device of the embodiment.

The cross-sectional structure in the memory area MA of the memory cell array 10 will be described by using FIG. 5. FIG. 5 is a cross-sectional view taken along a V-V line in FIG. 4, showing an example of the cross-sectional structure in the memory area of the memory cell array provided in the semiconductor memory device of the embodiment. As shown in FIG. 5, the memory cell array 10 further includes a semiconductor substrate 20, conductive layers 21 to 25, and insulator layers 30 to 34.

The insulator layer 30 is provided on the semiconductor substrate 20. The insulator layer 30 includes a circuit (not shown) corresponding to, for example, the row decoder module 15, the sense amplifier module 16, etc. Note that, in the present specification, it is assumed that a direction in which the memory cell array 10 is provided to the semiconductor substrate 20 is the upper direction.

The conductive layer 21 is provided on the insulator layer 30. The conductive layer 21 is formed in, for example, a plate-like shape that is spread along an XY plane. The conductive layer 21 is used as the source line SRC. The conductive layer 21 includes, for example, phosphorus-doped silicon.

The insulator layer 31 is provided on the conductive layer 21. The conductive layer 22 is provided on the insulator layer 31. The conductive layer 22 is formed in, for example, a plate-like shape that is spread along the XY plane, and is used as the select gate line SGS. The conductive layer 22 includes, for example, tungsten.

Eleven insulator layers 32 and eleven conductive layers 23 are alternately stacked on the conductive layer 22 in the order of the insulator layer 32, the conductive layer 23, the insulator layer 32, . . . , the insulator layer 32, and the conductive layer 23. The conductive layer 23 is formed in, for example, a plate-like shape that is spread along the XY plane. The plurality of stacked conductive layers 23 are used as the word lines WL0 to WL10 sequentially from the semiconductor substrate 20 side, respectively. The conductive layer 23 includes, for example, tungsten.

The insulator layer 33 is provided on the topmost conductive layer 23. The conductive layer 24 is provided on the insulator layer 33. The conductive layer 24 is formed in, for example, a plate-like shape that is spread along the XY plane. The conductive layer 24 is used as the select gate line SGD. The conductive layer 24 includes, for example, tungsten.

The insulator layer 34 is provided on the conductive layer 24. The conductive layer 25 is provided on the insulator layer 34. The conductive layer 25 is formed in, for example, a line shape that extends in the Y direction. The conductive layer 25 is used as the bit line BL. The conductive layer 25 includes, for example, copper.

Each memory pillar MP is provided to extend along the direction of Z. Each memory pillar MP penetrates the insulator layers 31 and 33, the plurality of insulator layers 32, the conductive layers 22 and 24, and the plurality of conductive layers 23. The bottom of each memory pillar MP contacts the conductive layer 21. The portion where each memory pillar MP and the conductive layer 22 intersect functions as the select transistor STS. The portion where each memory pillar MP and one conductive layer 23 intersect functions as one memory cell transistor MT. The portion where each memory pillar MP and the conductive layer 24 intersect functions as the select transistor STD.

Additionally, each memory pillar MP includes, for example, a core member 40, a semiconductor layer 41, and a stacked film 42. The core member 40 is provided to extend along the Z direction. An upper end of the core member 40 is included in, for example, a layer upper than the conductive layer 24. A lower end of the core member 40 reaches, for example, the same height as the conductive layer 21. The semiconductor layer 41 covers the surrounding of the core member 40. In a lower part of the memory pillar MP, a part of the semiconductor layer 41 contacts the conductive layer 21. The stacked film 42 covers side surfaces and a bottom surface of the semiconductor layer 41, except for a portion where the semiconductor layer 41 and the conductive layer 21 contact each other. The core member 40 includes, for example, an insulator such as silicon oxide. The semiconductor layer 41 includes, for example, silicon.

The pillar-shaped contact CV is provided on an upper surface of the semiconductor layer 41 in the memory pillar MP. In the shown area, two contacts CV corresponding to two memory pillars MP, respectively, among six memory pillars MP are shown. For the memory pillar MP that is not overlapped with the member SHE, and to which the contact CV is not connected in the memory area MA, a contact CV is connected in an area that is not shown.

An upper surface of the contact CV contacts one conductive layer 25. That is, the upper surface of the contact CV contacts one bit line BL. One contact CV is connected to the one conductive layer 25 in each of the spaces partitioned by the plurality of insulator members SLT and SHE.

Each insulator member SLT includes, for example, a portion provided along an XZ plane. Each insulator member SLT divides the conductive layers 22 to 24. The contact LI in each insulator member SLT is provided along the member SLT. An upper end of the contact LI is located between the conductive layer 24 and the conductive layer 25. A lower end of the contact LI contacts the conductive layer 21. The contact LI is used as, for example, a part of the source line SRC. The spacer SP is provided between the contact LI and the conductive layers 22 to 24.

Each member SHE includes, for example, a portion provided along the XZ plane. Each member SHE divides the conductive layer 24. An upper end of each member SHE is located between the conductive layer 24 and the conductive layer 25. A lower end of each member SHE is located between the topmost conductive layer 23 and the conductive layer 24. The member SHE includes, for example, an insulator such as silicon oxide. The upper end of the member SHE and the upper end of the member SLT may be aligned, or may not be aligned. Additionally, the upper end of the member SHE and the upper end of the memory pillar MP may be aligned, or may not be aligned.

The cross-sectional structure of the memory pillar MP will be described by using FIG. 6. FIG. 6 is a cross-sectional view taken along a VI-VI line in FIG. 5, showing an example of the cross-sectional structure of the memory pillar of the memory cell array provided in the semiconductor memory device of the embodiment.

The stacked film 42 includes, for example, a tunnel insulating film 43, a charge accumulation film 44, and a block insulating film 45.

In a cross section including the conductive layer 23, the core member 40 is provided in a center portion of the memory pillar MP. The semiconductor layer 41 surrounds a side surface of the core member 40. The tunnel insulating film 43 surrounds a side surface of the semiconductor layer 41. The charge accumulation film 44 surrounds a side surface of the tunnel insulating film 43. The block insulating film 45 surrounds a side surface of the charge accumulation film 44. The conductive layer 23 surrounds a side surface of the block insulating film 45. Each of the tunnel insulating film 43 and the block insulating film 45 includes, for example, silicon oxide. The charge accumulation film 44 includes, for example an insulator that can accumulate charge. The insulator is, for example, silicon nitride.

In the above-described memory pillar MP, the semiconductor layer 41 functions as a current path for the memory cell transistors MT0 to MT10, and the select transistors STD and STS. The semiconductor memory device 1 passes current through the memory pillar MP between the bit line BL and the source line SRC by turning the memory cell transistors MT0 to MT10, and the select transistors STD and STS into an ON-state.

1.1.4.3 Drawer Area

The planar structure in the drawer area HA of the memory cell array 10 will be described.

(Planar Structure)

The planar structure in the drawer area HA of the memory cell array 10 will be described by using FIG. 7. FIG. 7 is a plan view showing an example of the plane layout of the drawer area and its vicinity of the memory cell array provided in the semiconductor memory device of the embodiment. In FIG. 7, the planar structure in the respective drawer areas HA of the blocks BLK0 and BLK1 in the memory cell arrays 10 are shown. Additionally, the structure of the memory areas MA in the vicinity of the drawer areas HA is also shown in FIG. 7.

In the drawer area HA, the select gate lines SGS and SGD, and the word lines WL0 to WL10 include conductive terrace portions TSGS and TSGD, and TWL0 to TWL10 that are not overlapped with the upper conductive layer, respectively. Additionally, the memory cell array 10 includes a plurality of contacts CC. Note that, in the following description, in a case where the conductive terrace portions TSGS, TSGD, and TWL0 to TWL10 are not distinguished from each other, each of the conductive terrace portions TSGS, TSGD and TWL0 to TWL10 is merely called the terrace portion T.

The shape of the terrace portion T is similar to a step, a terrace, a rimstone, etc. In the embodiment, in each block BLK, a case is shown where an end of the select gate line SGS and ends of the word lines WL0 to WL10 are provided in step-like shapes that include three steps in the X direction, and include one step in the Y direction.

In each block BLK, a portion including the terrace portions TSGS, TWL0, and TWL1, a portion including the terrace portions TWL2 ("second portion of first conductive layer"), TWL3 ("second portion of second conductive layer"), and TWL4 ("second portion of a third conductive layer"), a portion including the terrace portions TWL5 to TWL7, and a portion including the terrace portions TWL8 to TWL10 are arranged in this order along the X direction.

The terrace portion TWL0 includes a first portion TWL0*a*, and a second portion TWL0*b* connected to the first portion TWL0*a*. The terrace portion TWL3 includes a first portion TWL3*a*, and a second portion TWL3*b* ("first sub portion of second conductive layer") connected to the first portion TWL3*a* ("second sub portion of second conductive layer"). The terrace portion TWL6 includes a first portion TWL6*a*, and a second portion TWL6*b* connected to the first portion TWL6*a*. The terrace portion TWL9 includes a first portion TWL9*a*, and a second portion TWL9*b* connected to the first portion TWL9*a*. Note that, in the following description, in a case where each terrace portion T includes a plurality of portions, when the plurality of portions are not distinguished from each other, it is merely called the terrace portion T.

The terrace portion TSGS, the first portion TWL0*a*, and the terrace portion TWL1 are arranged in this order in the Y direction. The terrace portion TWL2, the first portion TWL3*a*, and the terrace portion TWL4 are arranged in this order in the Y direction. The terrace portion TWL5, the first portion TWL6*a*, and the terrace portion TWL7 are arranged in this order in the Y direction. The terrace portion TWL8, the first portion TWL9*a*, and the terrace portion TWL10 are arranged in this order in the Y direction.

In plan view, the second portion TWL0*b* is sandwiched by the terrace portions TSGS and TWL2 in the X direction. The second portion TWL3*b* is sandwiched by the terrace portions TWL2 and TWL5 in the X direction. The second portion TWL6*b* is sandwiched by the terrace portions TWL5 and TWL8 in the X direction. The second portion TWL9*b* is sandwiched by the terrace portions TWL8 and TWL10 in the X direction.

The terrace portions TSGS, TWL2, TWL5, TWL8, and TWL10, and the second portions TWL0*b*, TWL3*b*, TWL6*b*, and TWL9*b* contact the member SLTo.

The terrace portions TWL1, TWL4, TWL7, and TWL10 contact the member SLTe.

A plurality of contacts CC are provided on upper surfaces of the terrace portions TSGS, TWL0 to TWL10, and TSGD.

Each of the plurality of contacts CC is electrically connected to the row decoder module 15. Accordingly, a voltage is applied to the select gate lines SGS and SGD, and the word lines WL0 to WL10 via the plurality of contacts CC, respectively.

Note that, the structure of the terrace portions of each even-numbered block BLK and the structure of the terrace portions of each odd-numbered block BLK have symmetrical structures with respect to, for example, the XZ plane.

(Cross-Sectional Structure)

Figure 8:
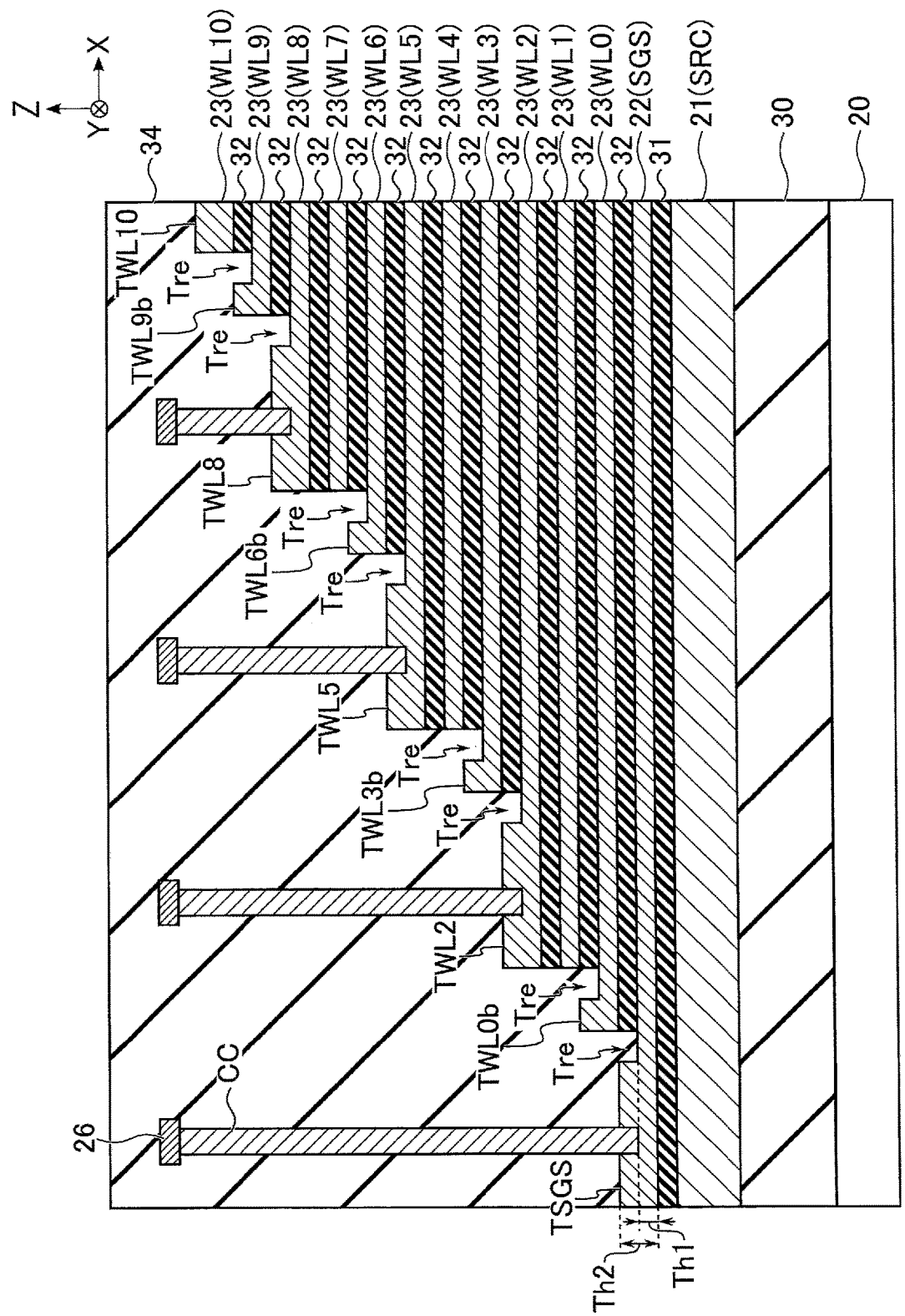
FIG. 8 is a cross-sectional view taken along a VIII-VIII line in FIG. 7, showing an example of a cross-sectional structure in the drawer area of the memory cell array provided in the semiconductor memory device of the embodiment.

The cross-sectional structure in the XZ plane in the drawer area HA of the memory cell array 10 will be described by using FIG. 8. FIG. 8 is a cross-sectional view taken along a VIII-VIII line in FIG. 7, showing an example of the cross-sectional structure in the drawer area of the memory cell array provided in the semiconductor memory device of the embodiment.

Along the VIII-VIII line in FIG. 7, the stacked interconnect structure has a step structure including the terrace portions TSGS, TWL2, TWL5, TWL8, and TWL10, and the second portions TWL0*b*, TWL3*b*, TWL6*b*, and TWL9*b*.

In the above-described step structure, the conductive layer 22, and each of the plurality of conductive layers 23 corresponding to the word lines WL0, WL2, WL3, WL5, WL6, WL8, WL9, and WL10 includes a first conductor portion having a first thickness Th1, and a second conductor portion having a second thickness Th2 that is thicker than the first thickness Th1 in the Z direction. Note that, in a portion (not shown) different from the above-described step structure, each of the plurality of conductive layers 23 corresponding to the word lines WL1, WL4, and WL7 also includes the first conductor portion having the first thickness Th1, and the second conductor portion having the second thickness Th2 in the Z direction.

The terrace portion TWL10 includes the second conductor portion. Each of the terrace portions TSGS, TWL2, TWL5, TWL8, and the second portions TWL0*b*, TWL3*b*, TWL6*b*, and TWL9*b* includes a trench portion Tre, which is a part of the first conductor portion, and the second conductor portion. The trench portion Tre of each terrace portion T is located between the second conductor portion and a portion overlapped with an upper conductive layer of the first conductor portion.

In this manner, the thickness of the trench portion Tre is thinner than that of the second conductor portion, and is equivalent to that of the portion overlapped with the upper conductive layer. Therefore, the terrace portion TSGS is separated in the X direction from a side surface of the conductive layer 23 corresponding to the word line WL0.

The second portion TWL0b is separated in the X direction from side surfaces of the conductive layers 23 corresponding to the word lines WL1 and WL2, respectively. The terrace portion TWL2 is separated in the X direction from a side surface of the conductive layer 23 corresponding to the word line WL3. The second portion TWL3b is separated in the X direction from side surfaces of the conductive layers 23 corresponding to the word lines WL4 and WL5, respectively. The terrace portion TWL5 is separated in the X direction from a side surface of the conductive layer 23 corresponding to the word line WL6. The second portion TWL6b is separated in the X direction from side surfaces of the conductive layers 23 corresponding to the word lines WL7 and WL8, respectively. The terrace portion TWL8 is separated in the X direction from a side surface of the conductive layer 23 corresponding to the word line WL9. The second portion TWL9b is separated in the X direction from a side surface of the conductive layer 23 corresponding to the word line WL10. Additionally, in an area not shown, the terrace portion TWL10 may include a trench portion that forms a part of the first conductor portion, so as to be separated in the X direction from a side surface of the conductive layer 23 corresponding to the select gate line SGD.

Each of the plurality of contacts CC is provided for the second conductor portion of the corresponding conductive layer 22 or 23. In the cross section shown in FIG. 8, the contacts CC corresponding to the select gate line SGS, and the word lines WL2, WL5, and WL8, respectively, are shown. A bottom surface of each contact CC is located between, for example, an upper surface of the second conductor portion of the corresponding conductive layer 22 or 23, and a bottom surface of the second conductor portion of the conductive layer 22 or 23.

The memory cell array 10 further includes a plurality of conductive layers 26 corresponding to the plurality of contacts CC. Each of the plurality of conductive layers 26 is provided on an upper surface of the corresponding contact CC. Accordingly, the conductive layers 22 and 23 and the respectively associated conductive layers 26 are electrically connected to each other via the contacts CC. The plurality of conductive layers 26 are included in, for example, a layer of the same height as the conductive layer 25 shown in FIG. 5. The plurality of conductive layers 26 are connected to the row decoder module 15.

The insulator layer 34 is provided above the plurality of conductive layers 23.

Figure 9:
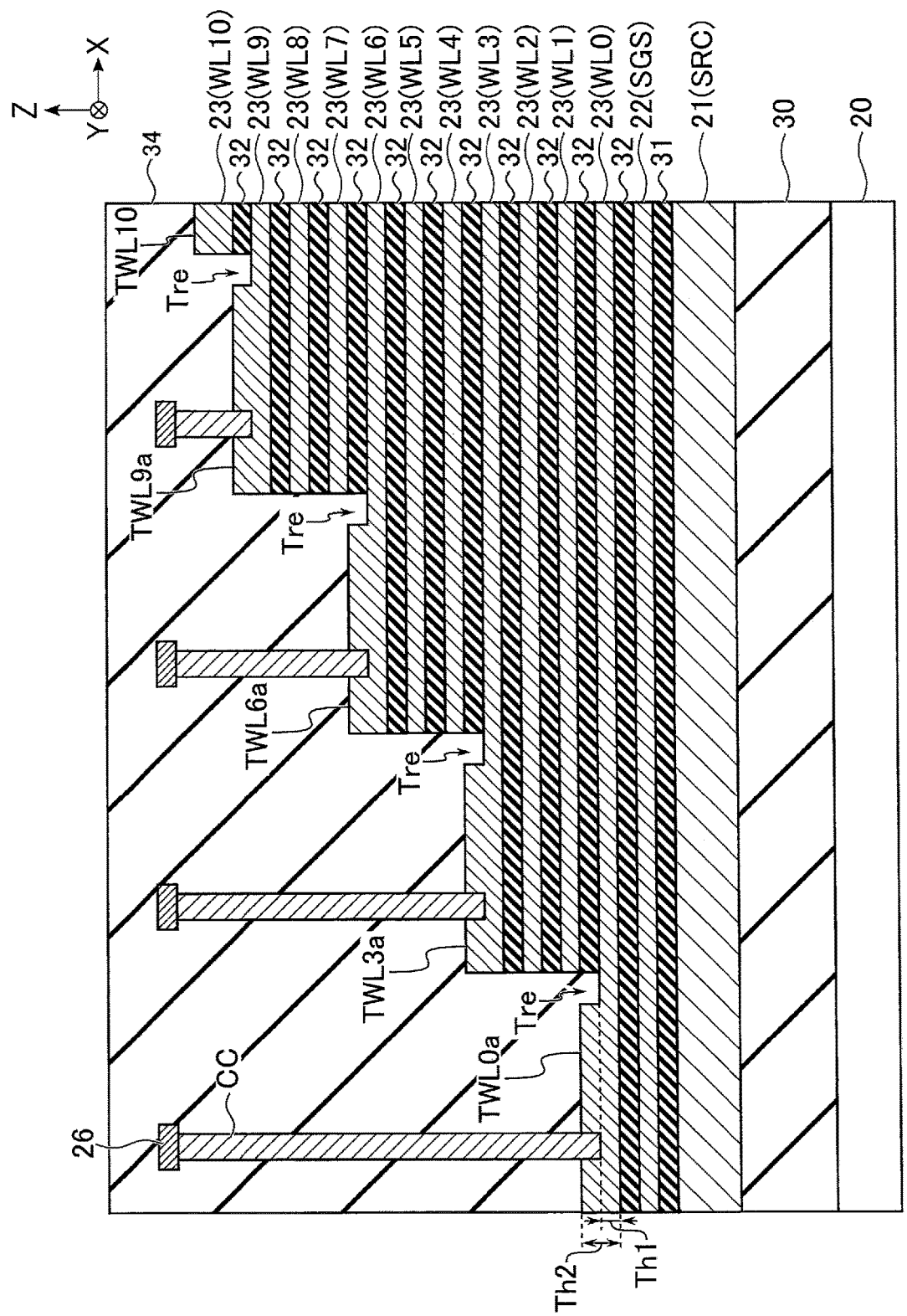
FIG. 9 is a cross-sectional view taken along a IX-IX line in FIG. 7, showing an example of a cross-sectional structure in the drawer area of the memory cell array provided in the semiconductor memory device of the embodiment.

The cross-sectional structure in the XZ plane in the drawer area HA of the memory cell array 10 will be further described by using FIG. 9. FIG. 9 is a cross-sectional view taken along a IX-IX line in FIG. 7, showing an example of the cross-sectional structure in the drawer area of the memory cell array provided in the semiconductor memory device of the embodiment.

Along the IX-IX line in FIG. 7, the stacked interconnect structure has a step structure including the first portions TWL0a, TWL3a, TWL6a, and TWL9a, and the terrace portion TWL10.

In the above-described step structure, each of the first portions TWL0a, TWL3a, TWL6a, and TWL9a includes the trench portion Tre, which is a part of the first conductor portion, and the second conductor portion. The terrace portion TWL10 includes the second conductor portion.

With such a configuration, the first portion TWL0a is separated in the X direction from side surfaces of the conductive layers 23 corresponding to the word lines WL1 to WL3, respectively. The first portion TWL3a is separated in the X direction from side surfaces of the conductive layers 23 corresponding to the word lines WL4 to WL6, respectively. The first portion TWL6a is separated in the X direction from side surfaces of the conductive layers 23 corresponding to the word lines WL7 to WL9, respectively. The first portion TWL9a is separated in the X direction from a side surface of the conductive layer 23 corresponding to the word line WL10.

Note that, the step structure of the stacked interconnect structure in the XZ plane including the terrace portions TWL1, TWL4, TWL7, and TWL10 has a structure similar to the step structure of the stacked interconnect structure including the first portions TWL0a, TWL3a, TWL6a, and TWL9a in FIG. 9, except for having a different height.

Figure 10:
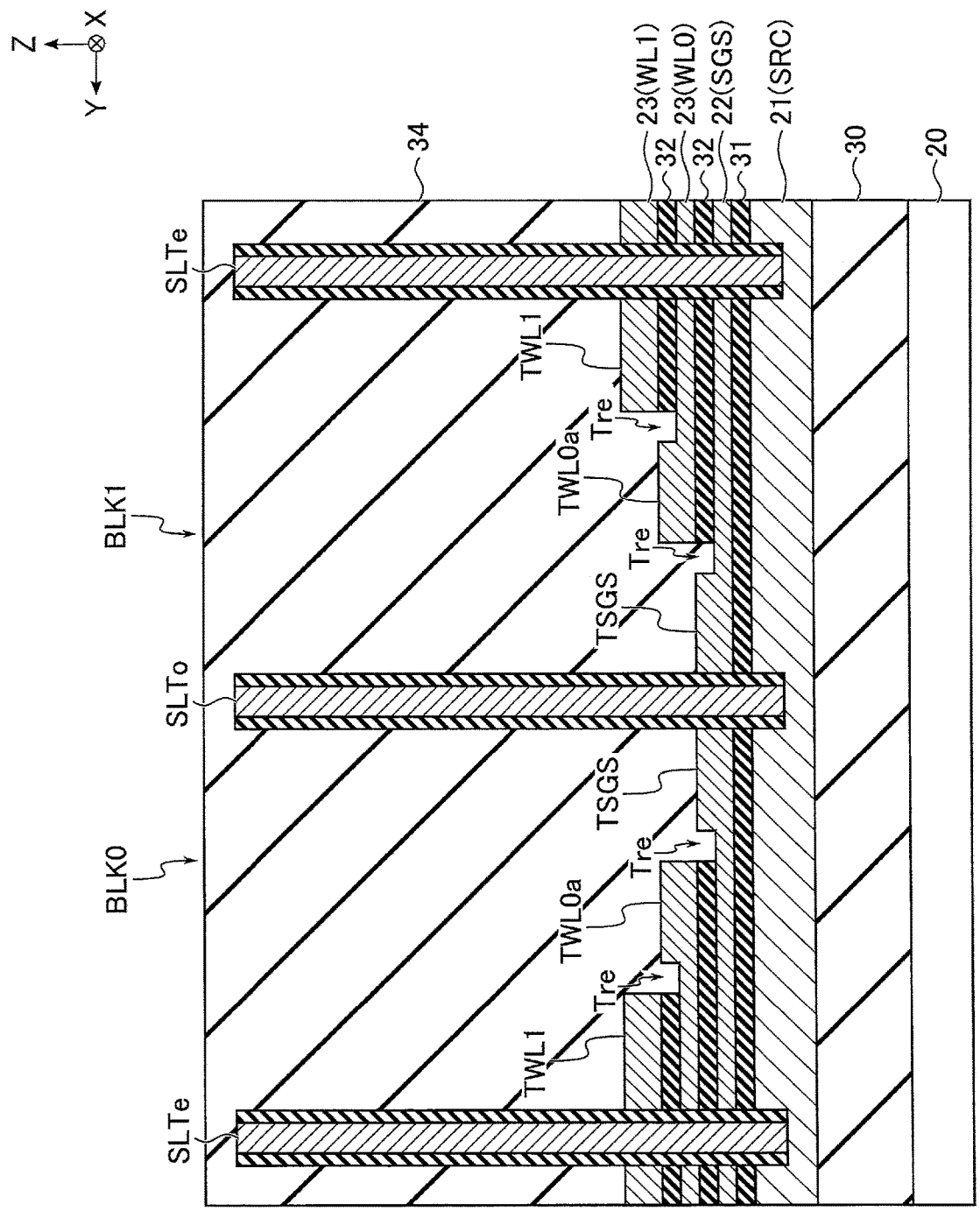
FIG. 10 is a cross-sectional view taken along a X-X line in FIG. 7, showing an example of a cross-sectional structure in the drawer area of the memory cell array provided in the semiconductor memory device of the embodiment.

The cross-sectional structure in a YZ plane in the drawer area HA of the memory cell array 10 will be described by using FIG. 10. FIG. 10 is a cross-sectional view taken along a X-X line in FIG. 7, showing an example of the cross-sectional structure in the drawer area of the memory cell array provided in the semiconductor memory device of the embodiment.

Along the X-X line in FIG. 7, the stacked interconnect structure has a step structure including the terrace portions TSGS and TWL1, and the first portion TWL0a.

In the above-described step structure, the terrace portion TSGS and the first portion TWL0a include the second conductor portion and the trench portion Tre. The terrace portion TWL1 includes the second conductor portion.

With such a configuration, the terrace portion TSGS is separated in the Y direction from a side surface of the conductive layer 23 corresponding to the word line WL0. The first portion TWL0a is separated in the Y direction from a side surface of the conductive layer 23 corresponding to the word line WL1.

The first portion TWL0a is sandwiched by the terrace portions TSGS and TWL1 in the Y direction, and is separated from the members SLTo and SLTe.

Note that, a step structure of the stacked interconnect structure in a YZ cross section including the terrace portions TWL2 and TWL4, and the first portion TWL3a, a step structure of the stacked interconnect structure in the YZ cross section including the terrace portions TWL5 and TWL7, and the first portion TWL6a, and a step structure of the stacked interconnect structure in the YZ cross section including the terrace portions TWL8 and TWL10, and the first portion TWL9a have structures similar to the step structure shown in FIG. 10, except for each having a different height.

Figure 11:
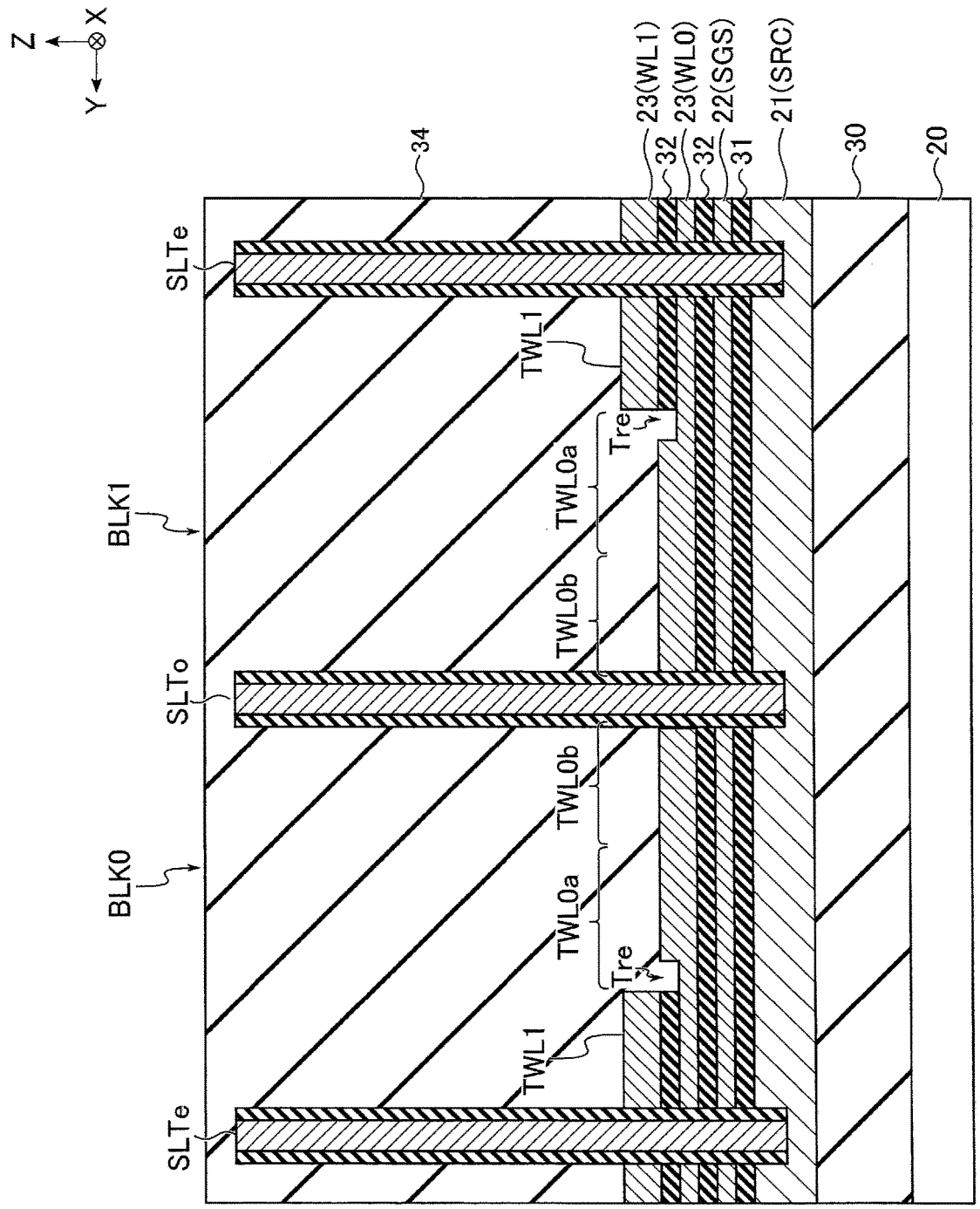
FIG. 11 is a cross-sectional view taken along a XI-XI line in FIG. 7, showing an example of a cross-sectional structure in the drawer area of the memory cell array provided in the semiconductor memory device of the embodiment.

The cross-sectional structure in the YZ plane in the drawer area HA of the memory cell array 10 will be further described by using FIG. 11. FIG. 11 is a cross-sectional view taken along a XI-XI line in FIG. 7, showing an example of the cross-sectional structure in the drawer area of the memory cell array provided in the semiconductor memory device of the embodiment.

Along the XI-XI line in FIG. 7, the stacked interconnect structure has a step structure including the terrace portion TWL1, the first portion TWL0a, and the second portion TWL0b.

In the above-described step structure, the first portion TWL0a includes the second conductor portion and the trench portion Tre. The terrace portion TWL1 and the second portion TWL0b include the second conductor portion.

The second portion TWL0b of the terrace portion TWL0 contacts the member SLTo.

Note that, a step structure of the stacked interconnect structure in the YZ cross section including the terrace portion TWL4, the first portion TWL3a, and the second portion TWL3b, a step structure of the stacked interconnect structure in the YZ cross section including the terrace portion TWL7, the first portion TWL6a, and the second portion TWL6b, a step structure of the stacked interconnect structure in the YZ cross section including the terrace portion TWL10, the first portion TWL9a, and the second portion TWL9b have structures similar to the step structure shown in FIG. 11, except for each having a different height.

1.2 Manufacturing Method of Semiconductor Memory Device

Figure 12:
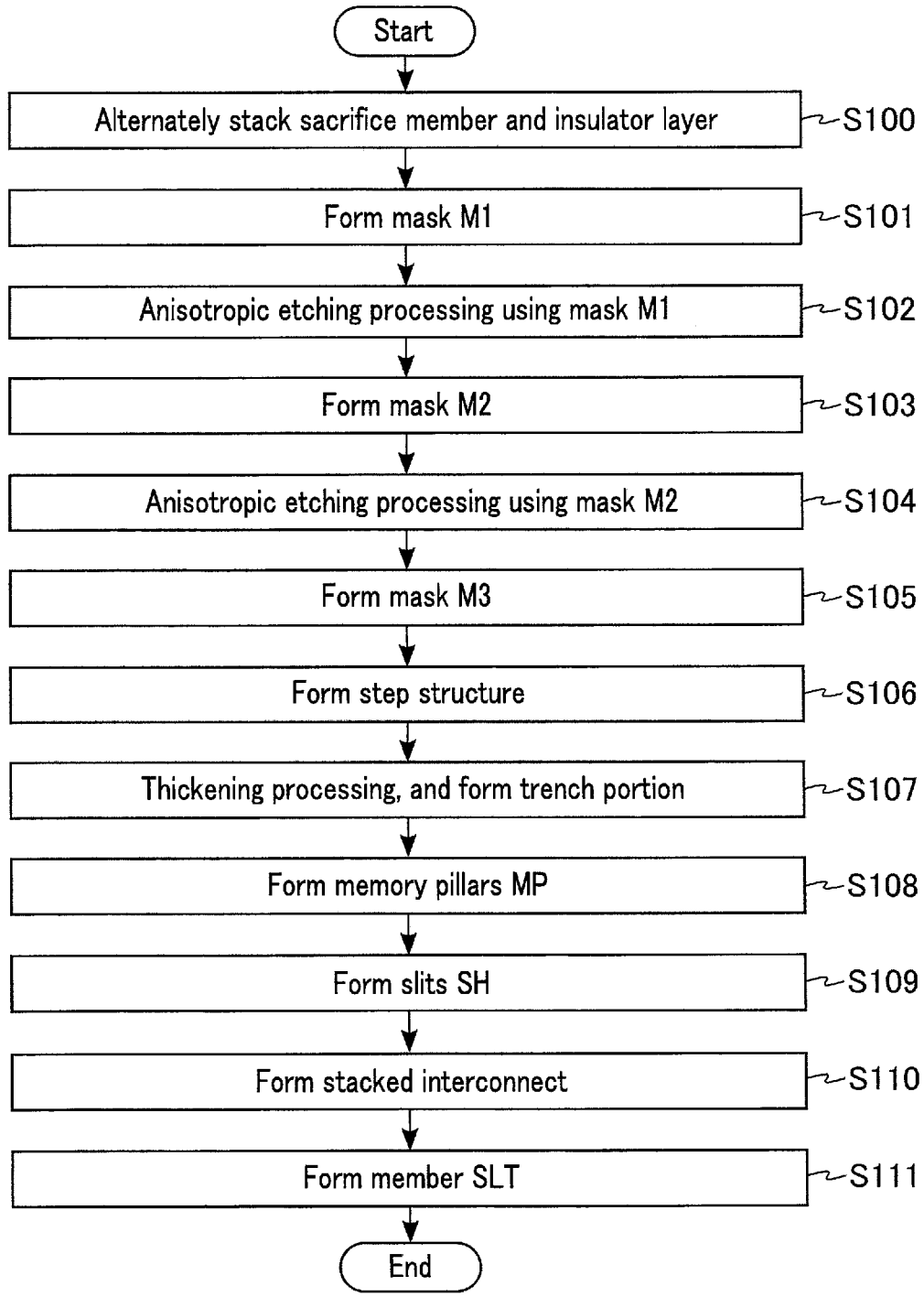
FIG. 12 is a flowchart showing an example of a manufacturing method of the semiconductor memory device of the embodiment.
Figure 27:
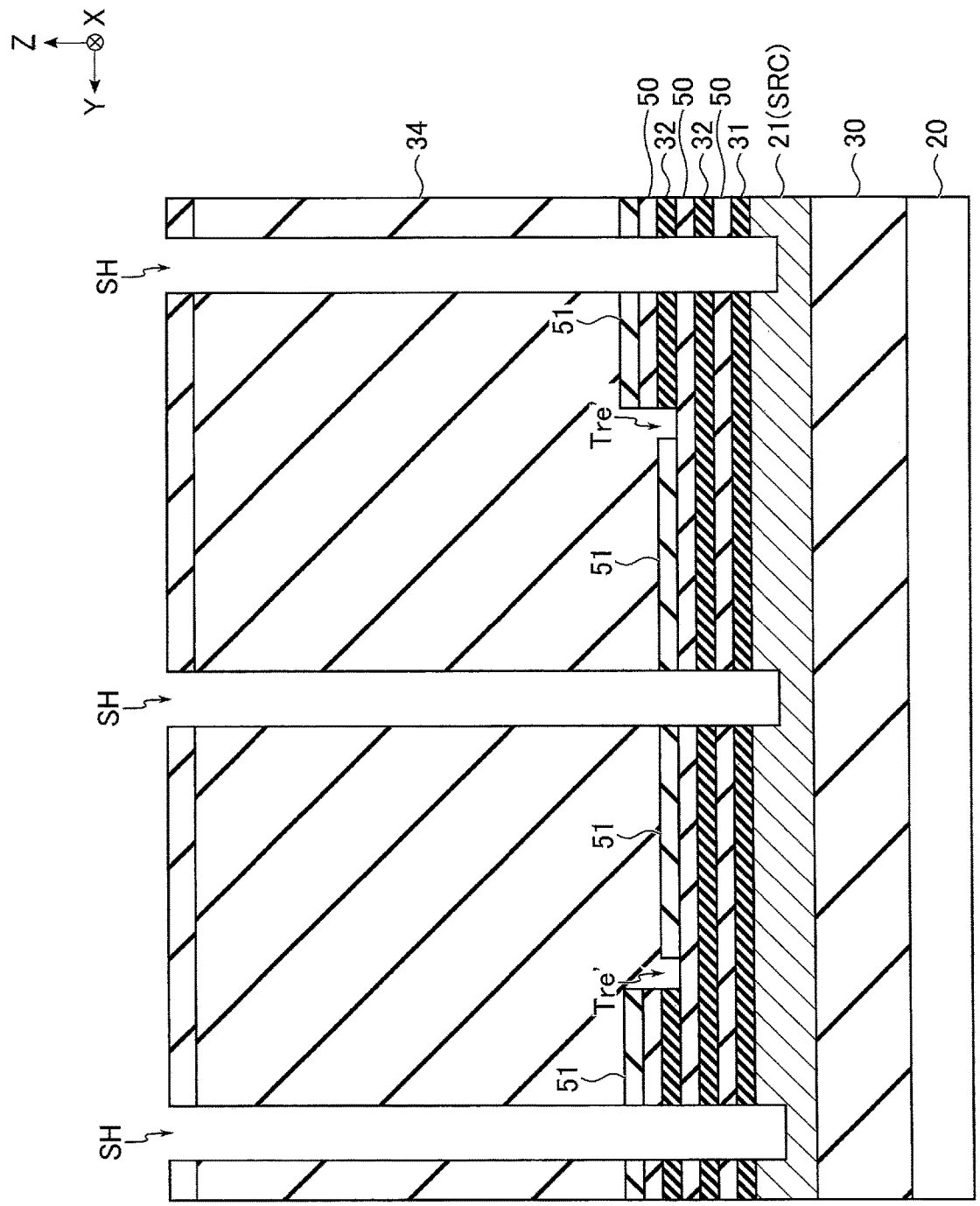
FIG. 27 is a cross-sectional view for describing an example of the manufacturing method of the memory cell array provided in the semiconductor memory device of the embodiment.

A manufacturing method of the semiconductor memory device 1 will be described by using FIG. 12 to FIG. 29. FIG. 12 is a flowchart showing an example of the manufacturing method of the semiconductor memory device of the embodiment. FIGS. 13 to 29 are plan views or cross-sectional views showing an example of the structure in the middle of manufacturing of the memory cell array 10 provided in the semiconductor memory device 1 of the embodiment. The plan views shown in FIG. 14, FIG. 15, FIG. 18, FIG. 21, FIG. 23, and FIG. 25 show areas corresponding to FIG. 7. The cross-sectional views shown in FIG. 13, FIG. 16, FIG. 19, FIG. 22, and FIG. 24 show areas corresponding to FIG. 8. The cross-sectional views shown in FIG. 17, FIG. 20, FIG. 26, and FIG. 28 show areas corresponding to FIG. 10. The cross-sectional views shown in FIG. 27 and FIG. 29 show areas corresponding to FIG. 11.

Hereinafter, referring to FIG. 12 as appropriate, an example of the manufacturing process of the semiconductor memory device 1 will be described. As shown in FIG. 12, in the manufacturing process of the semiconductor memory device 1, steps S100 to S111 are sequentially performed.

First, a sacrifice member and an insulator layer are alternately stacked (S100).

Figure 13:
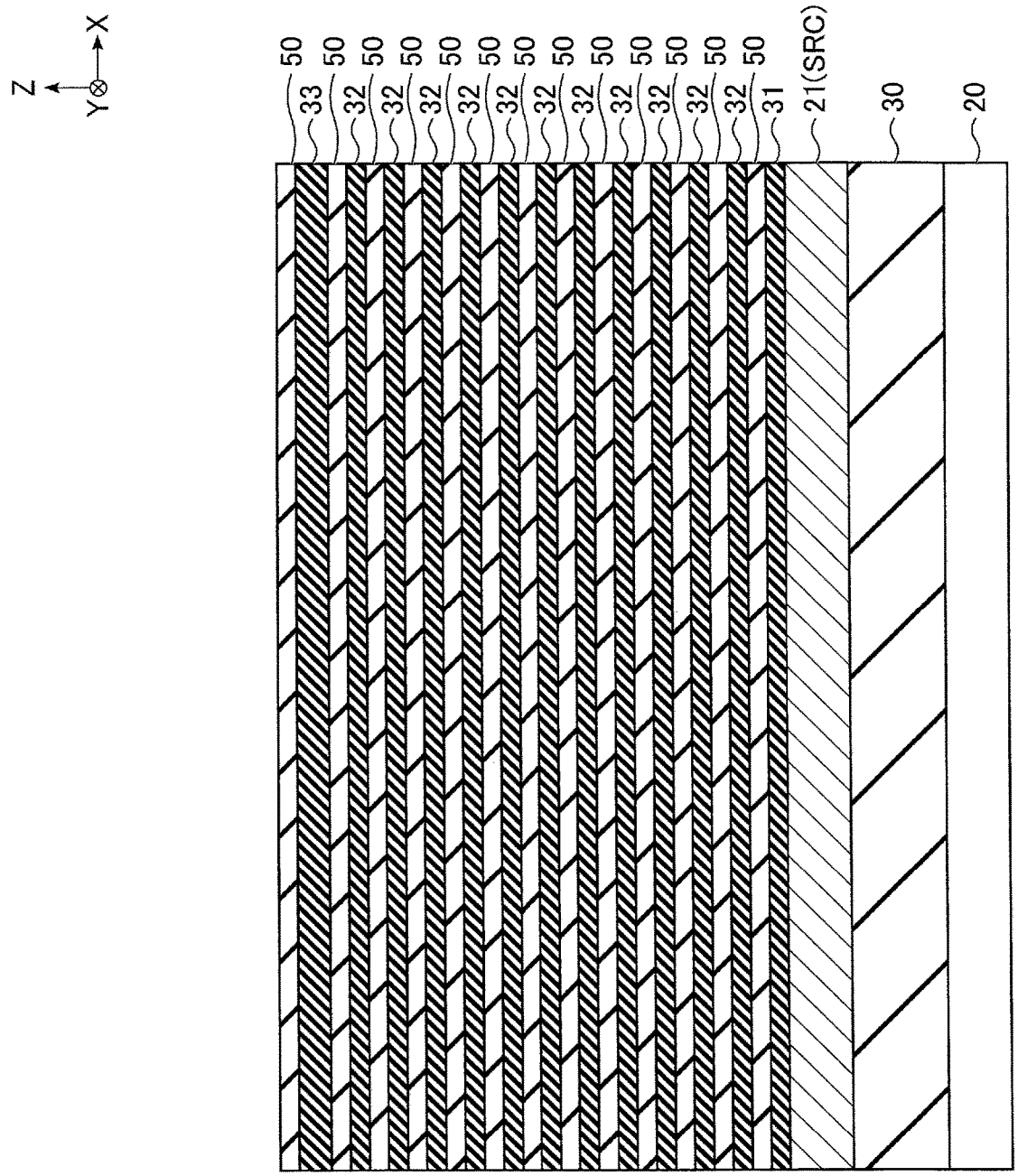
FIG. 13 is a cross-sectional view for describing an example of the manufacturing method of the memory cell array provided in the semiconductor memory device of the embodiment.

More specifically, as shown in FIG. 13, the insulator layer 30 including the circuit (not shown) corresponding to the row decoder module 15, etc. is formed on the semiconductor substrate 20. The conductive layer 21 and the insulator layer 31 are sequentially formed on the insulator layer 30. Eleven sacrifice members 50 and eleven insulator layers 32 are formed on the insulator layer 31 in an order of the sacrifice member 50, the insulator layer 32, the sacrifice member 50, . . . , the sacrifice member 50, and the insulator layer 32. Two sacrifice members 50 and one insulator layer 33 are stacked on the topmost insulator layer 32 in an order of the sacrifice member 50, the insulator layer 33, and the sacrifice member 50. Note that, the plurality of sacrifice members 50 shown in FIG. 13 are associated with the select gate line SGS, the word lines WL0 to WL10, or the select gate line SGD. Note that, in the following description, a structure including the sacrifice members 50 and the insulator layers 31 to 33 that are alternately stacked is merely called the stacked structure.

Figure 14:
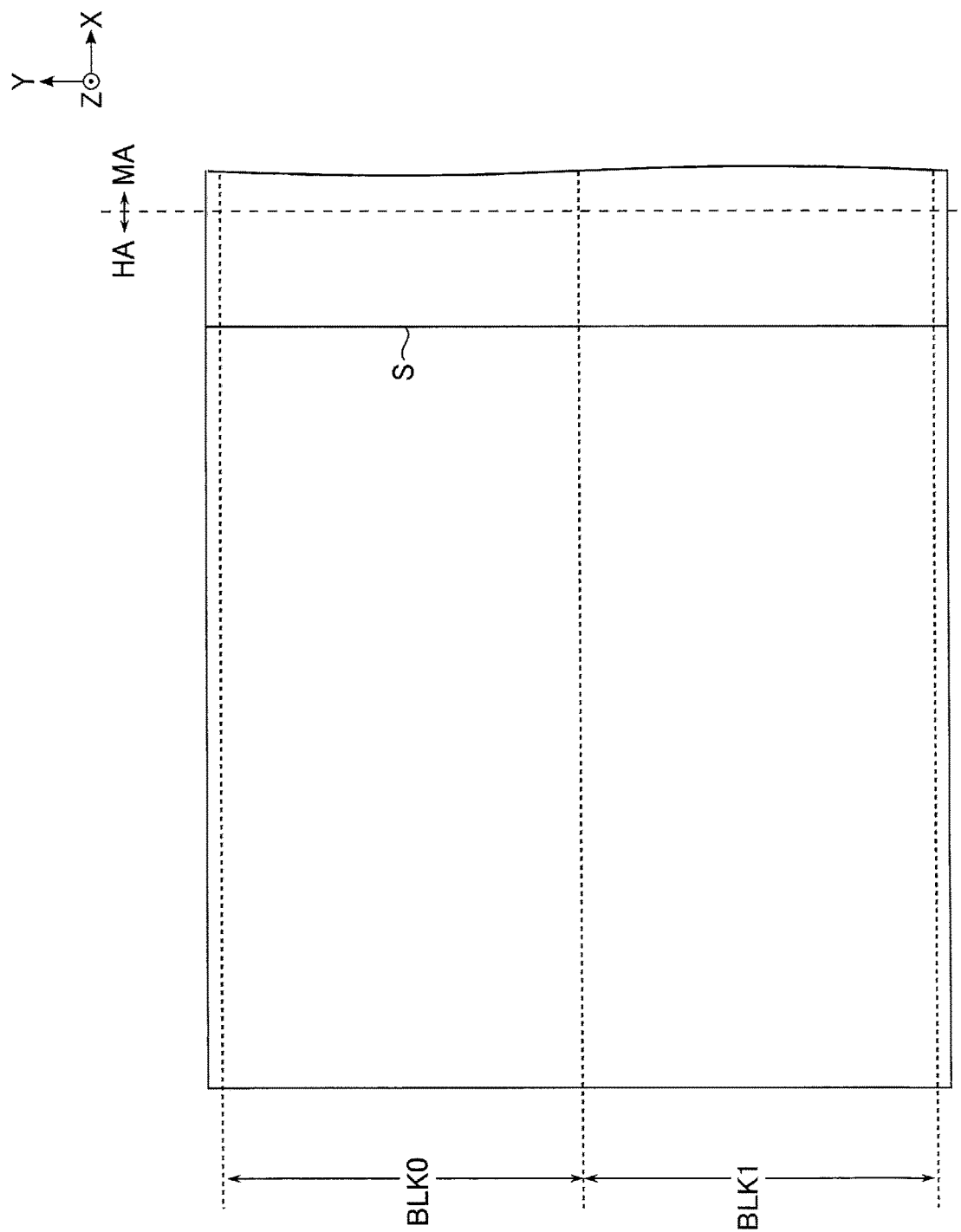
FIG. 14 is a plan view for describing an example of the manufacturing method of the memory cell array provided in the semiconductor memory device of the embodiment.

Then, in the drawer area HA, a portion of one sacrifice member 50 and the insulator layer 33 of the stacked structure stacked as described above are removed. Accordingly, as shown in FIG. 14, a step S of at least one sacrifice member 50 is formed in the vicinity of the boundary between the drawer area HA and the memory area MA.

Figure 15:
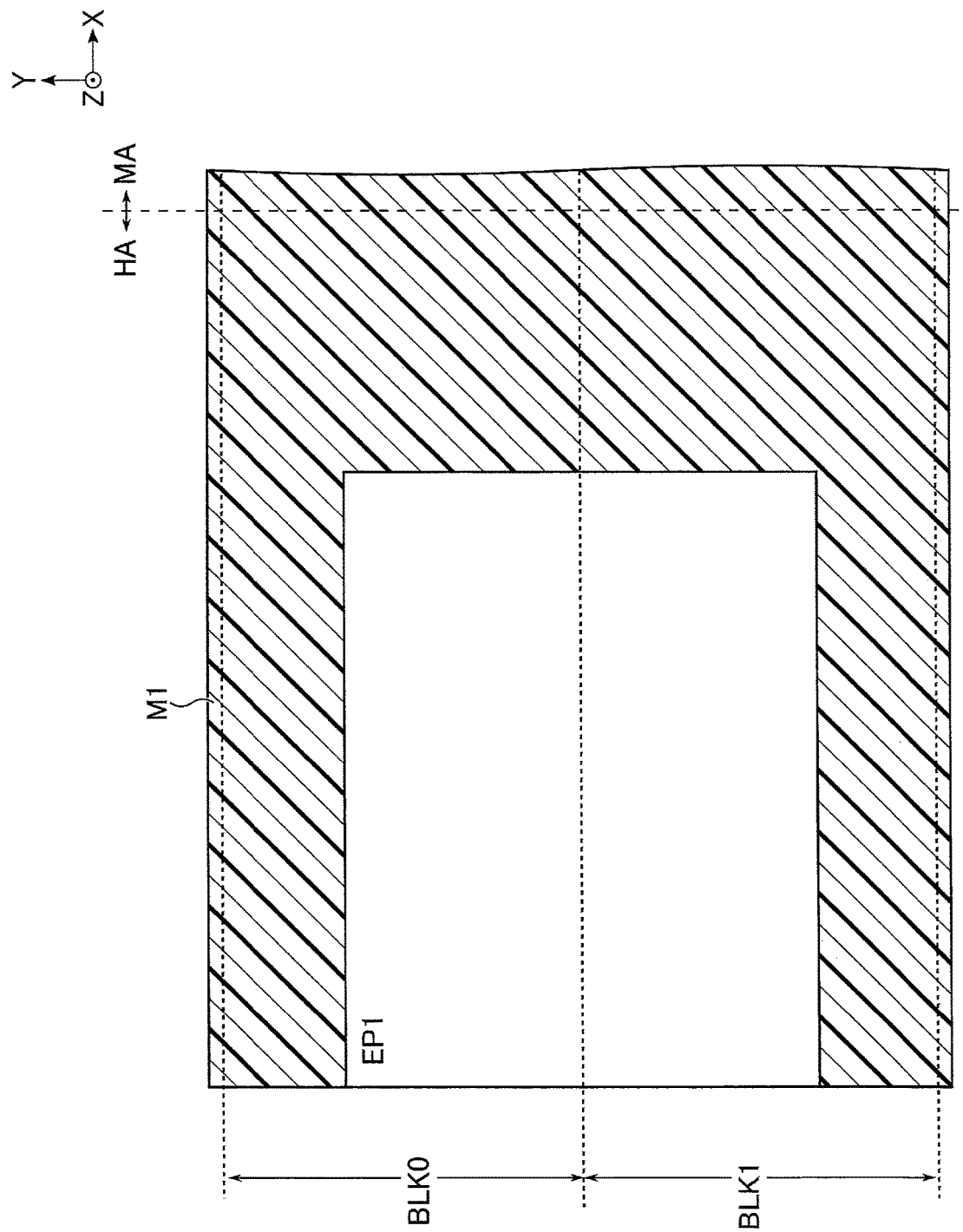
FIG. 15 is a plan view for describing an example of the manufacturing method of the memory cell array provided in the semiconductor memory device of the embodiment.

Then, as shown in FIG. 15, a mask M1 is formed (S101). The mask M1 includes an etching portion EP1. The etching portion EP1 is formed by, for example, lithography processing. The etching portion EP1 includes an area where the terrace portions TSGS, TWL0, TWL2, TWL3, TWL5, TWL6, TWL8, and TWL9 of each of the blocks BLK0 and BLK1 are to be formed.

Thereafter, anisotropic etching processing using the mask M1 is performed (S102).

Figure 16:
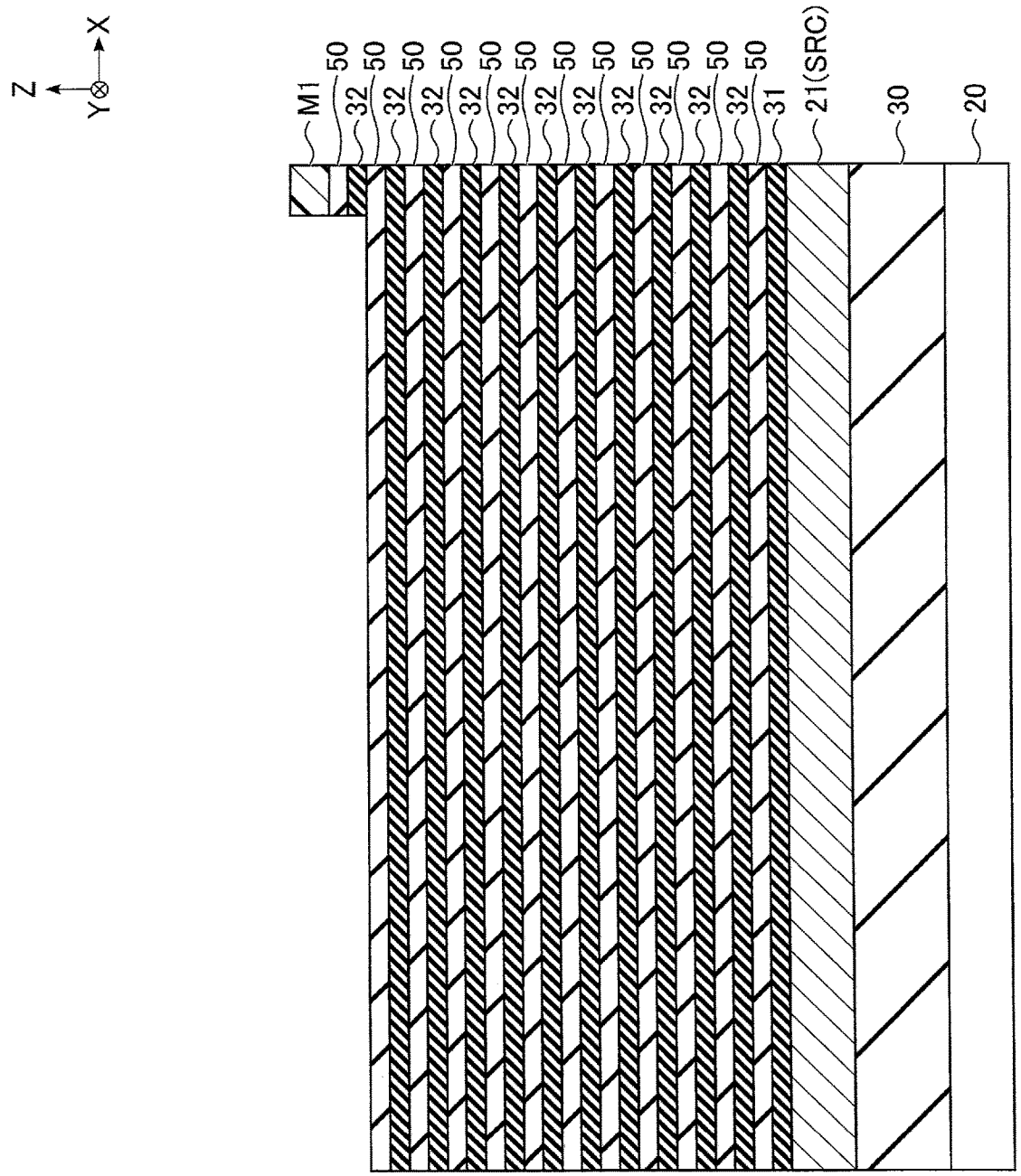
FIG. 16 is a cross-sectional view for describing an example of the manufacturing method of the memory cell array provided in the semiconductor memory device of the embodiment.
Figure 17:
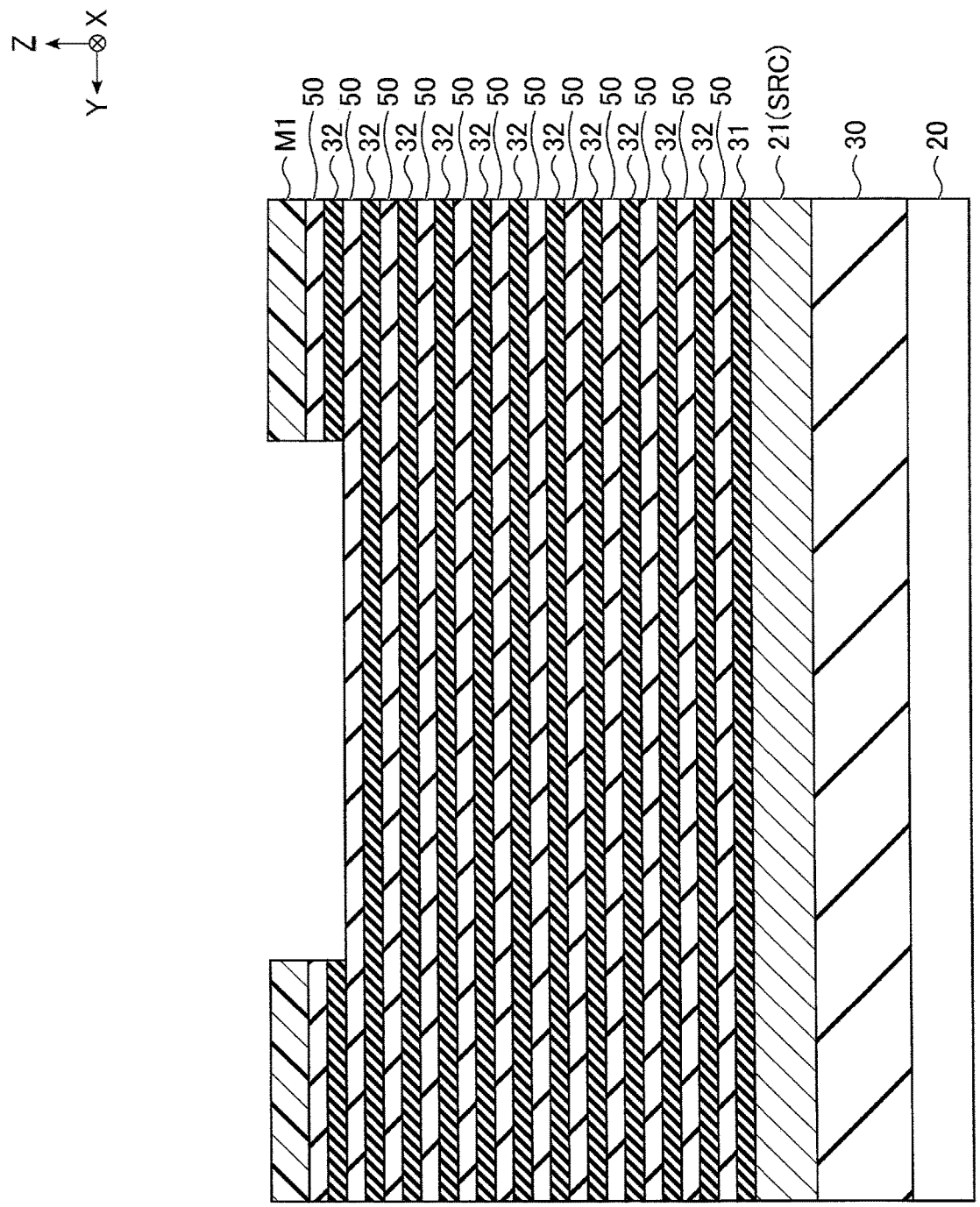
FIG. 17 is a cross-sectional view for describing an example of the manufacturing method of the memory cell array provided in the semiconductor memory device of the embodiment.

More specifically, in the etching portion EP1, one sacrifice member 50 and one insulator layer 32 are removed by the anisotropic etching processing using the mask M1. Accordingly, as shown in FIG. 16 and FIG. 17, a step of the one sacrifice member 50 is formed. After the processing in S102 is completed, the mask M1 is removed.

Figure 18:
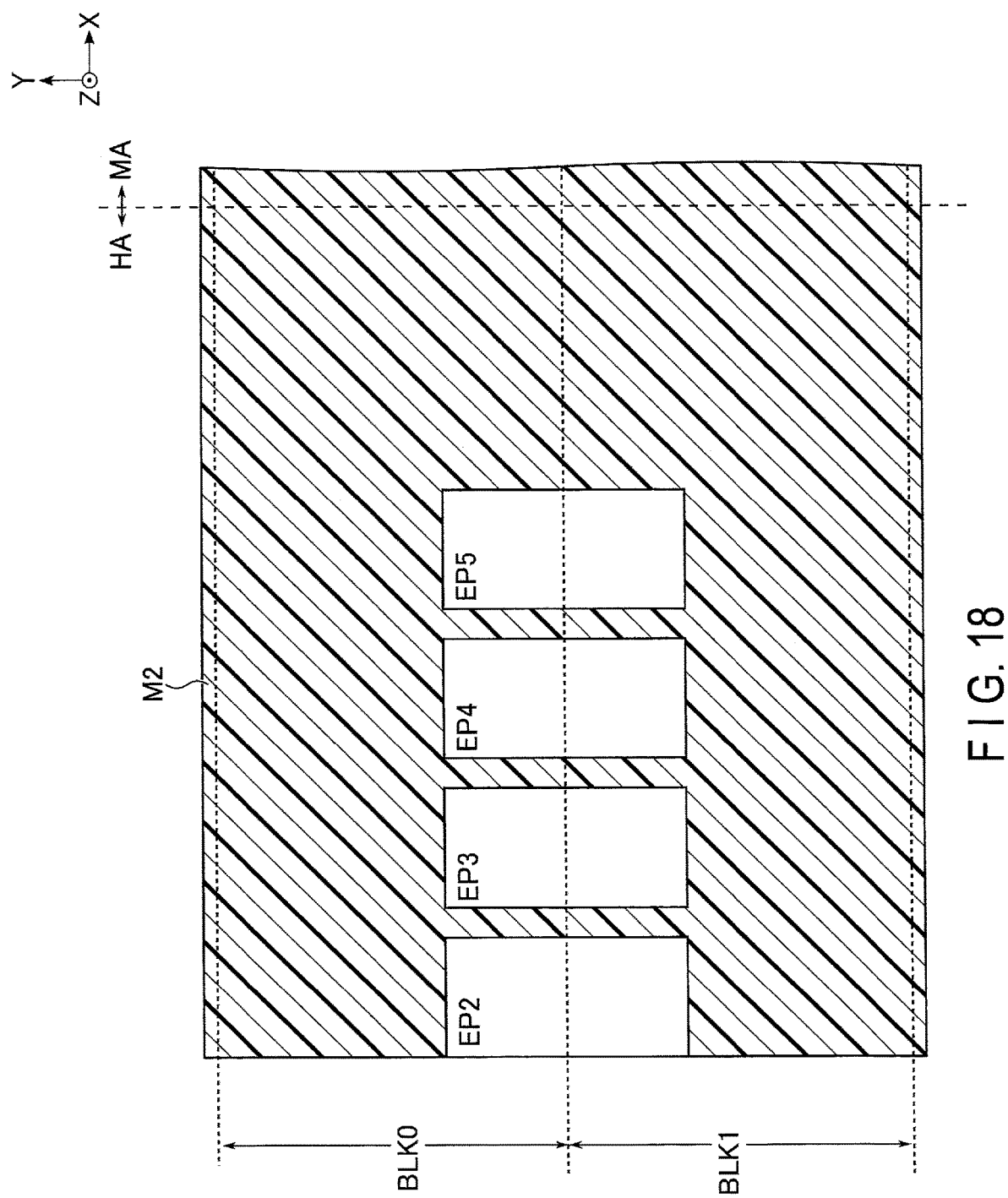
FIG. 18 is a plan view for describing an example of the manufacturing method of the memory cell array provided in the semiconductor memory device of the embodiment.

Next, as shown in FIG. 18, a mask M2 is formed (S103). The mask M2 includes etching portions EP2, EP3, EP4, and EP5. The etching portions EP2, EP3, EP4, and EP5 are formed by, for example, lithography processing. The etching portion EP2 includes an area where the terrace portion TSGS of each of the blocks BLK0 and BLK1 is formed. The etching portion EP3 includes an area where the terrace portion TWL2 of each of the blocks BLK0 and BLK1 is formed. The etching portion EP4 includes an area where the terrace portion TWL5 of each of the blocks BLK0 and BLK1 is formed. The etching portion EP5 includes an area where the terrace portion TWL8 of each of the blocks BLK0 and BLK1 is formed.

Then, anisotropic etching processing using the mask M2 is performed (S104).

Figure 19:
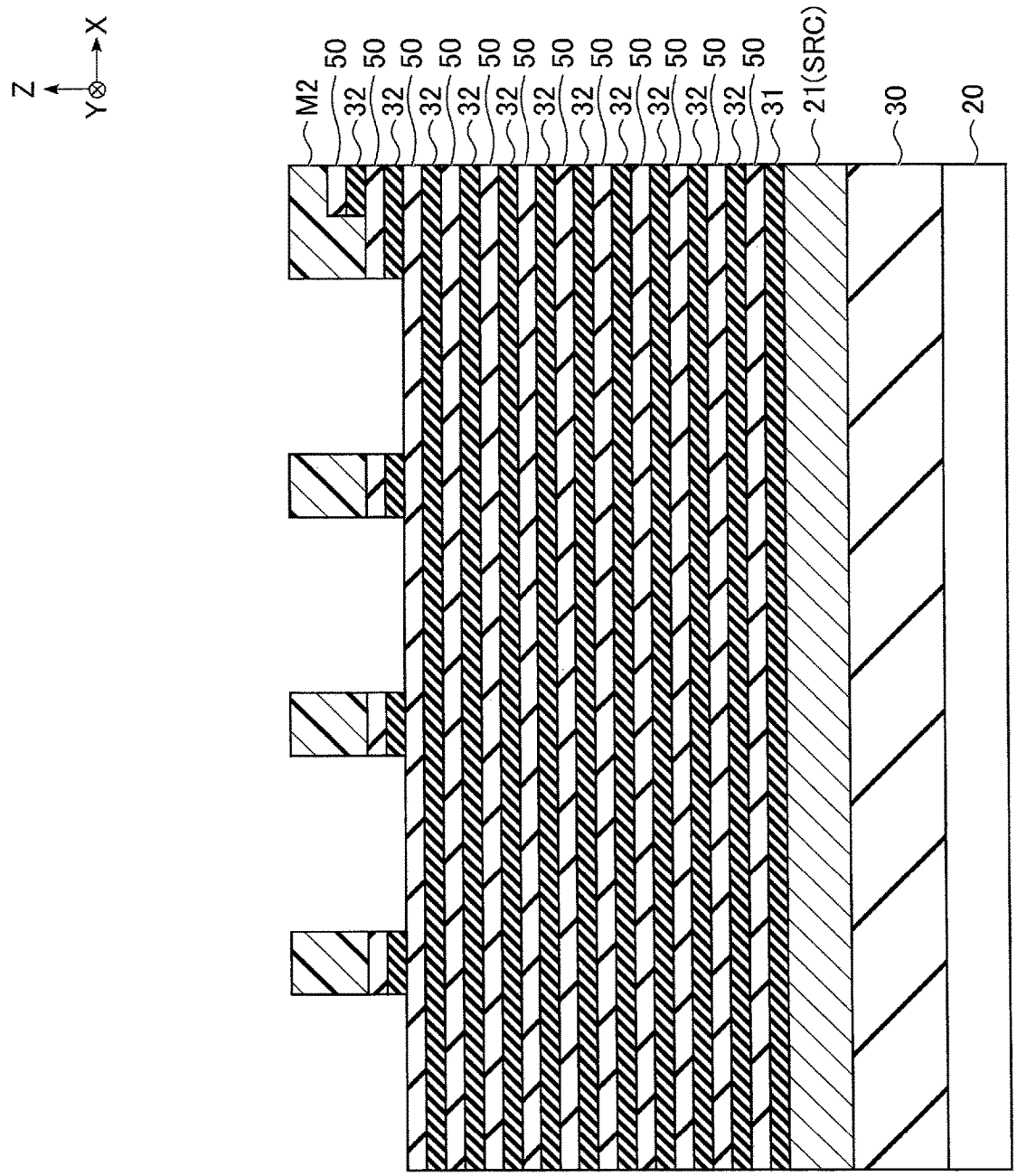
FIG. 19 is a cross-sectional view for describing an example of the manufacturing method of the memory cell array provided in the semiconductor memory device of the embodiment.
Figure 20:
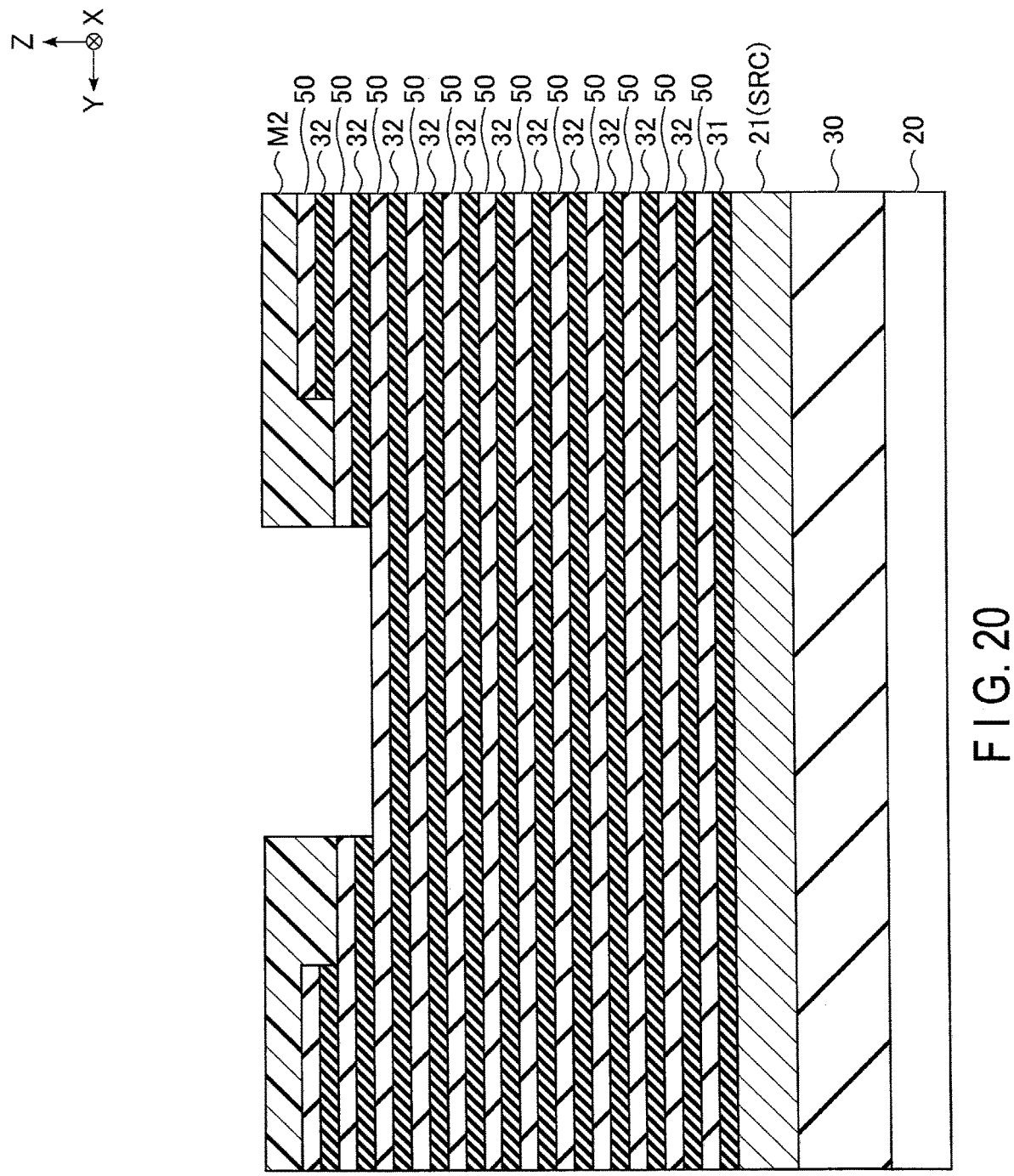
FIG. 20 is a cross-sectional view for describing an example of the manufacturing method of the memory cell array provided in the semiconductor memory device of the embodiment.

More specifically, in etching portions EP2, EP3, EP4, and EP5, one sacrifice member 50 and one insulator layer 32 are removed by the anisotropic etching processing using the mask M2. Accordingly, as shown in FIG. 19 and FIG. 20, a step of two sacrifice members 50 is formed. After the processing in S104 is completed, the mask M2 is removed.

Figure 21:
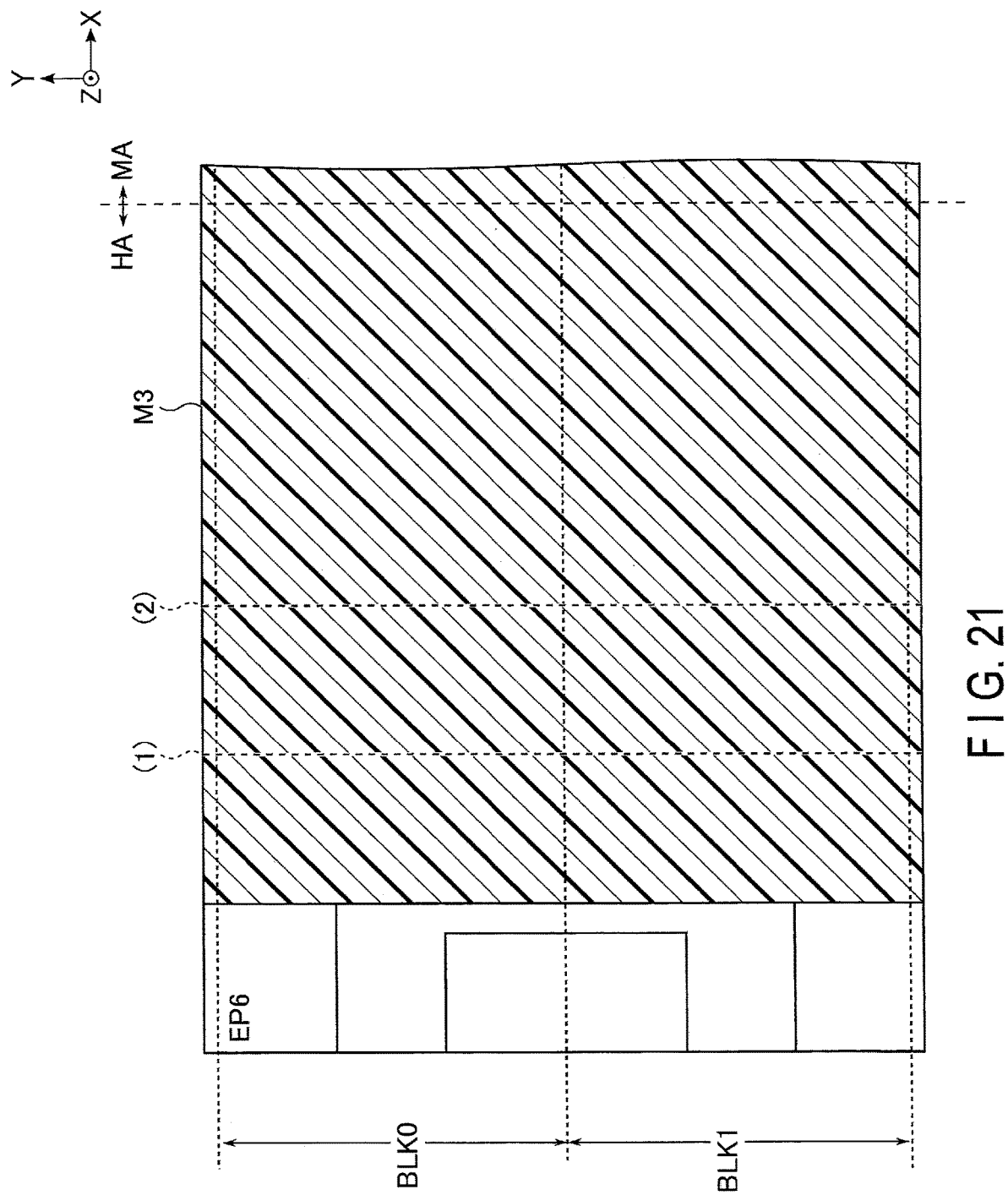
FIG. 21 is a plan view for describing an example of the manufacturing method of the memory cell array provided in the semiconductor memory device of the embodiment.

Thereafter, as shown in FIG. 21, a mask M3 is formed (S105). The mask M3 includes an etching portion EP6. The etching portion EP6 is formed by, for example, lithography processing. The etching portion EP6 includes an area where the terrace portions TSGS, TWL0, and TWL1 of each of the blocks BLK0 and BLK1 are to be formed.

Next, a step structure of the stacked structure along the X direction is formed by repeating anisotropic etching processing and isotropic etching processing (slimming processing) (S106).

More specifically, anisotropic etching processing using the mask M3 is performed, and three sacrifice members 50 are removed. Then, isotropic etching processing of the mask M3 is performed. Accordingly, the etching portion EP6 is isotropically enlarged to a portion indicated by a dotted line (1) in FIG. 21. The etching portion EP6 that is enlarged to the portion indicated by the dotted line (1) includes an area where the terrace portions TSGS, and TWL0 to TWL4 of each of the blocks BLK0 and BLK1 are to be formed. Thereafter, the anisotropic etching processing using the mask M3 is performed. Accordingly, three sacrifice members 50 are removed in the etching portion EP6 that is enlarged to the portion indicated by the dotted line (1). Then, the isotropic etching processing of the mask M3 is performed. Accordingly, the etching portion EP6 is isotropically enlarged to a portion indicated by a dotted line (2) in FIG. 21. The etching portion EP6 that is enlarged to the portion indicated by the dotted line (2) includes an area where the terrace portions TSGS, and TWL0 to TWL7 of each of the blocks BLK0 and BLK1 are to be formed. Thereafter, the anisotropic etching processing using the mask M3 is performed. Accordingly, three sacrifice members 50 are removed in the etching portion EP6 that is enlarged to the portion indicated by the dotted line (2).

Figure 22:
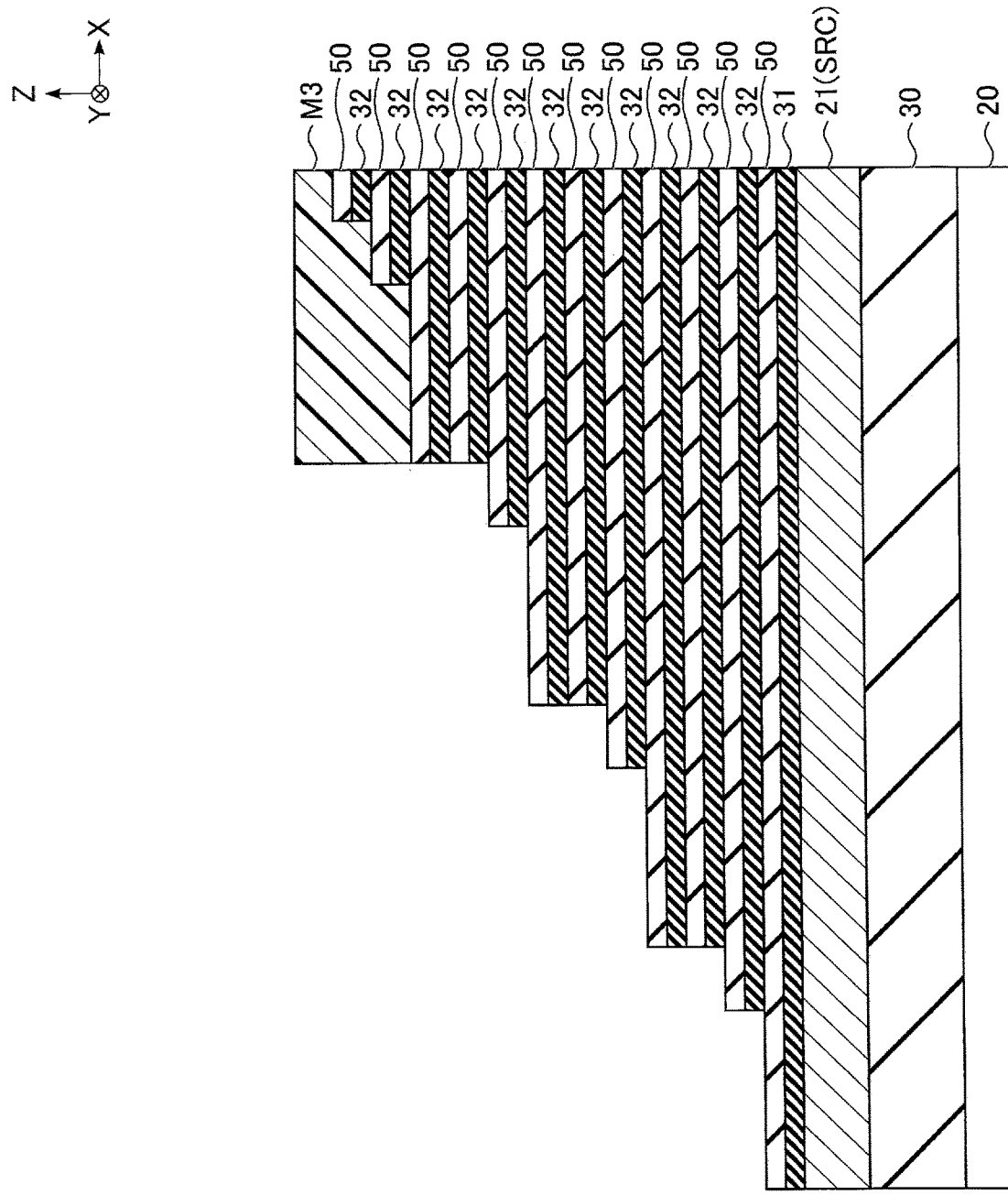
FIG. 22 is a cross-sectional view for describing an example of the manufacturing method of the memory cell array provided in the semiconductor memory device of the embodiment.

By the processing in S106, as shown in FIG. 22, a step structure of the stacked structure is formed. After the processing in S106 is completed, the mask M3 is removed.

Then, thickening processing of a sacrifice member and formation of the trench portion Tre are performed (S107).

Figure 23:
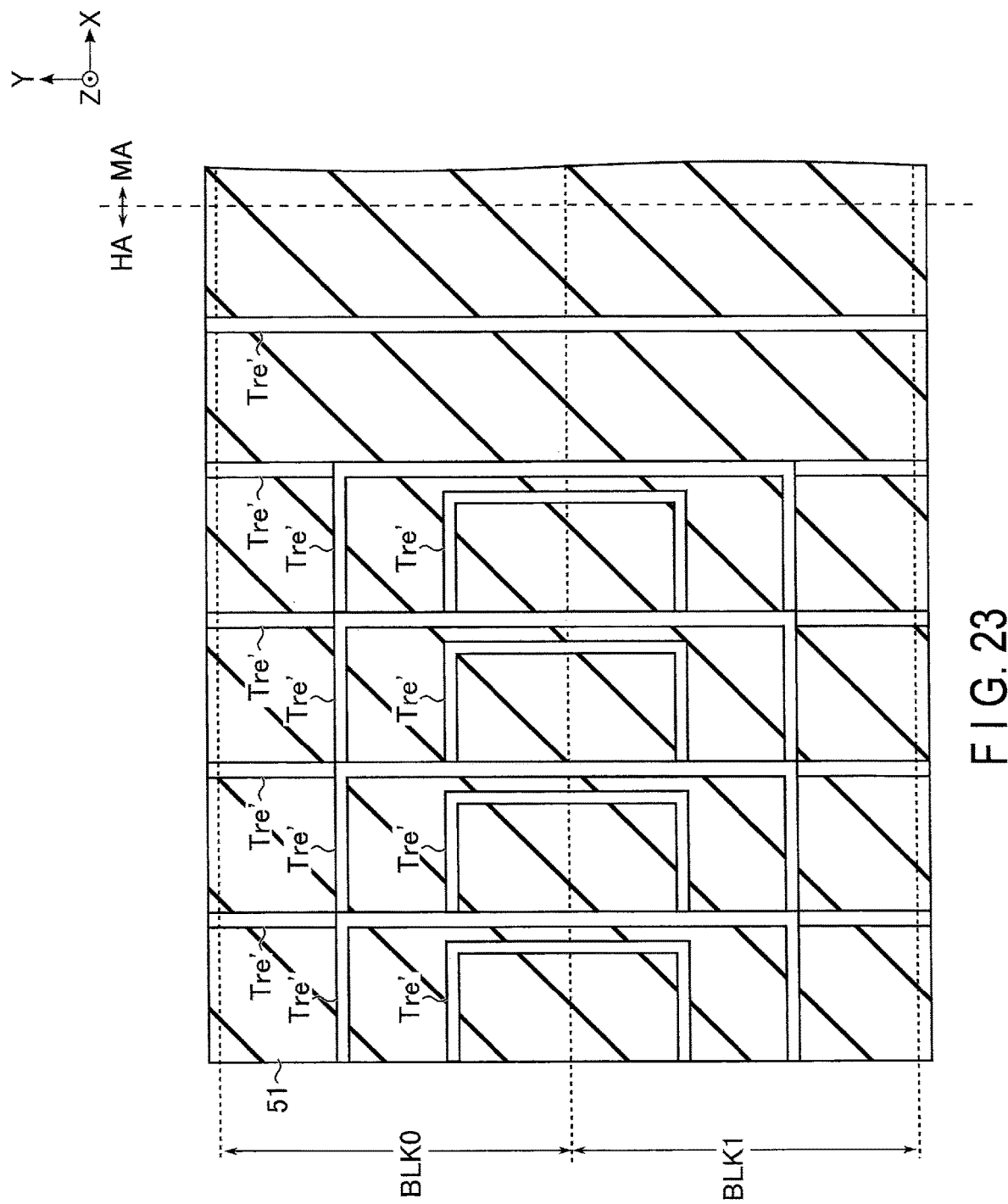
FIG. 23 is a plan view for describing an example of the manufacturing method of the memory cell array provided in the semiconductor memory device of the embodiment.
Figure 24:
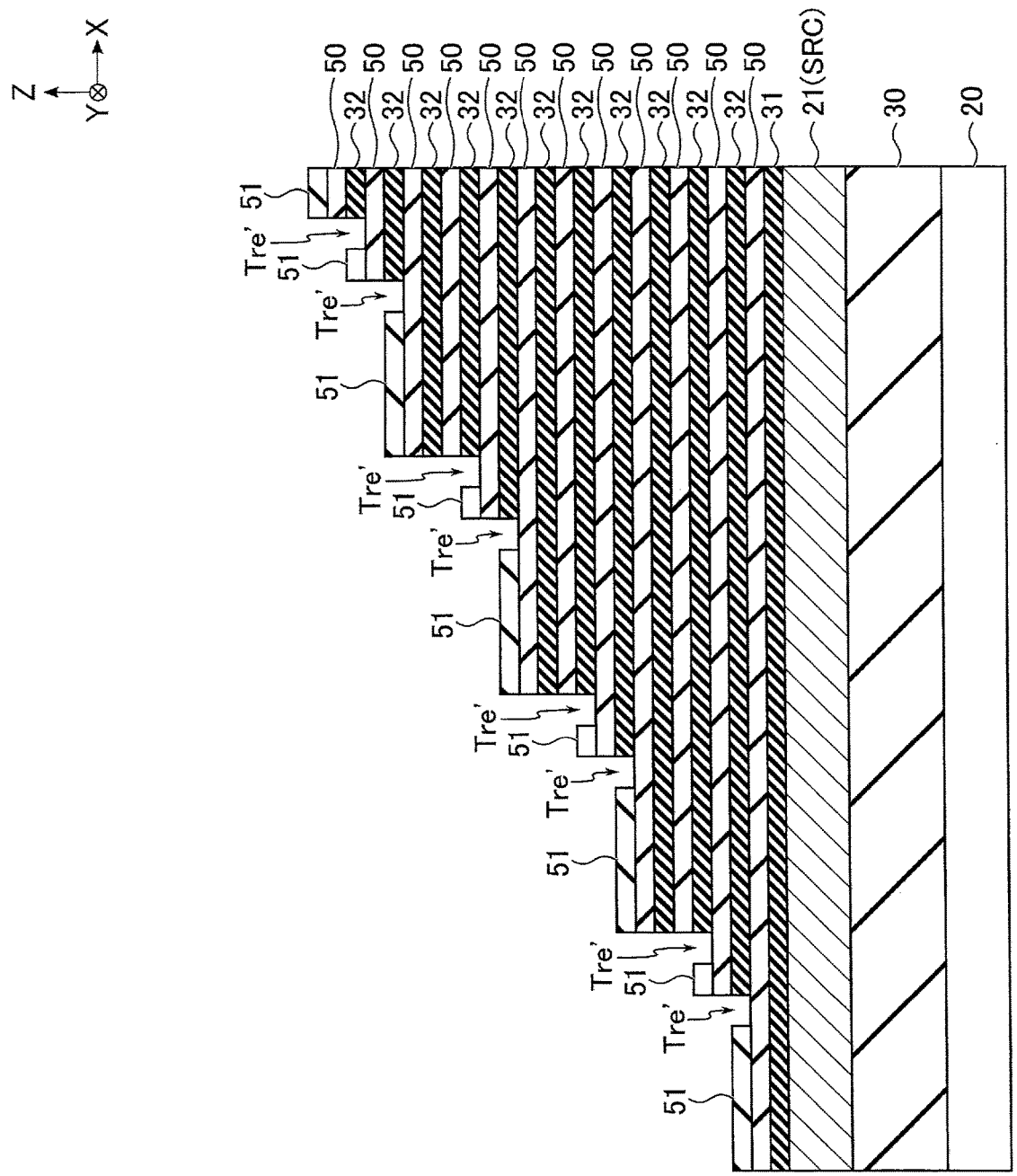
FIG. 24 is a cross-sectional view for describing an example of the manufacturing method of the memory cell array provided in the semiconductor memory device of the embodiment.

More specifically, in the step structure of the stacked structure, a sacrifice member is provided so as to cover an upper surface of each terrace and side surfaces of each step. The sacrifice member is formed by, for example, ALD (Atomic Layer Deposition). Then, the sacrifice member covering the side surfaces of each step is selectively removed. This selective removal is performed by, for example, wet etching using hydrofluoric acid. In the wet etching using hydrofluoric acid, the sacrifice member covering the side surfaces of each step is more easily removed than the sacrifice member provided on the upper surface of each terrace. Accordingly, the sacrifice member covering the side surfaces of each step can be selectively removed. By the step of S107, as shown in FIG. 23 and FIG. 24, a plurality of sacrifice members 51 are formed. Areas where the plurality of sacrifice members 51 are formed include a portion where the terrace portion T is to be formed. Additionally, trench portions Tre' for detaching each layer of the plurality of sacrifice members 51 are formed by the above-described wet etching using hydrofluoric acid. The trench portion Tre' is, for example, a part of each sacrifice member 50 corresponding to the trench portion Tre.

Note that, the removal of the sacrifice members 51, and the formation of the trench portions Tre' in step S107 may be realized by dry etching. Specifically, for example, after providing a mask in an area except for the portion where the trench portion Tre is to be formed of the sacrifice members 51, anisotropic etching for the sacrifice member 51 may be performed. Accordingly, the sacrifice member 51 covering the side surfaces of each step of the step structure can be selectively removed.

Next, the insulator layer 34 is formed on the terrace portions of the plurality of sacrifice members 51.

More specifically, the stacked structure after the trench portions Tre' are formed is embedded in the insulator layer 34. Then, an upper surface of the insulator layer 34 is flattened by, for example, CMP (Chemical Mechanical Polishing). The insulator layer 34 is formed by, for example, CVD (Chemical Vapor Deposition).

Thereafter, the memory pillars MP are formed in the memory area MA (S108).

Figure 25:
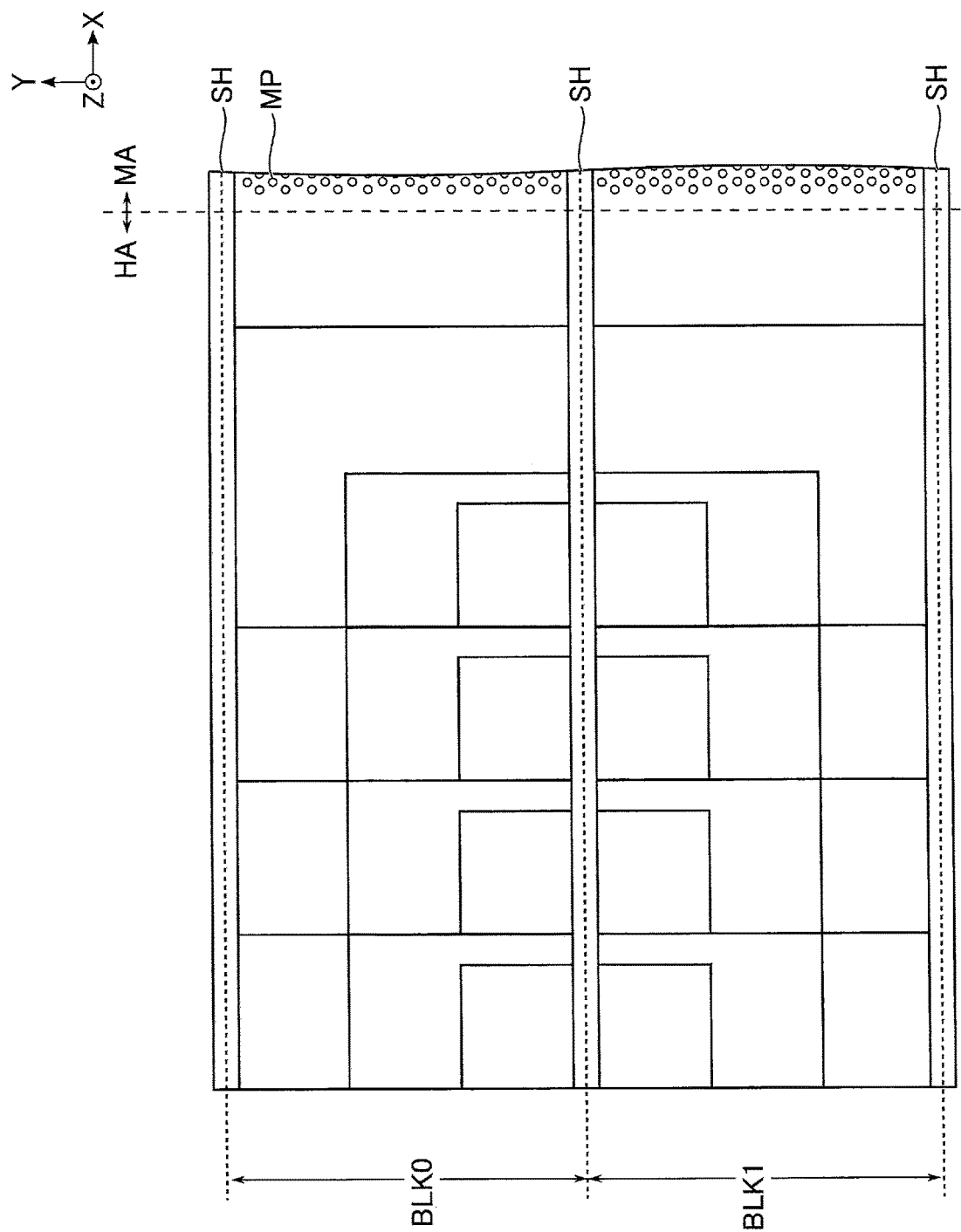
FIG. 25 is a plan view for describing an example of the manufacturing method of the memory cell array provided in the semiconductor memory device of the embodiment.

Then, as shown in FIG. 25 to FIG. 27, a plurality of slits SH are formed (S109).

Specifically, a mask in which areas corresponding to the members SLT are opened is formed by photolithography, etc. Thereafter, the slits SH that divide, for example, the insulator layers 31, 33, and 34, the plurality of insulator layers 32, and the plurality of sacrifice members 50 and the sacrifice member 51 are formed by anisotropic etching using the mask.

Figure 28:
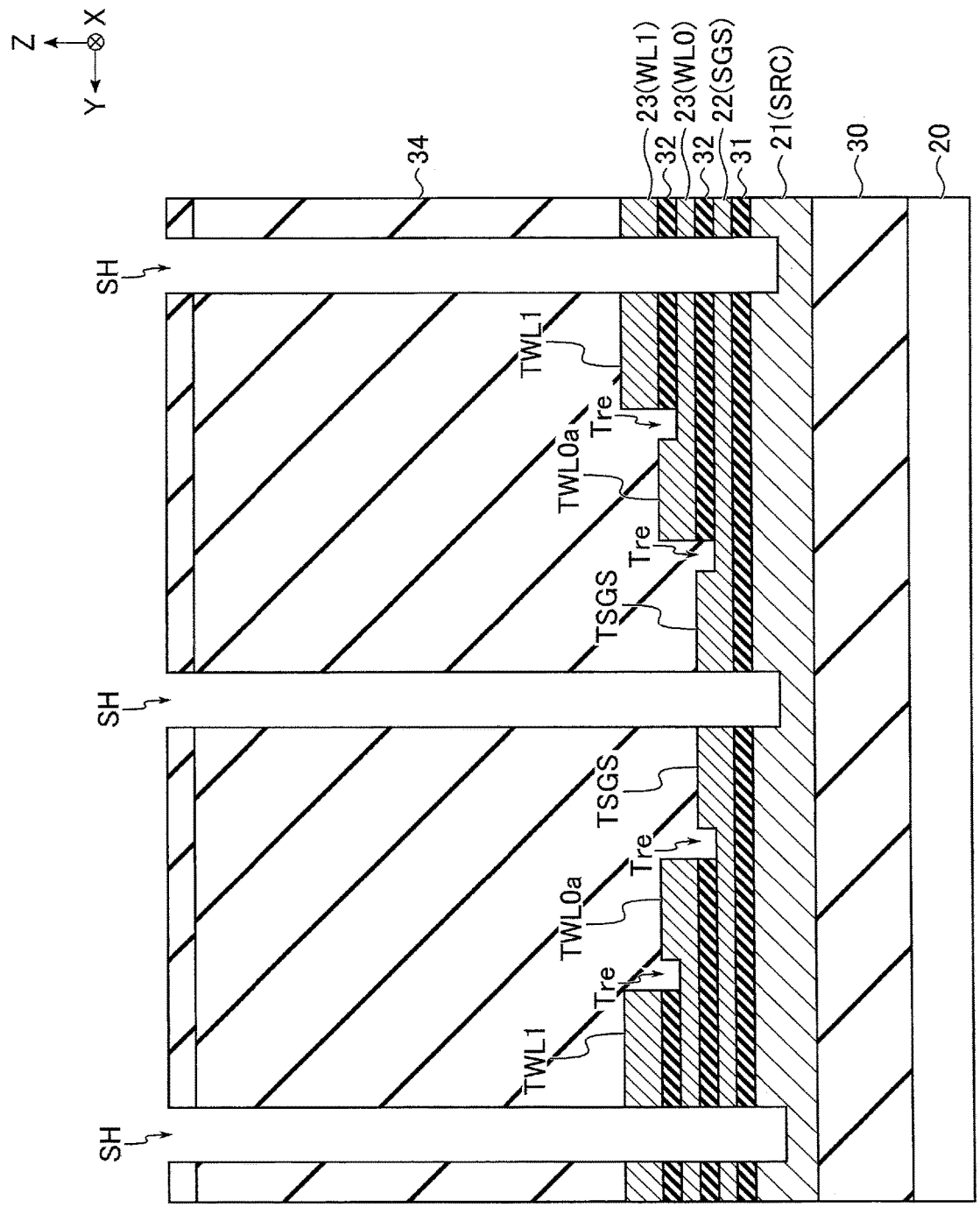
FIG. 28 is a cross-sectional view for describing an example of the manufacturing method of the memory cell array provided in the semiconductor memory device of the embodiment.
Figure 29:
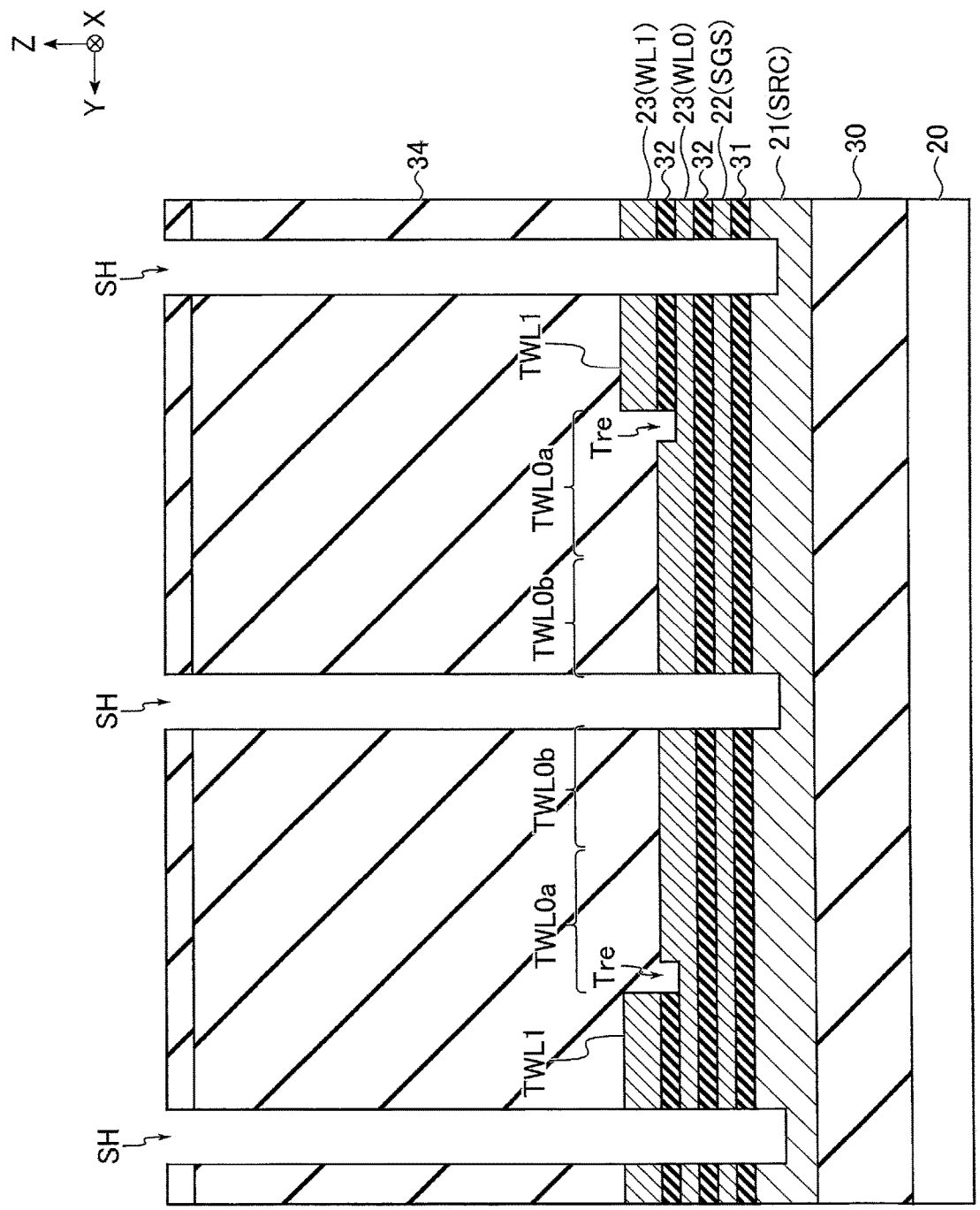
FIG. 29 is a cross-sectional view for describing an example of the manufacturing method of the memory cell array provided in the semiconductor memory device of the embodiment.

Next, substitution processing of the plurality of sacrifice members 50 and 51 is performed, and stacked interconnect is formed as shown in FIG. 28 and FIG. 29 (S110).

More specifically, first, the plurality of sacrifice members 50 and 51 are selectively removed via the slits SH by wet etching by thermal phosphoric acid, etc. Here, as shown in FIG. 26, the sacrifice member 51 corresponding to the terrace portion TSGS is exposed in the slit SH corresponding to the members SLTo. Additionally, as shown in FIG. 27, the sacrifice member 51 corresponding to the terrace portion TWL0 is exposed in the slit SH corresponding to the member SLTo. In addition, as shown in FIG. 26 and FIG. 27, the sacrifice member 51 corresponding to the terrace portion TWL1 is exposed in the slit SH corresponding to the member SLTe. The stacked structure from which the plurality of sacrifice members 50 and 51 have been removed is maintained by the plurality of remaining memory pillar MPs, supporting posts not shown, etc. Then, via the slits SH, a conductor is embedded in a space from which the plurality of sacrifice members 50 and 51 have been removed. Here, for example, in a space corresponding to the second conductor portion included in the terrace portion TWL1 of the space after the plurality of sacrifice members 50 and 51 are removed, a conductor is directly embedded via the slit SH corresponding to the member SLTe. For example, CVD is used for the formation of the conductor in this step. Additionally, the trench portion Tre included in each terrace portion T is formed by this step.

Thereafter, the conductor formed inside the slits SH is removed by etch back processing, and adjacent stacked interconnects are separated from each other. Accordingly, the conductive layer 22 that functions as the select gate line SGS, the plurality of conductive layers 23 that function as the word lines WL0 to WL10, respectively, and the conductive layer 24 that functions as the select gate line SGD are each formed.

Then, the member SLT is formed in the slit SH (S111).

Specifically, first, an insulating film (spacer SP) is formed so as to cover side surfaces and a bottom surface of the slit SH. Then, a part of the spacer SP provided in the bottom of the slit SH is removed, and a part of the conductive layer 21 is exposed in the bottom of the slit SH. Thereafter, a conductor (contact LI) is formed in the slit SH, and the conductor formed outside the slit SH is removed by, for example, CMP. After this, in an area not shown, in areas corresponding to the members SHE between the members SLT that are adjacent in the Y direction, a plurality of grooves are formed to be parallel to the members SLT. Then, the members SHE that divide the conductive layer 24 in the Y direction are formed by embedding an insulating film in each groove.

Thereafter, the plurality of contacts CC are formed.

More specifically, a mask in which areas corresponding to the contacts CC are opened is formed by photolithography, etc. Then, for example, contact holes that penetrates the insulator layer 34 formed above the terrace portion T is formed by anisotropic etching using the mask. In the bottom of each of the contact holes, the corresponding conductive layers 22 to 24 are exposed. Then, the contact holes are filled with a conductor. When the conductor formed on the upper surface of the stacked interconnect structure is removed by, for example, CMP, a surface corresponding to an upper end of each of the plurality of contacts CC is exposed.

The structure of the memory cell array 10 is formed by the above steps.

Note that the manufacturing process described above is merely an example, and the manufacturing process is not limited to this. For example, other processing may be inserted between manufacturing steps, and some steps may be omitted or integrated. Additionally, manufacturing steps may be interchanged to the extent possible. For example, the step in which the memory pillars MP are formed, and the step in which the step structure in the drawer area HA is formed may be interchanged.

1.3 Effects of Present Embodiment

According to the embodiment, it is possible to suppress an increase in the size of the drawer area HA, while preventing penetration of the contacts CC. The effects of the embodiment will be described below.

According to the embodiment, in the manufacturing process of the semiconductor memory device 1, after the step structure of the stacked structure including the plurality of sacrifice members 51 is formed, in step S110, the plurality of sacrifice members 50 and 51 are removed by wet etching via the slits SH. Then, the conductive layers 22 and 24, and the plurality of conductive layers 23 are formed by embedding the conductor in the space from which the plurality of sacrifice members 50 and 51 have been removed. In the embodiment, as shown in, for example, FIG. 26 and FIG. 27, each sacrifice member 51 is connected to the slit SH in the YZ plane. Accordingly, it is possible to provide three or more terrace portions T arranged along the Y direction in each block BLK, while making the thickness of the second conductor portion of each conductive layer thicker than that of the first conductor portion. Therefore, an increase in the size of the drawer area HA can be suppressed, while preventing penetration of the contacts CC.

Supplementarily, when the plurality of contact holes are collectively opened, due to the differences in the depths of the plurality of contacts, for example, before the contact hole corresponding to a word line for a lower layer reaches the word line for the lower layer, the contact hole corresponding to a word line for an upper layer may penetrate through the word line for the upper layer. In such a case, short circuit between the plurality of word lines via the contacts may occur. In order to suppress the occurrence of short circuit between the plurality of word lines, it is desirable to increase the thickness of the word line in the terrace portion connected to the contact.

However, for example, in each block, even when it is aimed to form three terrace portions arranged in the Y direction with increased thicknesses, the center terrace portion of the three terrace portions may not be entirely replaced with a thick conductor. More specifically, when a thick portion of the center terrace portion contacts a member that partitions a block only via a thin portion of the conductive layer, in the step of replacing the sacrifice member with the conductor, it is difficult for the sacrifice member (center sacrifice member) included in an area where the center terrace portion is to be formed to be sufficiently replaced with the conductor.

That is, in such a case, the center sacrifice member formed by the thickening processing in the manufacturing process is not directly connected to the slit. Accordingly, when embedding the conductor in the space after the sacrifice member has been removed, the space corresponding to the thick portion of the center terrace portion is indirectly replaced only via the space corresponding to the thin portion of the conductive layer. Therefore, before the embedding of the conductor in the space corresponding to the thick portion of the center terrace portion is completed, since the space corresponding to the thin portion of the conductive layer is blocked by the conductor, for example, the center terrace portion may include a void. Accordingly, contact failure of the contact may occur. On the other hand, in order to eliminate the center terrace portion separated from the members, the number of the terrace portions arranged in the Y direction may be reduced. However, when reducing the number of the terrace portions arranged in the Y direction, while the width in the Y direction of each block is not changed, the size of the drawer area may be increased, since the number of the terrace portions arranged in the X direction is increased.

Additionally, for example, when the stacked interconnect structure includes three terrace portions arranged in the Y direction, a structure may be employed that further provides a center member contacting the center terrace portion between two members that partition a block. Accordingly, in the step of replacing the sacrifice member with the conductor, the center sacrifice member is directly connected to the slit corresponding to the center member. Accordingly, even when the thickness of the terrace portion is increased, the replacement of the sacrifice member with the conductor can be sufficiently performed. However, by providing the center member, the width along the Y direction of the step structure tends to be wider. Therefore, the size of the drawer area may be increased.

According to the embodiment, for example, the terrace portion TWL0 sandwiched by the terrace portions TSGS and TWL1 along the Y direction contacts the member SLTo in the cross section shown in FIG. 11. Accordingly, in the step of replacing the sacrifice member with the conductor, as shown in FIG. 27, portions of the sacrifice member 51 and the sacrifice member 50 included in the area where the terrace portion TWL0 is to be formed may be replaced via the slits SH to which the portions of the sacrifice member 50 and the sacrifice member 51 are directly connected. Accordingly, it is possible to suppress the terrace portion TWL0 from including a portion that is not sufficiently replaced with the conductor. Therefore, an increase in the size of the drawer area HA can be suppressed, while preventing penetration of the contacts.

2. Modification

Note that various modifications are possible for the above-described embodiment.

Hereinafter, semiconductor memory devices of modifications will be described.

2.1 First Modification

In the above-described embodiment, although the case is shown where each terrace portion T is separated from each other, since each conductive layer 22 or 23 includes the trench portion Tre, it is not limited to this. For example, in a cross-sectional view of the XZ plane including the terrace portions TSGS, TWL2, TWL5, and TWL8, by detaching one conductive layer in the X direction between the second portion of the conductive layer and the portion overlapped with an upper conductive layer of the first conductor portion of the conductive layer, the terrace portion T corresponding to the conductive layer and the terrace portion T that is adjacent in the X direction may be separated from each other. In the following description, the configuration and manufacturing method of the semiconductor memory device 1 of a first modification will be described mainly about the differences from the configuration and manufacturing method of the semiconductor memory device 1 of the embodiment.

The plane layout of the semiconductor memory device 1 will be described by using FIG. 30. FIG. 30 is a plan view showing an example of the plane layout of a drawer area and its vicinity of a memory cell array provided in the semiconductor memory device of the first modification.

In the plan view, a terrace portion TSGS includes a first portion TSGSa, and a second portion TSGSb separated from the first portion TSGSa. A terrace portion TWL2 includes a first portion TWL2a, and a second portion TWL2b separated from the first portion TWL2a. A terrace portion TWL5 includes a first portion TWL5a, and a second portion TWL5b separated from the first portion TWL5a.

A second portion TWL0b is sandwiched by the first portion TSGSa and the second portion TSGSb in the X direction. A second portion TWL3b is sandwiched by the first portion TWL2a and the second portion TWL2b in the X direction. A second portion TWL6b is sandwiched by the first portion TWL5a and the second portion TWL5b in the X direction.

Figure 31:
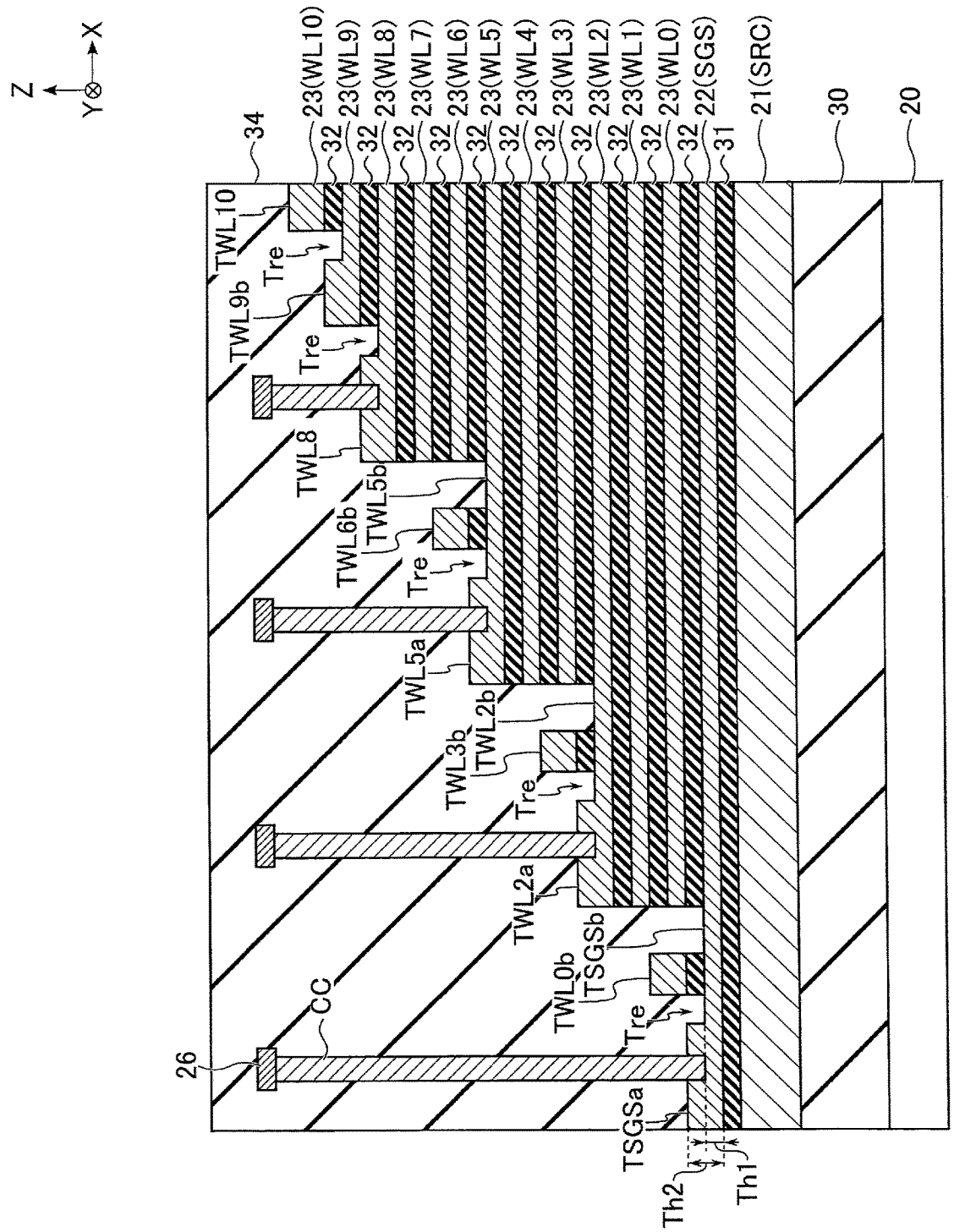
FIG. 31 is a cross-sectional view taken along a XXXI-XXXI line in FIG. 30, showing an example of a cross-sectional structure in the drawer area of the memory cell array provided in the semiconductor memory device of the first modification.

The cross-sectional structure in the XZ plane of the semiconductor memory device 1 will be described by using FIG. 31. FIG. 31 is a cross-sectional view taken along a XXXI-XXXI line in FIG. 30, showing an example of the cross-sectional structure in the drawer area of the memory cell array provided in the semiconductor memory device of the first modification.

Along the XXXI-XXXI line in FIG. 30, a stacked interconnect structure has a step structure including first portions TSGSa, TWL2a, and TWL5a, terrace portions TWL8 and TWL10, and second portions TSGSb, TWL2b, TWL5b, TWL0b, TWL3b, TWL6b, and TWL9b.

In the above-described step structure, each of the first portions TSGSa, TWL2a, and TWL5a includes a second conductor portion of a corresponding conductive layer 22 or 23, and a trench portion Tre included in a first conductor portion. Each of the second portions TSGSb, TWL2b, and TWL5b is included in the first conductor portion of the corresponding conductive layer 22 or 23.

With such a configuration, the first portion TSGSa is separated in the X direction from a side surface of the conductive layer 23 corresponding to a word line WL0. The first portion TWL2a is separated in the X direction from a side surface of the conductive layer 23 corresponding to a word line WL3. The first portion TWL5a is separated in the X direction from a side surface of the conductive layer 23 corresponding to a word line WL6.

The second portion TSGSb is provided between the second portion TWL0b and the first portion TWL2a. That is, in the second portion TSGSb, the conductive layer 23 corresponding to the word line WL0 is detached in the X direction. Accordingly, the second portion TWL0b is separated in the X direction from the conductive layers 23 corresponding to word lines WL1 and WL2, respectively, by the second portion TSGSb. The second portion TWL2b is provided between the second portion TWL3b and the first portion TWL5a. That is, in the second portion TWL2b, the conductive layer 23 corresponding to a word line WL3 is detached in the X direction. Accordingly, the second portion TWL3b is separated in the X direction from the conductive layers 23 corresponding to word lines WL4 and WL5, respectively, by the second portion TWL2b. The second portion TWL5b is provided between the second portion TWL6b and the terrace portion TWL8. That is, in the second portion TWL5b, the conductive layer 23 corresponding to a word line WL6 is detached in the X direction. Accordingly, the second portion TWL6b is separated in the X direction from the conductive layers 23 corresponding to word lines WL7 and WL8, respectively, by the second portion TWL5b.

Note that, for example, except that the position in the X direction of the mask M3 with respect to the masks M1 and M2 is relatively different, since the manufacturing method of the semiconductor memory device 1 of the first modification is substantially equivalent to the manufacturing method of the semiconductor memory device 1 of the embodiment, a description thereof is omitted.

The first modification also produces effects equivalent to those in the embodiment.

2.2 Second Modification

In the above-described embodiment and first modification, although the example is shown where, in each block BLK, the end of the select gate line SGS, and the ends of the word lines WL0 to WL10 are provided in the step-like shapes including the three terrace portions T arranged in the Y direction, it is not limited to this. For example, in each block BLK, the end of the select gate line SGS, and the ends of the word lines WL0 to WL10 may be provided in step-like shapes including four terrace portions T arranged in the Y direction.

Hereinafter, the configuration and manufacturing method of a semiconductor memory device of a second modification will be described mainly about the differences from the configuration and manufacturing method of the semiconductor memory device of the first modification.

2.2.1 Configuration

FIG. 32 is a plan view showing an example of the plane layout of a memory cell array provided in a semiconductor memory device of the second modification. The plan view shown in FIG. 32 corresponds to the plan view shown in FIG. 3 in the embodiment.

A memory cell array 10 includes members ST. The member ST is provided between members SLTe and SLTo in a Y direction. That is, a plurality of sets including the members SLTe, SLTo, and ST are arranged in the Y direction in the memory cell array 10.

Each member ST extends in an X direction. Each member ST crosses a portion of a drawer area HA in the X direction. Accordingly, each member ST divides a local portion of a stacked interconnect in the drawer area HA in the Y direction. Each member ST has a structure where, for example, an insulator and a plate-like contact are embedded inside.

The planar structure of the drawer area HA will be described by using FIG. 33. FIG. 33 is a plan view showing an example of the plane layout of the drawer area and its vicinity of the memory cell array provided in the semiconductor memory device of the second modification. In FIG. 33, the planar structure in the drawer area HA of each of the blocks BLK0 and BLK1 of the memory cell arrays 10 is shown. Additionally, the structure of a memory area MA in the vicinity of the drawer area HA is also shown in FIG. 33. Note that, in the following description, an end on the drawer area HA side along the X direction is called one end in the X direction. Additionally, an end on the memory area MA side in the X direction is called the other end in the X direction.

In each block BLK, a portion including the terrace portions TSGS, TWL0, TWL1, and TWL2, a portion including the terrace portions TWL3 to TWL6, and a portion including the terrace portions TWL7 to TWL10 are arranged in this order along the X direction.

The portion including the terrace portions TSGS, TWL0, TWL1, and TWL2 includes steps that become higher in this order along the Y direction. The portion including the terrace portions TWL3 to TWL6 include steps that become higher in this order along the Y direction. The portion including the terrace portions TWL7 to TWL10 include steps that become higher in this order along the Y direction.

The terrace portion TWL0 includes a first portion TWL0a and a second portion TWL0b. The terrace portion TWL1 includes a first portion TWL1a and a second portion TWL1b. The terrace portion TWL4 includes a first portion TWL4a and a second portion TWL4b. The terrace portion TWL5 includes a first portion TWL5a and a second portion TWL5b. The terrace portion TWL8 includes a first portion TWL8a and a second portion TWL8b. The terrace portion TWL9 includes a first portion TWL9a and a second portion TWL9b. The first portions TWL0a, TWL1a, TWL4a, TWL5a, TWL8a and TWL9a, and the second portions TWL0b, TWL1b, TWL4b, TWL5b, TWL8b, and TWL9b are each provided in a rectangular-shaped area.

The first portions TWL0a and TWL1a have substantially equivalent lengths along the X direction. The first portions TWL4a and TWL5a have substantially equivalent lengths along the X direction. The first portions TWL8a and TWL9a have substantially equivalent lengths along the X direction. Note that the respective lengths of the first portions TWL0a and TWL1a along the X direction, the respective lengths of the first portions TWL4a and TWL5a along the X direction, and the respective lengths of the first portions TWL8a and TWL5a along the X direction may be substantially equivalent to each other, or may be different from each other.

For example, in the block BLK0, a portion of the other end side in the Y direction of the second portion TWL0b is connected to the first portion TWL0a. A portion of the one end side in the Y direction of the second portion TWL1b is connected to the first portion TWL1a. A portion of the other end side in the Y direction of the second portion TWL4b is connected to the first portion TWL4a. A portion of the one end side in the Y direction of the second portion TWL5b is connected to the first portion TWL5a. A portion of the other end side in the Y direction of the second portion TWL8b is connected to the first portion TWL8a. A portion of the one end side in the Y direction of the second portion TWL9b is connected to the first portion TWL9a.

The second portion TWL0b is provided between the portion of the one end side in the X direction of the first portion TWL0a, and the portion of the one end side in the X direction of the first portion TWL1a in the Y direction. The second portion TWL1b is provided between the portion of the other end side in the X direction of the first portion TWL0a, and the portion of the other end side in the X direction of the first portion TWL1a in the Y direction. The second portion TWL4b is provided between the portion of the one end side in the X direction of the first portion TWL4a, and the portion of the one end side in the X direction of the first portion TWL5a in the Y direction. The second portion TWL5b is provided between the portion of the other end side in the X direction of the first portion TWL4a, and the portion of the other end side in the X direction of first portion TWL5a in the Y direction. The second portion TWL8b is provided between the portion of the one end side in the X direction of the first portion TWL8a, and the portion of the one end side in the X direction of the first portion TWL9a in the Y direction. The second portion TWL9b is provided between the portion of the other end side in the X direction of the first portion TWL8a, and the portion of the other end side in the X direction of the first portion TWL9a in the Y direction. With these configurations, the second portions TWL0b, TWL1b, TWL4b, TWL5b, TWL8b, and TWL9b are arranged in this order in the X direction.

The second portions TWL0b and TWL1b are complementarily arranged in an area sandwiched by the first portions TWL0a and TWL1a in the Y direction in plan view. Accordingly, the second portions TW0b and TWL1b are adjacent to each other in the X direction. The second portions TWL4b and TWL5b are complementarily arranged in an area sandwiched by the first portions TWL4a and TWL5a in the Y direction in plan view. Accordingly, the second portions TW4b and TWL5b are adjacent to each other in the X direction. The second portions TWL8b and TWL9b are complementarily arranged in an area sandwiched by the first portions TWL8a and TWL9a in the Y direction in plan view. Accordingly, the second portions TW8b and TWL9b are adjacent to each other in the X direction.

The terrace portions TSGS, TWL3, TWL7, and TWL10 contact the member SLTo.

The terrace portions TWL2, TWL6, and TWL10 contact the member SLTe.

The terrace portions TWL0, TWL1, TWL4, TWL5, TWL8, and TWL9 contact the member ST.

Note that the structure of the terrace portions of each even-numbered block BLK and the structure of the terrace portions of each odd-numbered block BLK have symmetrical structures with respect to, for example, the XZ plane.

Figure 34:
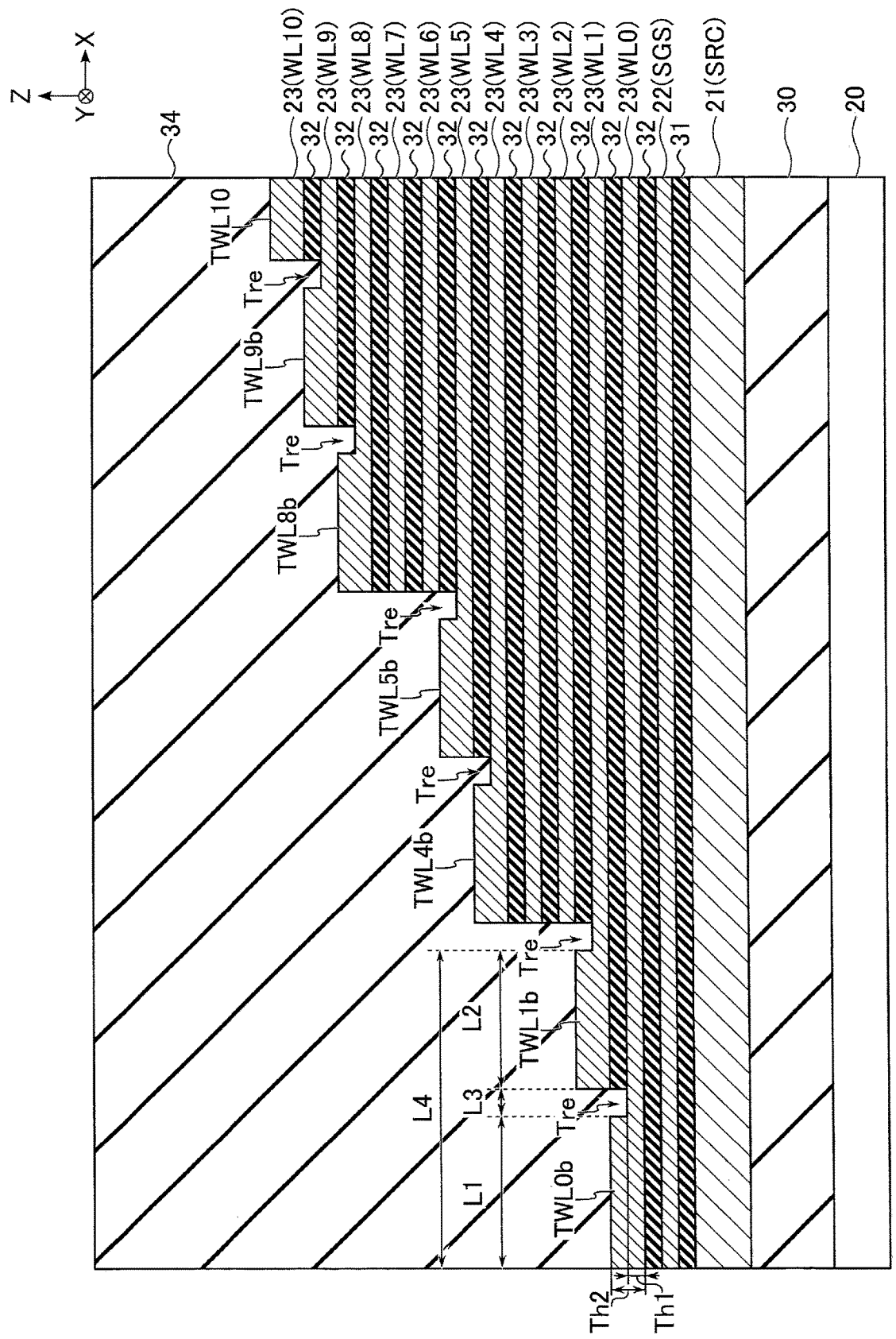
FIG. 34 is a cross-sectional view taken along a XXXIV-XXXIV line in FIG. 33, showing an example of a cross-sectional structure in the drawer area of the memory cell array provided in the semiconductor memory device of the second modification.

Next, the cross-sectional structure of the XZ plane in the drawer area HA of the memory cell array 10 will be described by using FIG. 34. FIG. 34 is a cross-sectional view taken along a XXXIV-XXXIV line in FIG. 33, showing an example of the cross-sectional structure in the drawer area of the memory cell array provided in the semiconductor memory device of the second modification.

Along the XXXIV-XXXIV line in FIG. 33, the stacked interconnect structure has a step structure including the second portions TWL0b, TWL1b, TWL4b, TWL5b, TWL8b, and TWL9b, and the terrace portion TWL10.

In the above-described step structure, the second portions TWL0b, TWL1b, TWL4b, TWL5b, TWL8b, and TWL9b each includes the second conductor portion and the trench portion Tre. The terrace portion TWL10 includes the second conductor portion.

With such a configuration, the second portion TWL0b is separated in the X direction from a side surface of the conductive layer 23 corresponding to a word line WL1. The second portion TWL1b is separated in the X direction from side surfaces of the conductive layers 23 corresponding to word lines WL2 to WL4, respectively. The second portion TWL4b is separated in the X direction from a side surface of the conductive layer 23 corresponding to a word line WL5. The second portion TWL5b is separated in the X direction from side surfaces of the conductive layers 23 corresponding to word lines WL6 to WL8, respectively. The second portion TWL8b is separated in the X direction from a side surface of the conductive layer 23 corresponding to a word line WL9. The second portion TWL9b is separated in the X direction from a side surface of the conductive layer 23 corresponding to a word line WL10.

The sum of a length L1 along the X direction of the second portion TWL0b, a length L2 along the X direction of the second portion TWL1b, and a length L3 along the X direction of the trench portion Tre included between the second portions TWL0b and TWL1b is substantially equivalent to a length L4 along the X direction of each of the first portions TWL0a and TWL1a (L1+L2+L3=L4). Note that, in the following description, it is assumed that the length L3 along the X direction of each trench portion Tre is substantially equivalent, irrespective of the trench portion Tre. The sum of the length along the X direction of the second portion TWL4b, the length along the X direction of the second portion TWL5b, and the length along the X direction of the trench portion Tre included between the second portions TWL4b and TWL5b is substantially equivalent to the length along the X direction of each of the first portions TWL4a and TWL5a. The sum of the length along the X direction of the second portion TWL8b, the length along the X direction of the second portion TWL9b, and the length along the X direction of the trench portion Tre included between the second portions TWL8b and TWL9b is substantially equivalent to the length along the X direction of each of the first portions TWL8a and TWL9a.

Note that the step structure of the stacked interconnect structure in the XZ plane including the terrace portions TSGS, TWL3, and TWL7, the step structure of the stacked interconnect structure in the XZ plane including the first portions TWL0a, TWL4a, and TWL8a, the step structure of the stacked interconnect structure in the XZ plane including the first portions TWL1a, TWL5a, and TWL9a, and the step structure of the stacked interconnect structure in the XZ plane including the terrace portions TWL2, TWL6, and TWL10 have structures similar to, for example, the step structure of the stacked interconnect structure including the first portions TWL0a, TWL3a, and TWL6a in FIG. 9, except that the steps are different.

Figure 35:
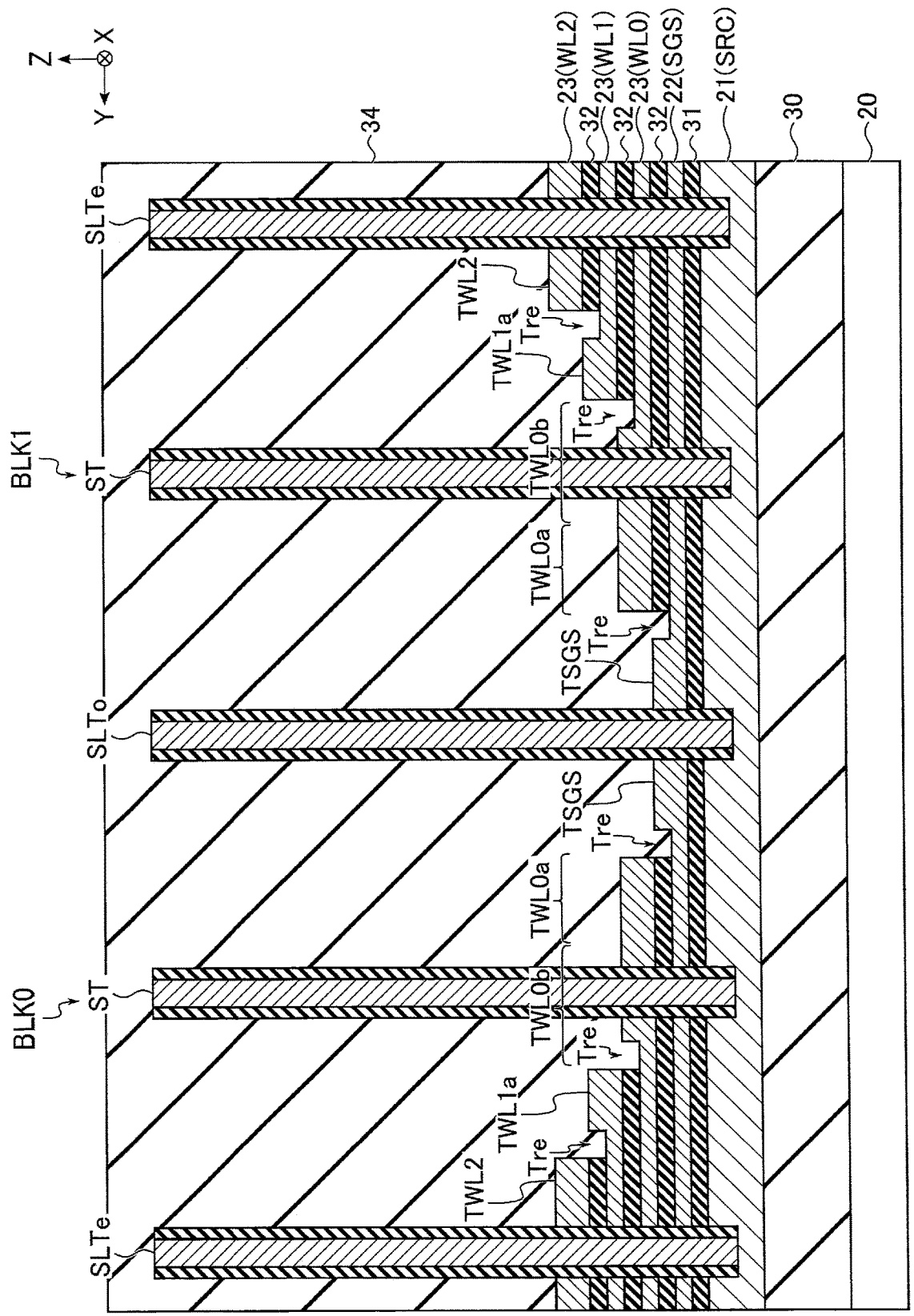
FIG. 35 is a cross-sectional view taken along a XXXV-XXXV line in FIG. 33, showing an example of a cross-sectional structure in the drawer area of the memory cell array provided in the semiconductor memory device of the second modification.

The cross-sectional structure in a YZ plane in the drawer area HA of the memory cell array 10 will be described by using FIG. 35. FIG. 35 is a cross-sectional view taken along a XXXV-XXXV line in FIG. 33, showing an example of the cross-sectional structure in the drawer area of the memory cell array provided in the semiconductor memory device of the second modification.

Along the XXXV-XXXV line in FIG. 33, the stacked interconnect structure has a step structure including the terrace portions TSGS and TWL2, the first portions TWL0a and TWL1a, and the second portion TWL0b.

In the above-described step structure, each of the terrace portion TSGS, the first portion TWL1a, and the second portion TWL0b includes the second conductor portion and the trench portion Tre. The terrace portion TWL2 and the first portion TWL0a include the second conductor portion.

The second portion TWL0b is divided in the Y direction by the member ST. The respective portions divided in the Y direction of the second portion TWL0b contact the member ST on both sides of the member ST along the Y direction, respectively.

The terrace portion TSGS is separated in the Y direction from a side surface of the conductive layer 23 corresponding to the word line WL0 between the members ST and SLTo.

The second portion TWL0b is separated in the Y direction from a side surface of the conductive layer 23 corresponding to the word line WL1 between the members ST and SLTe. The first portion TWL1a is separated in the Y direction from a side surface of the conductive layer 23 corresponding to the word line WL2.

Note that a step structure of the stacked interconnect structure in the YZ plane including the terrace portions TWL3 and TWL6, the first portions TWL4a and TWL5a, and the second portion TWL4b, and a step structure of the stacked interconnect structure in the YZ plane including the terrace portions TWL7 and TWL10, the first portions TWL8a and TWL9a, and the second portion TWL8b have structures similar to the step structure of the stacked interconnect structure shown in FIG. 35, except for each having a different height.

The cross-sectional structure in the YZ plane in the drawer area HA of the memory cell array 10 will be further described by using FIG. 36. FIG. 36 is a cross-sectional view taken along a XXXVI-XXXVI line in FIG. 33, showing an example of the cross-sectional structure in the drawer area of the memory cell array provided in the semiconductor memory device of the second modification.

Along the XXXVI-XXXVI line in FIG. 33, the stacked interconnect structure has a step structure including the terrace portion TSGS and TWL2, the first portions TWL0a and TWL1a, and the second portion TWL1b.

In the above-described step structure, the terrace portion TSGS, and the first portions TWL0a and TWL1a include the second conductor portion and the trench portion Tre. The terrace portion TWL2 and the second portion TWL0b include the second conductor portion.

The second portion TWL1b is divided in the Y direction by the member ST. The respective portions divided in the Y direction of the second portion TWL1b contact the member ST on both sides of the member ST along the Y direction, respectively.

The first portion TWL0a is separated in the Y direction from a side surface of the conductive layer 23 corresponding to the word line WL1 between the members ST and SLTo. Similar to the terrace portion TSGS in FIG. 35, the terrace portion TSGS is separated in the Y direction from a side surface of the conductive layer 23 corresponding to the word line WL0.

Similar to the first portion TWL1a in FIG. 35, the first portion TWL1a is separated in the Y direction from a side surface of the conductive layer 23 corresponding to the word line WL2 between the members ST and SLTe.

Note that a step structure of the stacked interconnect structure in the YZ plane including the terrace portions TWL3 and TWL6, the first portions TWL4a and TWL5a, and the second portion TWL5b, and a step structure of the stacked interconnect structure in the YZ plane including the terrace portions TWL7 and TWL10, the first portions TWL8a and TWL9a, and the second portion TWL9b have structures similar to the step structure shown in FIG. 36, except for each having a different height.

2.2.2 Manufacturing Method

Next, the manufacturing method of the semiconductor memory device 1 of the second modification will be described by using FIG. 37 to FIG. 40. FIG. 37 to FIG. 40 are plan views showing an example of the structure during manufacturing of the memory cell array 10 provided in the semiconductor memory device 1 of the embodiment. The plan views shown in FIG. 37 to FIG. 40 show areas corresponding to FIG. 33. Hereinafter, the steps of forming a step structure of a stacked structure (that is, the steps corresponding to S101 to S106 in the embodiment) will be mainly described.

First, as shown in FIG. 37, a mask M1' is formed. The mask M1' includes an etching portion EP1'. The etching portion EP1' is formed by, for example, lithography processing. The etching portion EP1' includes an area where the terrace portions TSGS, TWL0, TWL1, TWL3, TWL4, TWL5, TWL7, TWL8, and TWL9 of each of the blocks BLK0 and BLK1 are to be formed.

Then, anisotropic etching processing using the mask M1' is performed. After the etching processing is completed, the mask M1' is removed.

Figure 38:
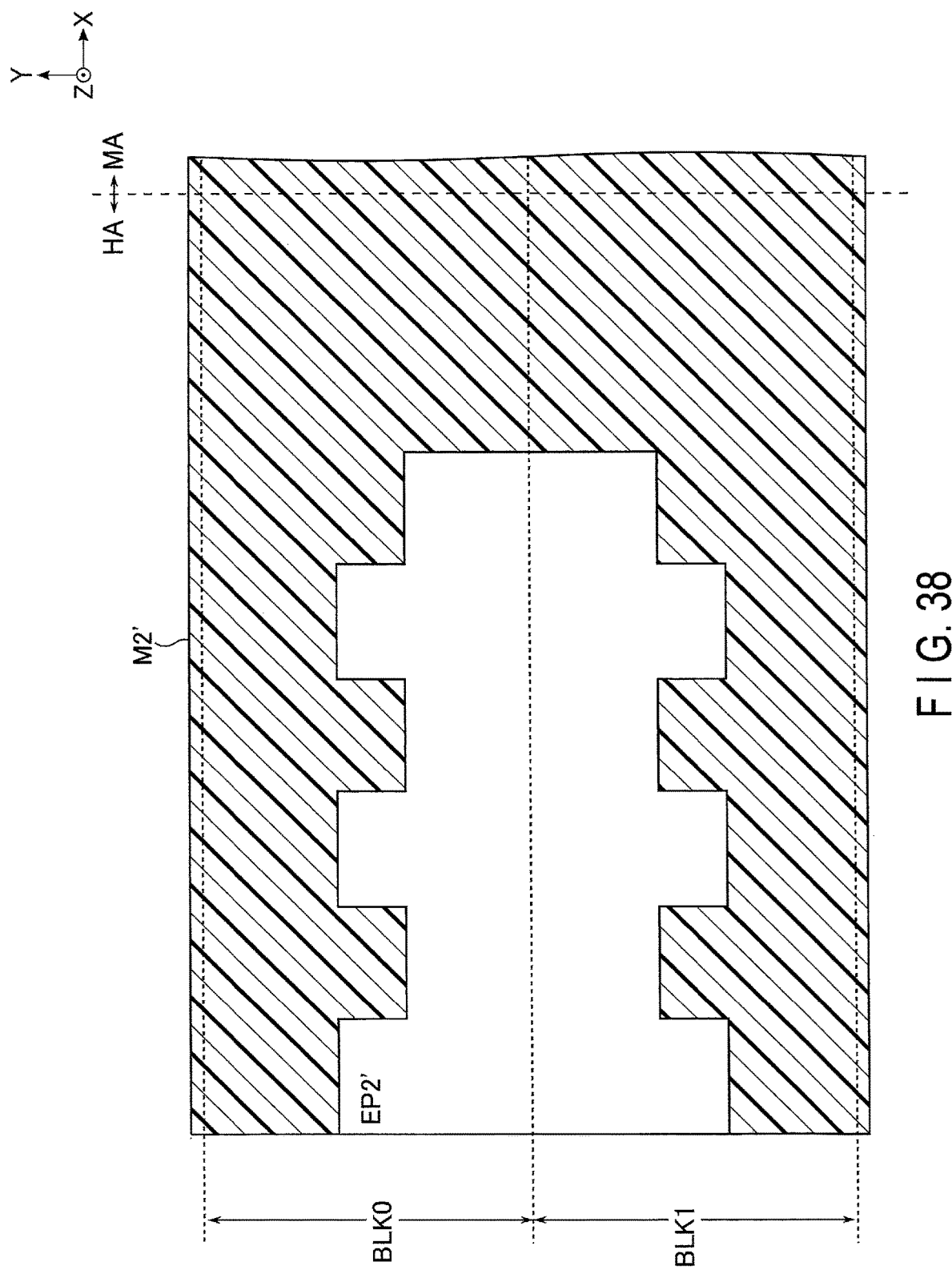
FIG. 38 is a plan view for describing an example of the manufacturing method of the memory cell array provided in the semiconductor memory device of the second modification.

Thereafter, as shown in FIG. 38, a mask M2' is formed. The mask M2' includes an etching portion EP2'. The etching portion EP2' is formed by, for example, lithography processing. The etching portion EP2' includes an area where the terrace portions TSGS, TWL0, TWL3, TWL4, TWL7, and TWL8 of each of the blocks BLK0 and BLK1 are to be formed.

Next, anisotropic etching processing using the mask M2' is performed. After the etching processing is completed, the mask M2' is removed.

Figure 39:
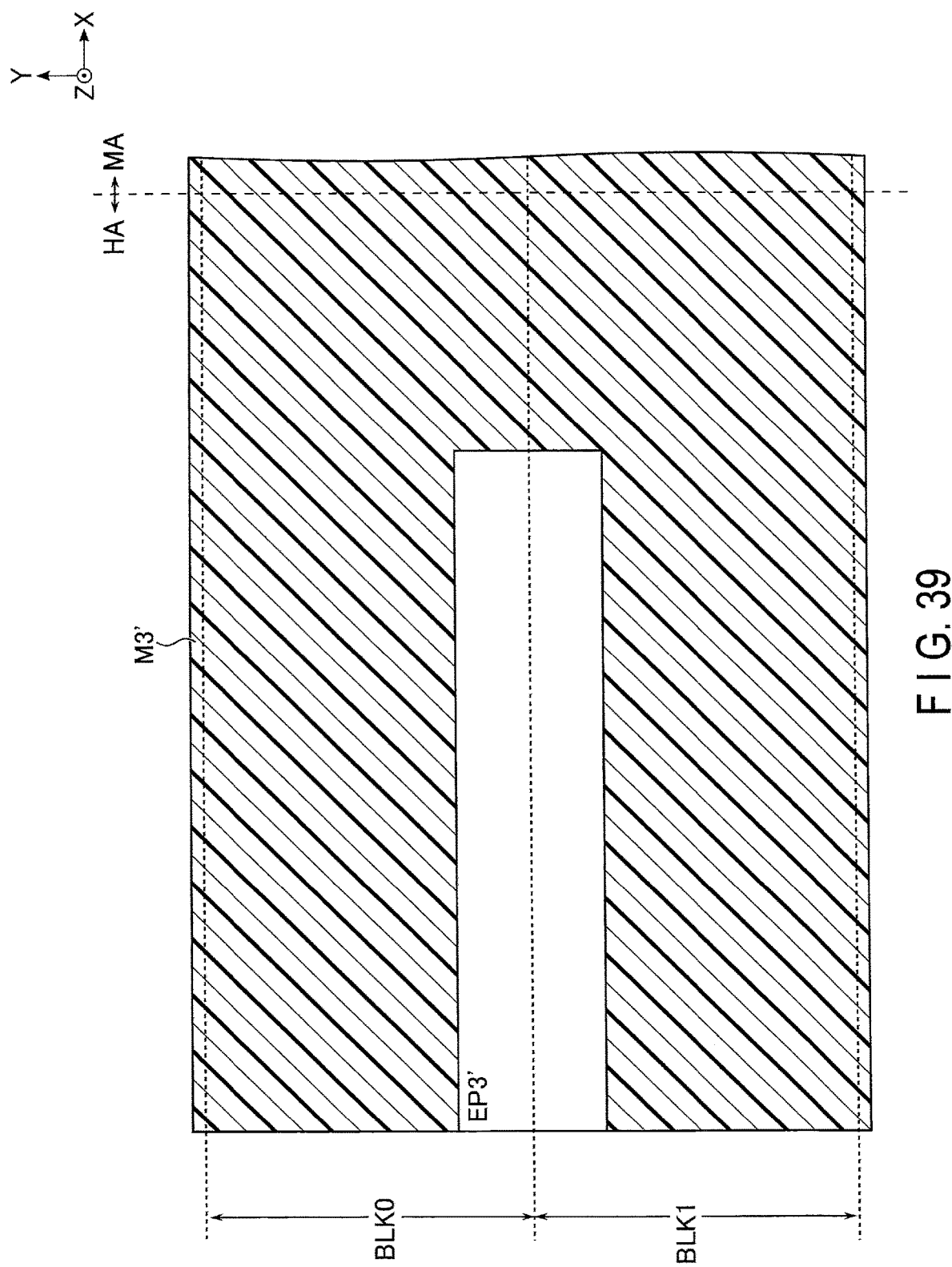
FIG. 39 is a plan view for describing an example of the manufacturing method of the memory cell array provided in the semiconductor memory device of the second modification.

Then, as shown in FIG. 39, a mask M3' is formed. The mask M3' includes an etching portion EP3'. The etching portion EP3' is formed by, for example, lithography processing. The etching portion EP3' includes an area where the terrace portions TSGS, TWL3, and TWL7 of each of the blocks BLK0 and BLK1 are to be formed.

Thereafter, anisotropic etching processing using the mask M3' is performed. After the etching processing is completed, the mask M3' is removed.

Figure 40:
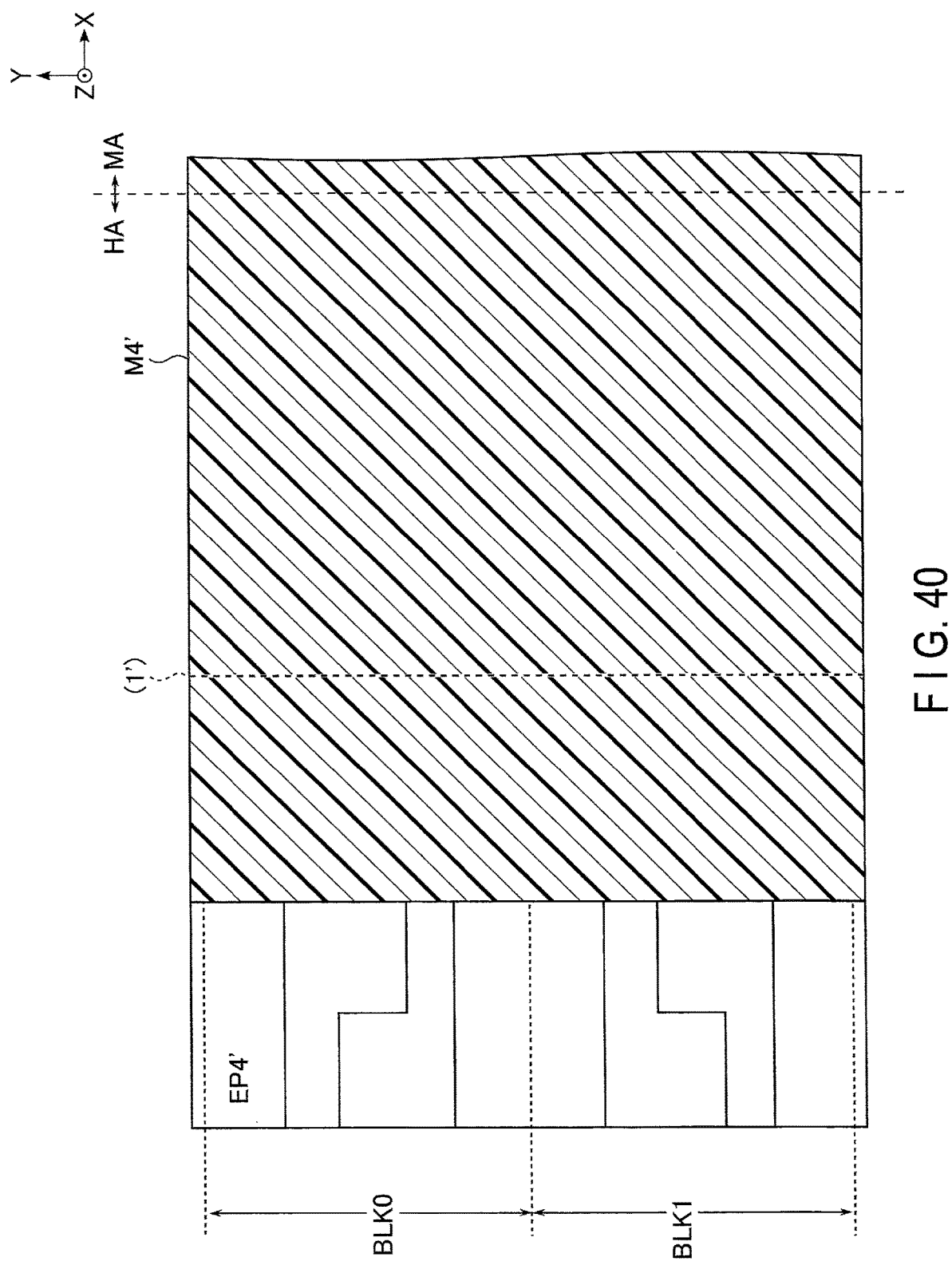
FIG. 40 is a plan view for describing an example of the manufacturing method of the memory cell array provided in the semiconductor memory device of the second modification.

Next, as shown in FIG. 40, a mask M4' is formed. The mask M4' includes an etching portion EP4'. The etching portion EP4' is formed by, for example, lithography processing. The etching portion EP4' includes an area where the terrace portions TSGS, TWL0, TWL1, and TWL2 of each of the blocks BLK0 and BLK1 are to be formed.

Then, a step structure of the stacked structure along the X direction is formed by repeating anisotropic etching processing and isotropic etching processing (slimming processing).

More specifically, anisotropic etching processing using the mask M4' is performed, and four sacrifice members 50 are removed. Then, isotropic etching processing of the mask M4' is performed. Accordingly, the etching portion EP4' is isotropically enlarged to a portion indicated by a dotted line (1') in FIG. 40. The etching portion EP4' that is enlarged to the portion indicated by the dotted line (1') includes an area where the terrace portions TSGS, and TWL0 to TWL6 of each of the blocks BLK0 and BLK1 are to be formed. Thereafter, the anisotropic etching processing using the mask M4' is performed. Accordingly, the four sacrifice members 50 are removed in the etching portion EP4' that is enlarged to the portion indicated by the dotted line (1'). After these kinds of etching processing using the mask M4' are completed, the mask M4' is removed.

With the above steps, the step structure of the stacked structure in the second modification is formed.

In the second modification, in the process corresponding to S109, a mask in which areas corresponding to the members SLT and ST are opened is formed by photolithography, etc. Accordingly, slits SH associated with the members SLT and ST are formed.

Note that the other steps can be performed by steps substantially equivalent to the manufacturing method of the semiconductor memory device 1 of the embodiment.

With the manufacturing method as above, the semiconductor memory device 1 of the second modification is manufactured.

The second modification also produces effects equivalent to those in the embodiment and the first modification.

Supplementarily, when the stacked interconnect structure includes four terrace portions arranged in the Y direction in each block, in order to suppress two center terrace portions of the four terrace portions from including a portion that is not replaced with a conductor, a technique is employed that provides a center member contacting both of the two center terrace portions. However, depending on machining accuracy, it may become difficult to provide the center member so as to contact both of the two center terrace portions. Accordingly, the center member is separated from one terrace portion of the two center terrace portions. Therefore, there is a possibility that it becomes difficult to suppress the terrace portions from including the portion that is not replaced with the conductor.

According to the second modification, as shown in FIG. 33, for example, the terrace portions TWL0 and TWL1 include the second portions TWL0b and TWL1b arranged in this order in the X direction, respectively. With such a configuration, compared with a case where two center terrace portions each having a rectangular shape are arranged in the Y direction, a margin for the position of the member ST in the Y direction can be secured. That is, since the second portions TWL0b and TWL1b have a width in the Y direction, compared with the case where the two center terrace portions each having the rectangular shape are arranged in the Y direction, it is easy to make each of the terrace portions TWL0 and TWL1 contact the member ST. Accordingly, it is possible to suppress the terrace portions T from including the portion that is not replaced with the conductor. Therefore, an increase in the size of the drawer area HA can be suppressed, while preventing penetration of the contacts CC.

2.3 Third Modification

In the above-described second modification, although the case is shown where each terrace portion T is separated from each other since the conductive layer 22 or 23 includes the trench portion Tre, it is not limited to this. For example, in a cross-sectional view of the XZ plane including the terrace portions TWL0, TWL1, TWL4, TWL5, TWL8, TWL9, and TWL10, by detaching one conductive layer in the X direction between the second portion of the conductive layer and the portion overlapped with an upper conductive layer of the first conductor portion of the conductive layer, the terrace portion T corresponding to the conductive layer and the terrace portion T that is adjacent in the X direction may be separated from each other. In the following description, the configuration and manufacturing method of the semiconductor memory device 1 of a third modification will be described mainly about the differences from the configuration and manufacturing method of the semiconductor memory device 1 of the second modification.

Figure 41:
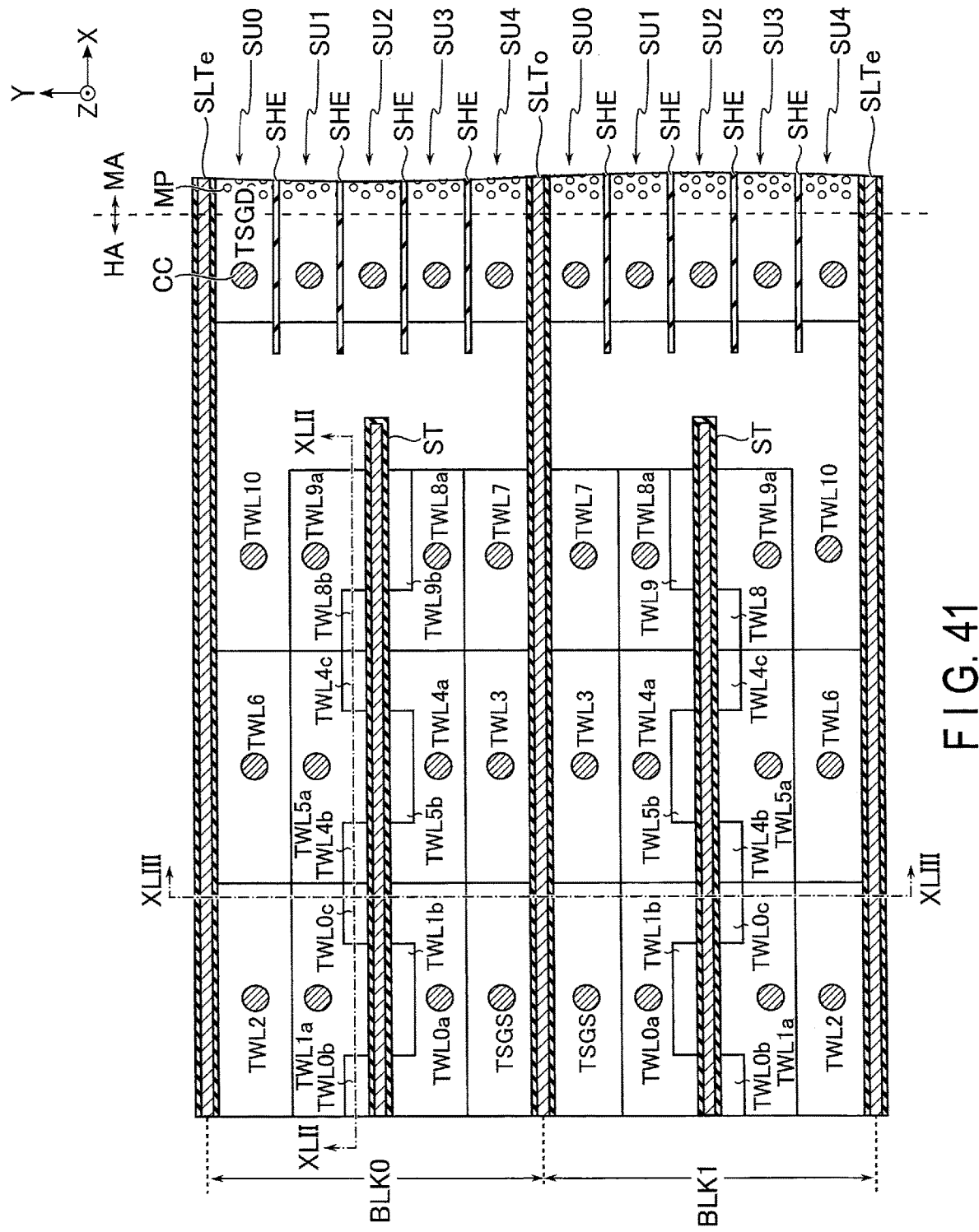
FIG. 41 is a plan view showing an example of a plane layout of a drawer area and its vicinity of a memory cell array provided in a semiconductor memory device of a third modification.

The plane layout of the semiconductor memory device 1 will be described by using FIG. 41. FIG. 41 is a plan view showing an example of the plane layout of a drawer area and its vicinity of a memory cell array provided in a semiconductor memory device of the third modification.

A terrace portion TWL0 includes a third portion TWL0c in addition to a first portion TWL0a and a second portion TWL0b. A terrace portion TWL4 includes a third portion TWL4c, in addition to a first portion TWL04a and a second portion TWL4b. The third portions TWL0c and TWL4c are each provided in a rectangular-shaped area For example, in the block BLK0, a portion on the other end side in the Y direction of the third portion TWL0c is connected to the first portion TWL0a. A portion on the other end side in the Y direction of the third portion TWL4c is connected to the first portion TWL4a.

In the third modification, the second portion TWL1b is provided between a center portion sandwiched by a portion on the one end side and a portion of the other end side in the X direction of the first portion TWL0a, and a center portion sandwiched by a portion on the one end side and a portion on the other end side in the X direction of the first portion TWL1a in the Y direction. The second portion TWL5b is provided between a center portion sandwiched by a portion on the one end side and a portion on the other end side in the X direction of the first portion TWL4a, and a center portion sandwiched by a portion on the one end side and a portion on the other end side in the X direction of the first portion TWL5a in the Y direction.

The third portion TWL0c is provided between the portion on the other end side in the X direction of the first portion TWL0a, and the portion on the other end side in the X direction of the first portion TWL1a in the Y direction. The third portion TWL4c is provided between the portion on the other end side in the X direction of the first portion TWL4a, and the portion on the other end side in the X direction of the first portion TWL5a in the Y direction.

With these configurations, the second portions TWL0b and TWL1b, the third portion TWL0c, the second portions TWL4b and TWL5b, and the third portion TWL4c are arranged in this order in the X direction.

The second portion TWL0b and the third portion TWL0c, and the second portion TWL1b are complementarily arranged in an area sandwiched by the first portions TWL0a and TWL1a in the Y direction in plan view. Accordingly, the second portion TWL1b is adjacent to each of the second portion TWL0b and the third portion TWL0c in the X direction. The second portion TWL4b and the third portion TWL4c, and the second portion TWL5b are complementarily arranged in an area sandwiched by the first portions TWL4a and TWL5a in the Y direction in plan view. Accordingly, the second portion TWL5b is adjacent to each of the second portion TWL4b and the third portion TWL4c in the X direction.

Figure 42:
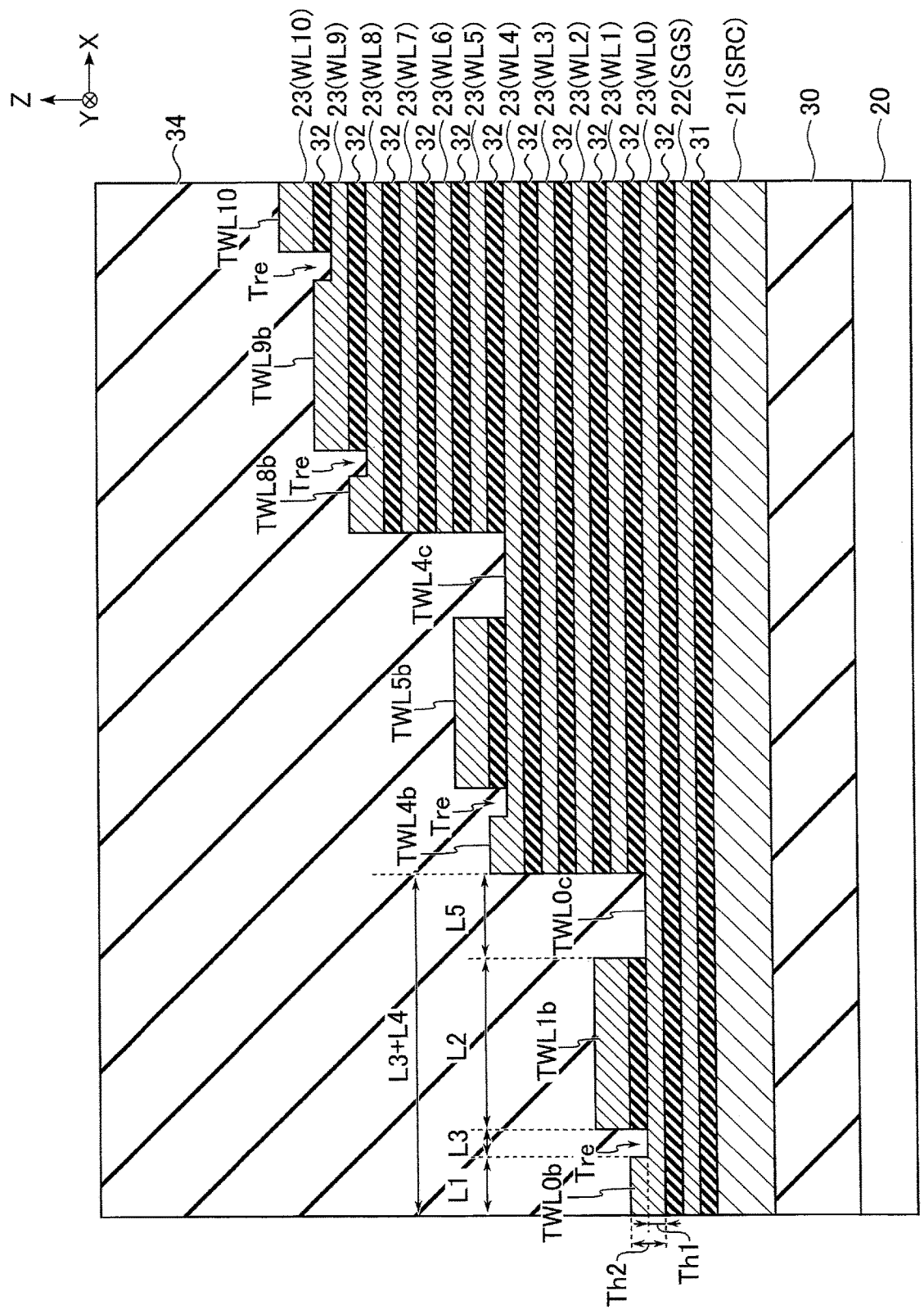
FIG. 42 is a cross-sectional view taken along a XLII-XLII line in FIG. 41, showing an example of a cross-sectional structure in the drawer area of the memory cell array provided in the semiconductor memory device of the third modification.

The cross-sectional structure in the XZ plane of the semiconductor memory device 1 will be described by using FIG. 42. FIG. 42 is a cross-sectional view taken along a XLII-XLII line in FIG. 41, showing an example of the cross-sectional structure in the drawer area of the memory cell array provided in the semiconductor memory device of the third modification.

Along the XLII-XLII line in FIG. 41, the stacked interconnect structure has a step structure including the second portions TWL0b, TWL1b, TWL4b, TWL5b, TWL8b, and TWL9b, the terrace portion TWL10, and the third portions TWL0c and TWL4c.

In the above-described step structure, the third portions TWL0c and TWL4c are included in the first conductor portion of the corresponding conductive layer 23.

The third portion TWL0c is provided between the second portion TWL1b and the second portion TWL4b. That is, in the third portion TWL0c, the conductive layer 23 corresponding to a word line WL1 is detached in the X direction. Accordingly, the second portion TWL1b is separated in the X direction from the conductive layers 23 corresponding to word lines WL2 to WL4, respectively, by the third portion TWL0c. The third portion TWL4c is provided between the second portion TWL5b and the second portion TWL8b. That is, in the third portion TWL4c, the conductive layer 23 corresponding to a word line WL5 is detached in the X direction. Accordingly, the second portion TWL5b is separated in the X direction from the conductive layers 23 corresponding to word lines WL6 to WL8, respectively, by the third portion TWL4c.

The sum of a length L1 along the X direction of the second portion TWL0b, a length L2 along the X direction of the second portion TWL1b, and a length L5 along the X direction of the third portion TWL0c is substantially equivalent to a length L4 along the X direction of each of the first portions TWL0a and TWL1a (L1+L2+L5=L4). The sum of the length along the X direction of the second portion TWL4b, the length along the X direction of the second portion TWL5b, and the length along the X direction of the third portion TWL4c is substantially equivalent to the length along the X direction of each of the first portions TWL4a and TWL5a.

Figure 43:
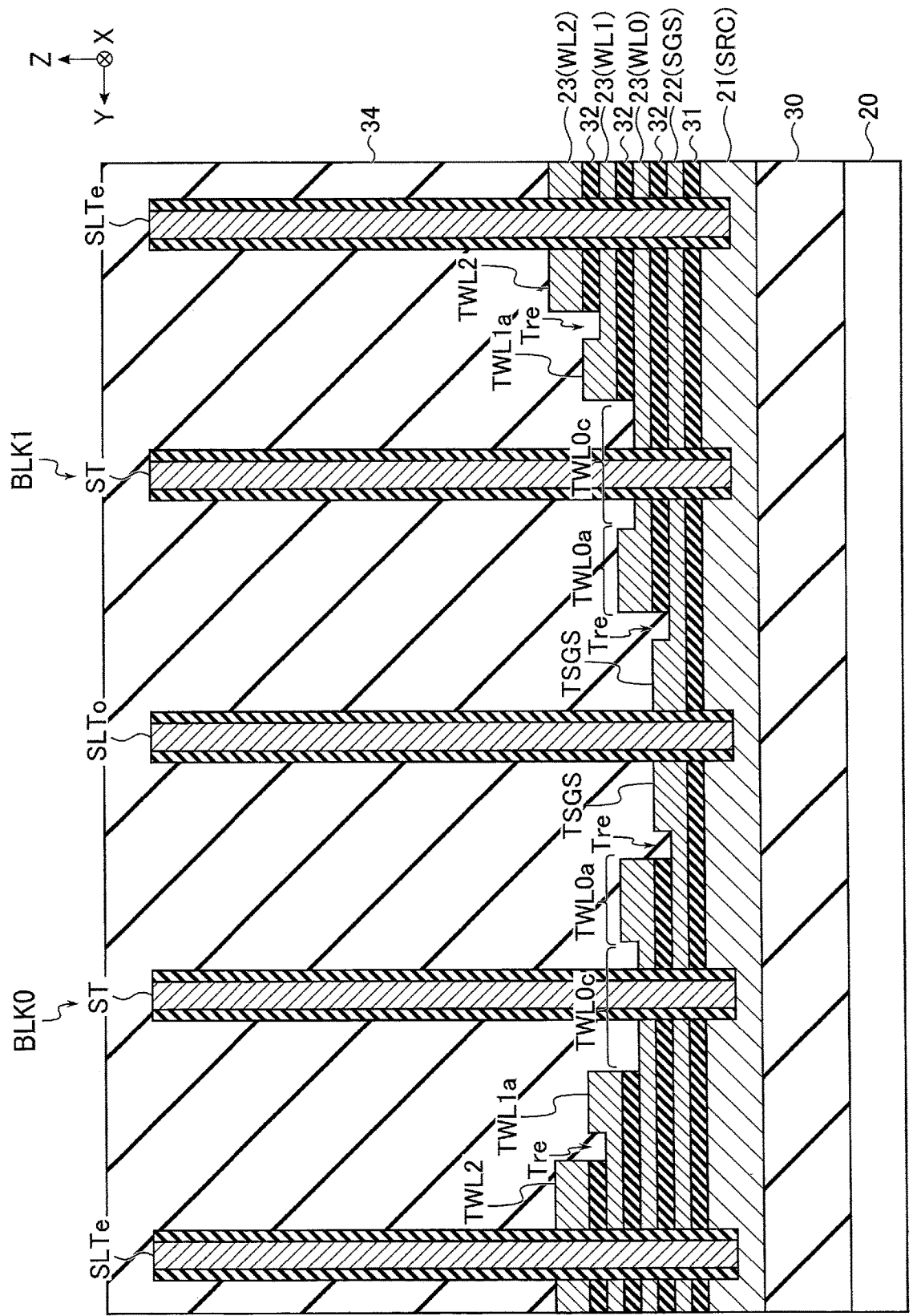
FIG. 43 is a cross-sectional view taken along a XLIII-XLIII line in FIG. 41, showing an example of a cross-sectional structure in the drawer area of the memory cell array provided in the semiconductor memory device of the third modification.

The cross-sectional structure in the YZ plane of the semiconductor memory device 1 will be described by using FIG. 43. FIG. 43 is a cross-sectional view taken along a XLIII-XLIII line in FIG. 41, showing an example of the cross-sectional structure in the drawer area of the memory cell array provided in the semiconductor memory device of the third modification.

Along the XLIII-XLIII line in FIG. 41, the stacked interconnect structure has a step structure including the terrace portions TSGS and TWL2, the first portions TWL0a and TWL1a, and the third portion TWL0c.

In the above-described step structure, the third portion TWL0c is included in the first conductor portion.

The third portion TWL0c is divided in the Y direction by the member ST. The respective portions divided in the Y direction of the third portion TWL0c contact the member ST on both sides of the member ST along the Y direction, respectively.

The structure shown in FIG. 43 is equivalent to the structure shown in FIG. 35, except for including the third portion TWL0c instead of the second portion TWL0b.

Note that a step structure of the stacked interconnect structure in the YZ plane including the terrace portions TWL3 and TWL6, the first portions TWL4a and TWL5a, and the third portion TWL4c has a structure similar to the step structure shown in FIG. 43, except for having a different height.

Additionally, except that the position in the X direction of the mask M4' with respect to the masks M1' to M3' is relatively different, since the manufacturing method of the semiconductor memory device 1 of the third modification is substantially equivalent to the manufacturing method of the semiconductor memory device 1 of the second modification, a description thereof is omitted.

The third modification also produces effects equivalent to those in the embodiment, the first modification, and the second modification.

3. Other Embodiments

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A semiconductor memory device, comprising:
a plurality of conductive layers arranged separated from each other in a first direction, each of the plurality of conductive layers including a first portion, and a second portion that is provided so as not to be overlapped with an upper conductive layer, and that is thicker than the first portion in the first direction;
a first insulator portion that extends in a second direction intersecting the first direction, and that contacts the second portion of a first conductive layer of the plurality of conductive layers, and the second portion of a second conductive layer of the plurality of conductive layers; and
a second insulator portion that extends in the second direction, sandwiches, in a third direction intersecting the first direction and the second direction, together with the first insulator portion, the second portion of the first conductive layer, the second portion of the second conductive layer, and the second portion of a third conductive layer of the plurality of conductive layers, and contacts the second portion of the third conductive layer, wherein
the second portion of the second conductive layer includes a first sub portion arranged in the second direction with the second portion of the first conductive layer, and a second sub portion provided between the second portion of the first conductive layer and the second portion of the third conductive layer.

2. The device of claim 1, wherein
the first sub portion of the second conductive layer contacts the first insulator portion.

3. The device of claim 1, wherein the first portion of the second conductive layer is provided in a layer upper than the first portion of the first conductive layer.

4. The device of claim 3, wherein the first portion of the first conductive layer includes a first sub portion provided so as not to be overlapped with an upper conductive layer between the second portion of the first conductive layer, and the first sub portion of the second conductive layer along the second direction, and between the second portion of the first conductive layer, and the second sub portion of the second conductive layer along the third direction, respectively.

5. The device of claim 1, wherein the first portion of the first conductive layer includes a second sub portion provided so as not to be overlapped with an upper conductive layer, and the second portion of the first conductive layer and the second sub portion of the first conductive layer sandwich the first sub portion of the second conductive layer in the second direction.

6. The device of claim 1, wherein the first portion of the third conductive layer is provided in a layer upper than the first portion of the second conductive layer.

7. The device of claim 6, wherein the first portion of the second conductive layer includes a third sub portion provided so as not to be overlapped with an upper conductive layer between the second sub portion of the second conductive layer, and the second portion of the third conductive layer along the third direction.

8. The device of claim 1, further comprising:

a memory pillar that penetrates through the plurality of conductive layers, and portions of the memory pillar that intersect the first conductive layer, the second conductive layer, and the third conductive layer function as a first memory cell transistor, a second memory cell transistor, and a third memory cell transistor, respectively.

9. The device of claim 1, further comprising:

a plurality of contacts each connected to the second portion of each of the plurality of conductive layers.

* * * * *